US011545631B2

(12) United States Patent
Miyazaki et al.

(10) Patent No.: US 11,545,631 B2
(45) Date of Patent: Jan. 3, 2023

(54) ORGANIC ELECTROLUMINESCENCE DEVICE AND POLYCYCLIC COMPOUND FOR ORGANIC ELECTROLUMINESCENCE DEVICE

(71) Applicants: Samsung Display Co., Ltd., Yongin-si (KR); KYUSHU UNIVERSITY, NATIONAL UNIVERSITY CORPORATION, Fukuoka (JP)

(72) Inventors: Yuuki Miyazaki, Yokohama (JP); Yoshimasa Fujita, Yokohama (JP); Kyohei Matsuo, Fukuoka (JP); Takuma Yasuda, Fukuoka (JP)

(73) Assignees: Samsung Display Co., Ltd., Yongin-si (KR); Kyushu University, National University Corporation, Fukuoka (JP)

( * ) Notice: Subject to any disclaimer, the term of this patent is extended or adjusted under 35 U.S.C. 154(b) by 494 days.

(21) Appl. No.: 16/597,714

(22) Filed: Oct. 9, 2019

(65) Prior Publication Data

US 2020/0203627 A1 Jun. 25, 2020

(30) Foreign Application Priority Data

Dec. 21, 2018 (KR) .................. 10-2018-0167210

(51) Int. Cl.
*H01L 51/00* (2006.01)
*C07F 5/02* (2006.01)
*C09K 11/06* (2006.01)
*H01L 51/50* (2006.01)

(52) U.S. Cl.
CPC ........... *H01L 51/0072* (2013.01); *C07F 5/02* (2013.01); *C09K 11/06* (2013.01); *C09K 2211/1018* (2013.01); *H01L 51/5004* (2013.01); *H01L 51/5016* (2013.01); *H01L 2251/552* (2013.01)

(58) Field of Classification Search
CPC ........... H01L 2251/552; H01L 51/5048; H01L 51/5024; H01L 51/5016; H01L 51/5012; H01L 51/5004; H01L 51/0094; H01L 51/008; H01L 51/0072; H01L 51/0071; H01L 51/0061; H01L 51/0059; H01L 51/0052; C09K 2211/1096; C09K 2211/104; C09K 2211/1037; C09K 2211/1029; C09K 2211/1018; C09K 2211/1014; C09K 2211/1011; C09K 2211/1007; C09K 11/06; C07F 7/0816; C07F 5/025; C07F 5/02

USPC ........................................................ 428/690
See application file for complete search history.

(56) References Cited

U.S. PATENT DOCUMENTS

| | | | | |
|---|---|---|---|---|
| 10,804,470 B2* | 10/2020 | Pan | ....................... | C07C 15/24 |
| 10,968,243 B2* | 4/2021 | Shi | ....................... | H01L 51/0087 |
| 11,292,875 B2* | 4/2022 | Pan | ....................... | H01L 51/0068 |
| 11,329,244 B2* | 5/2022 | Li | ....................... | H01L 51/5012 |
| 2007/0265226 A1* | 11/2007 | Lee | ....................... | A61P 31/00 |
| | | | | 546/13 |
| 2016/0024122 A1* | 1/2016 | Raines | .................. | C12N 11/00 |
| | | | | 435/375 |
| 2016/0083706 A1* | 3/2016 | Raines | .................. | C12N 9/22 |
| | | | | 562/7 |
| 2018/0205019 A1 | 7/2018 | Fuchiwaki et al. | | |
| 2019/0131534 A1* | 5/2019 | Miyazaki | .......... | C07D 491/147 |

FOREIGN PATENT DOCUMENTS

| | | |
|---|---|---|
| KR | 10-2009-0007075 A | 1/2009 |
| KR | 10-2009-0008736 A | 1/2009 |
| KR | 10-2018-0085860 A | 7/2018 |
| WO | WO 2016/143819 A1 | 9/2016 |

OTHER PUBLICATIONS

CAS reg. No. 2341856-69-5, Jun. 20, 2019. (Year: 2019).*
CAS reg. No. 2341856-70-8, Jun. 20, 2019. (Year: 2019).*
Kyohei Matsuo, "Boronate- and borinate-based pi-sysems for blue thermally activated delayed fluorescence materials", Chem. Commun., 2019, 55, 2501-2504, Feb. 11, 2019. (Year: 2019).*
Translation of KR10-2009-0008736, Jan. 22, 2009. (Year: 2009).*
Numano, Misa et al., "Synthesis of Boronate-Based Benzo[fg]tetracene and Benzo[hi]hexacene via Demethylative Direct Borylation", Chem. Eur. J., 2016, pp. 11574-11577, vol. 22, Wiley-VCH Verlag GmbH & Co, KGaA, Weinheim.
Budanow, Alexandra et al., "10,9-Oxaboraphenanthrenes as luminescent fluorophores", Tetrahedron, 2016, pp. 1477-1484, vol. 72, Elsevier Ltd.

* cited by examiner

*Primary Examiner* — Douglas J McGinty
(74) *Attorney, Agent, or Firm* — Lewis Roca Rothgerber Christie LLP

(57) ABSTRACT

An organic electroluminescence device in which a polycyclic compound including an electron donor and an electron acceptor is included in an emission layer is provided. The electron donor contains an acridine derivative or a dibenzoazasiline derivative, and the electron acceptor contains B as a ring-forming atom, O or S directly bonded to B, and a heterocyclic group in which three or five hexagonal rings are condensed. Accordingly, an organic electroluminescence device having high efficiency may be achieved.

20 Claims, 2 Drawing Sheets

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2018-0167210, filed on Dec. 21, 2018, the entire content of which is hereby incorporated by reference.

BACKGROUND

1. Field

The present disclosure herein relates to an organic electroluminescence device and a heterocyclic compound utilized therefor.

2. Description of the Related Art

The development of an organic electroluminescence display device as an image display device is being actively conducted. Unlike a liquid crystal display device, the organic electroluminescence display device is a so-called self-luminescent display device in which holes and electrons injected from a first electrode and a second electrode are recombined in an emission layer, and a light emission material, which is an organic compound included in the emission layer, emits light to realize a display (e.g., to show an image).

The organic electroluminescence device, for example, an organic device in the comparable art, includes: a first electrode; a hole transport layer disposed on the first electrode; an emission layer disposed on the hole transport layer; an electron transport layer disposed on the emission layer; and a second electrode disposed on the electron transport layer. Holes are injected from the first electrode, and the injected holes move through the hole transport layer and are injected into the emission layer. On the other hand, electrons are injected from the second electrode, and the injected electrons move through the electron transport layer and are injected into the emission layer. The holes and the electrons injected into the emission layer are recombined, thereby generating excitons in the emission layer. The organic electroluminescence device emits light generated when the excitons fall back (e.g., transition) to a ground state.

Recently, to realize an organic electroluminescence device having high efficiency, technology about phosphorescent luminescence (utilizing a triplet state energy) or a delayed fluorescent luminescence (utilizing triplet-triplet annihilation (TTA), which is a phenomenon of generating a singlet exciton by collision of triplet excitons) has been developed. For example, development of a thermally activated delayed fluorescence (TADF) material capable of generating a delayed fluorescence due to a small energy difference between singlet and triplet excitons and little overlap of the highest occupied molecular orbital (HOMO) and the lowest unoccupied molecular orbital (LUMO) is actively conducted.

SUMMARY

Aspects according to embodiments of the present disclosure are directed toward an organic electroluminescence device and a polycyclic compound utilized therefor.

According to an embodiment of the present disclosure, an organic electroluminescence device includes: a first electrode; a second electrode on the first electrode; and a plurality of organic layers between the first electrode and the second electrode, and including an emission layer.

The emission layer may include a polycyclic compound including an electron donor and an electron acceptor bonded to the electron donor. The electron donor may include (e.g., contain) an acridine derivative or a dibenzo-azasiline derivative, and the electron acceptor may include (e.g., contain) boron (B) as a ring-forming atom, oxygen (O) or sulfur (S) directly bonded to B, and a heterocyclic group in which three or five hexagonal rings are condensed.

The electron acceptor may include (e.g., contain) a dibenzo-thiaborinine derivative or a dibenzo-oxaborinine derivative.

The emission layer may include a host and a dopant, and the dopant may include the polycyclic compound in an embodiment. A difference ($\Delta E_{ST}$) between a lowest singlet energy level and a lowest triplet energy level of the polycyclic compound in an embodiment may be 0.2 eV or less.

In an embodiment, the emission layer may emit light in a wavelength range of 440-500 nm.

The electron donor may be represented by Formula 1, and the electron acceptor may be represented by Formula 2-1 or Formula 2-2:

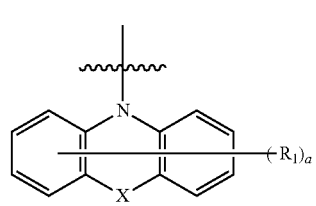

Formula 1

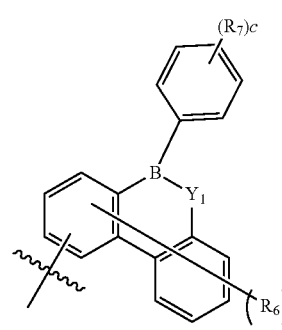

Formula 2-1

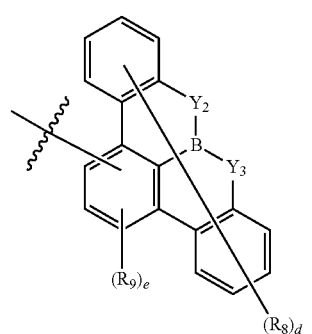

Formula 2-2

In Formula 1, $R_1$ may be a hydrogen atom, a deuterium atom, a halogen atom, a substituted or unsubstituted silyl group, a substituted or unsubstituted amine group, a substituted or unsubstituted alkoxy group having 1 to 10 carbon atoms, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms. a may be an integer of 0 to 8.

X may be $CR_2R_3$ or $SiR_4R_5$. $R_2$ to $R_5$ may each independently be a hydrogen atom, a deuterium atom, a halogen atom, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, or may be bonded to one or more adjacent groups to form a ring.

In one embodiment, $R_1$ may be a hydrogen atom, a fluorine atom, a methyl group, a t-butyl group, a substituted or unsubstituted arylamine group having 6 to 20 ring-forming carbon atoms, a substituted or unsubstituted phenyl group, a substituted or unsubstituted phenanthryl group, a substituted or unsubstituted thiophenyl group, a substituted or unsubstituted carbazolyl group, or a substituted or unsubstituted acridinyl group.

$R_2$ to $R_5$ may each independently be a methyl group or a substituted or unsubstituted phenyl group, or may be bonded to one or more adjacent groups to form a dibenzospiro ring.

In Formula 2-1 and Formula 2-2, $Y_1$ to $Y_3$ may each independently be O or S. In one embodiment, $Y_2$ and $Y_3$ may be the same. $R_6$ to $R_9$ may each independently be a hydrogen atom, a deuterium atom, a halogen atom, a substituted or unsubstituted alkoxy group having 1 to 10 carbon atoms, a substituted or unsubstituted sulfide group having 1 to 10 carbon atoms, a substituted or unsubstituted amine group, a substituted or unsubstituted silyl group, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms. b may be an integer of 0 to 7, c may be an integer of 0 to 5, d may be an integer of 0 to 8, and e may be an integer of 0 to 2.

In an embodiment, the polycyclic compound may be represented by Formula 3-1 or Formula 3-2:

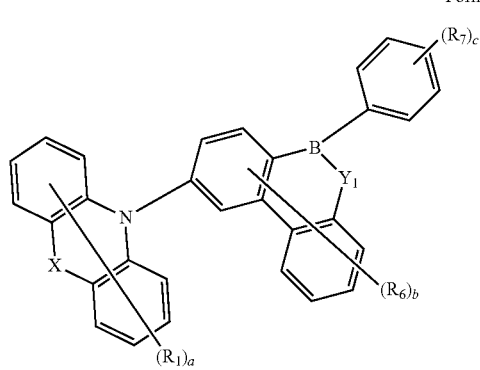

Formula 3-1

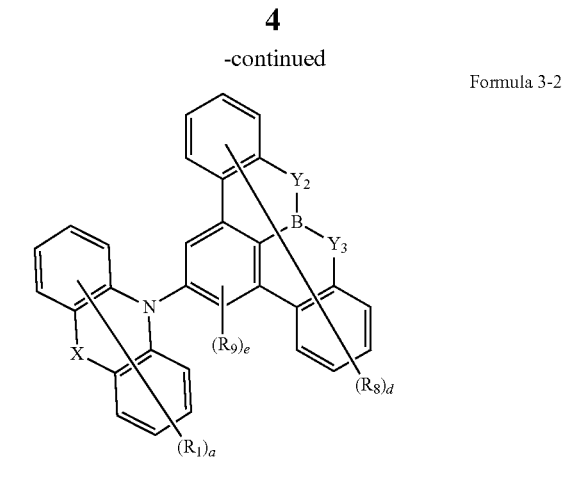

Formula 3-2

In Formula 3-1 and Formula 3-2, $R_1$, X, $Y_1$ to $Y_3$, $R_6$ to $R_9$, and a to e may be the same as respectively defined in connection with Formula 1, Formula 2-1, and Formula 2-2.

The electron donor represented by Formula 1 may be represented by Formula 4:

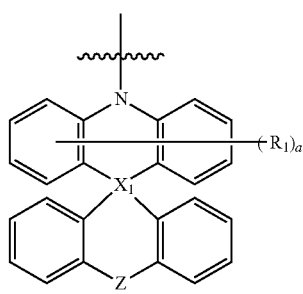

Formula 4

In Formula 4, $X_1$ may be C or Si. Z may be a direct bond, O, or S. $R_1$ and a may be the same as respectively defined in connection with Formula 1.

In an embodiment of the present disclosure, an organic electroluminescence device includes: a first electrode; a second electrode on the first electrode; and a plurality of organic layers between the first electrode and the second electrode, and may include an emission layer.

At least one organic layer of the plurality of organic layers may include a polycyclic compound represented by Formula A:

DU-AU            Formula A

In Formula A, DU may be represented by Formula 1 described above, and AU may be represented by Formula 2-1 or Formula 2-2 described above.

In an embodiment of the present disclosure, a polycyclic compound includes: an electron donor represented by Formula 1 described above; and an electron acceptor bonded to the electron donor and represented by Formula 2-1 or Formula 2-2 described above.

In an embodiment of the present disclosure, a polycyclic compound is represented by Formula A described above.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
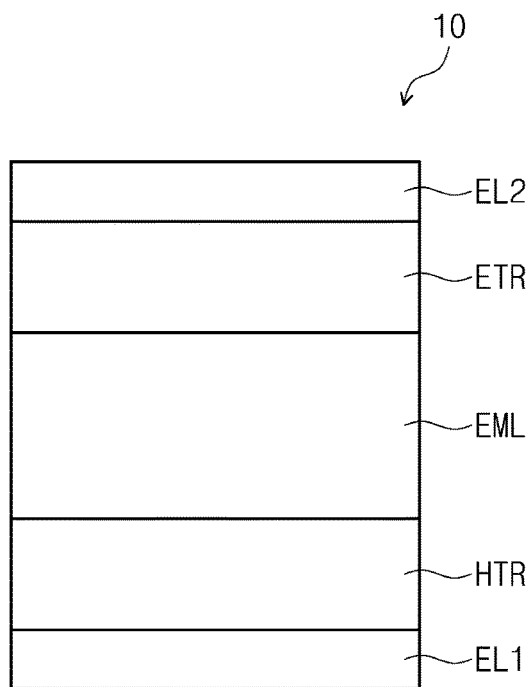
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms "first," "second," etc., may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In the description, it should be understood that the term "comprise" or "have" are intended to specify the presence of the stated features, numerals, steps, operations, elements, parts, or combinations thereof, but do not exclude the possibility of the presence or addition of one or more other features, numerals, steps, operations, elements, parts, or combinations thereof.

In the description, when a layer, a film, a region, a plate, etc., is referred to as being "on" or "above" another part, it can be "directly on" the other part, or intervening layers may also be present. Similarly, when a layer, a film, a region, a plate, etc., is referred to as being "under" or "below" another part, it can be "directly under" the other part, or intervening layers may also be present. Additionally, the term "disposed on" in the description may include the case where it is disposed on the lower part as well as on the upper part.

FIG. 1 is a cross-sectional view schematically illustrating an organic electroluminescence device according to an embodiment of the present disclosure. The organic electroluminescence device 10 according to the embodiment may include a first electrode EL1, a hole transport region HTR, an emission layer EML, an electron transport region ETR, and a second electrode EL2, which are sequentially laminated (e.g., stacked).

Figure 2:
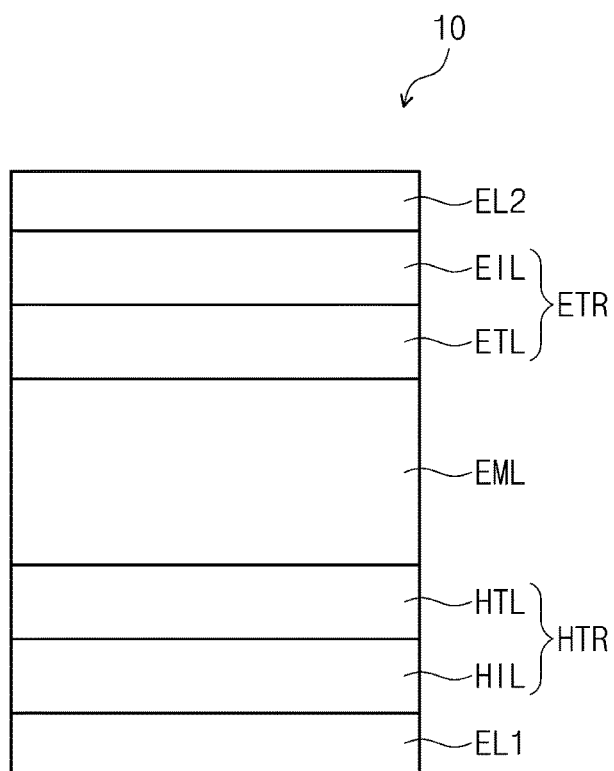
FIG. 2 is a cross-sectional view schematically illustrating an organic electroluminescence device according to an embodiment of the present disclosure.
Figure 3:
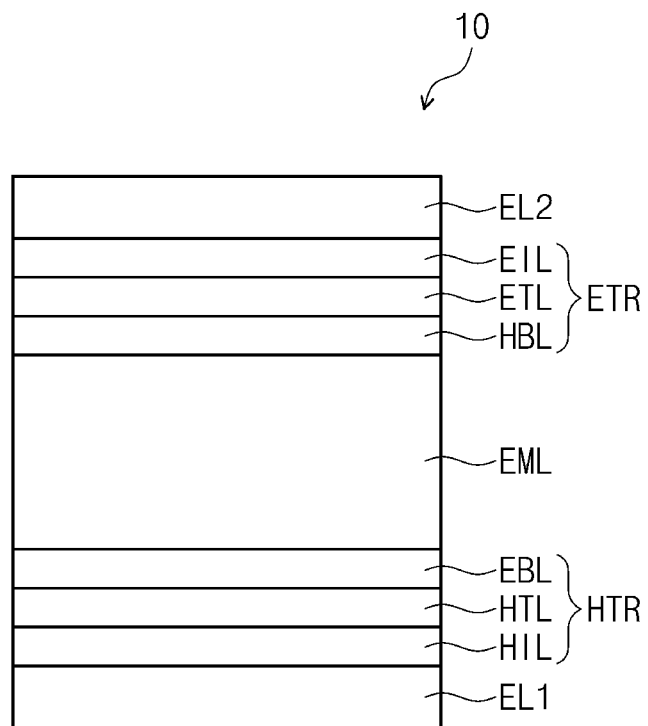
FIG. 3 is a cross-sectional view schematically illustrating an organic electroluminescence device according to an embodiment of the present disclosure.

Compared with FIG. 1, FIG. 2 illustrates a cross-sectional view of an organic electroluminescence device 10 according to an embodiment, in which a hole transport region HTR includes a hole injection layer HIL and a hole transport layer HTL, and an electron transport region ETR includes an electron injection layer EIL and an electron transport layer ETL. In addition, compared with FIG. 1, FIG. 3 illustrates a cross-sectional view of an organic electroluminescence device 10 according to an embodiment, in which a hole transport region HTR includes a hole injection layer HIL, a hole transport layer HTL and an electron blocking layer EBL, and an electron transport region ETR includes an electron injection layer EIL, an electron transport layer ETL and a hole blocking layer HBL.

The first electrode EL1 may have conductivity (e.g., electrical conductivity). The first electrode EL1 may be formed of a metal, a metal alloy and/or a conductive compound. The first electrode EL1 may be an anode. In addition, the first electrode EL1 may be a pixel electrode. The first electrode EL1 may be a transmissive electrode, a transflective electrode, or a reflective electrode. When the first electrode ELI is a transmissive electrode, the first electrode EL1 may include a transparent metal oxide, for example, indium tin oxide (ITO), indium zinc oxide (IZO), zinc oxide (ZnO), indium tin zinc oxide (ITZO), etc. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/AI, Mo, Ti, or a compound or a mixture thereof (for example, a mixture of Ag and Mg). In some embodiments, the first electrode EL1 may have a structure which has a plurality of layers including a reflective layer or a transflective layer formed of any of the above described materials; and a transparent conductive layer formed of ITO, IZO, ZnO, ITZO, etc. For example, the first electrode EL1 may have a three-layered structure of ITO/Ag/ITO, but embodiments of the present disclosure are not limited thereto. A thickness of the first electrode EL1 may be about 1000-10000 Å, for example, about 1000-3000 Å.

The hole transport region HTR may be disposed on the first electrode EL1. The hole transport region HTR may include a hole injection layer HIL, a hole transport layer HTL, a hole buffer layer, and/or an electron blocking layer EBL.

The hole transport region HTR may have a structure of: a single layer formed of a single material; a single layer formed of a plurality of different materials; or a multi-layer having a plurality of layers formed of a plurality of different materials.

For example, the hole transport region HTR may have a structure of a single layer which is a hole injection layer HIL or a hole transport layer HTL, or may have a structure of a single layer formed of a hole injection material and a hole transport material. In some embodiments, the hole transport region HTR may have a structure of a single layer formed of a plurality of different materials, or may have a structure of, sequentially laminated from the first electrode EL1, hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, but embodiments of the present disclosure are not limited thereto.

The hole transport region HTR may be formed by utilizing various suitable methods such as a vacuum deposition method, a spin coating method, a casting method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris[2-naphthyl(phenyl)amino]triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphorsulfonic acid (PANI/CSA), polyaniline/poly(4-styrenesulfonate) (PANI/PSS), N,N'-di(1-naphthyl)-N,N'-diphenylbenzidine (NPB), triphenylamine-containing polyetherketone (TPA-PEK), 4-isopropyl-4'-methyldiphenyliodoniumtetrakis(pentafluorophenyl)borate, dipyrazino[2,3-f:2',3'-h]quinoxaline-2,3,6,7,10,11-hexacarbonitrile (HAT-CN), etc.

The hole transport layer HTL may further include, for example, a carbazole-based derivative (such as N-phenylcarbazole and/or polyvinylcarbazole), a fluorine-based derivative, a triphenylamine-based derivative (such as N,N'-bis(3-methylphenyl)-N,N'-diphenyl-(1,1-biphenyl)-4,4'-diamine (TPD) and/or 4,4',4"-tris(N-carbazolyl)triphenylamine (TCTA)), N,N'-di(1-naphthyl)-N,N'-diphenylbenzidine (NPB), 4,4'-cyclohexylidenebis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc.

A thickness of the hole transport region HTR may be about 100-10000 Å, for example, about 100-5000 Å. A thickness of the hole injection layer HIL may be, for example, about 30-1000 Å, and a thickness of the hole transport layer HTL may be about 10-1000 Å. For example, a thickness of the electron blocking layer EBL may be about 10-1000 Å. When the thicknesses of the hole transport region HTR, the hole injection layer HIL, the hole transport layer HTL and the electron blocking layer EBL satisfy the above described ranges, suitable or satisfactory hole transport performance may be achieved without substantial rise of a driving voltage.

The hole transport region HTR may further include a charge generating material in addition to the above described materials to improve conductivity. The charge generating material may be uniformly or non-uniformly dispersed in the hole transport region HTR. The charge generating material may be, for example, a p-dopant. The p-dopant may be a quinone derivative, a metal oxide, and/or a cyano group-containing compound, but embodiments of the present disclosure are not limited thereto. Non-limited examples of the p-dopant may be, for example, a quinone derivative (such as tetracyanoquinodimethane (TCNQ) and/or 2,3,5,6-tetrafluoro-tetracyanoquinodimethane (F4-TCNQ)), a metal oxide (such as a tungsten oxide and/or a molybdenum oxide), etc., but embodiments of the present disclosure are not limited thereto.

As described, the hole transport region HTR may further include the hole buffer layer and/or the electron blocking layer EBL in addition to the hole injection layer HIL and the hole transport layer HTL. The hole buffer layer may improve the light emission efficiency by compensating a resonance distance according to the wavelength of the light emitted from the emission layer EML. The materials included in the hole transport region HTR may also be utilized as materials included in the hole buffer layer. The electron blocking layer EBL may be a layer which prevents or reduces electron injection from the electron transport region ETR to the hole transport region HTR.

The emission layer EML may be disposed on the hole transport region HTR. The emission layer EML may have a thickness of, for example, about 100-1000 Å or about 100-300 Å. The emission layer EML may have a structure of: a single layer formed of a single material; a single layer formed of a plurality of different materials; or a multi-layer having a plurality of layers formed of a plurality of different materials.

The emission layer may include a polycyclic compound including an electron donor and an electron acceptor which is bonded to the electron donor. The electron donor may contain an acridine derivative or a dibenzo-azasiline derivative. The electron acceptor may contain B as a ring-forming atom, and O or S directly bonded to B, and may have a heterocyclic group in which three or five hexagonal rings are condensed.

A nitrogen atom of the acridine derivative or a dibenzo-azasiline derivative may be bonded to the electron acceptor.

When the electron acceptor is a heterocyclic group in which three hexagonal rings are condensed, the electron acceptor may have one aliphatic hetero-hexagonal ring group containing B, and O or S directly bonded to B, and two substituted or unsubstituted benzene ring groups condensed to the aliphatic hetero-hexagonal ring group.

When the electron acceptor is a heterocyclic group in which five hexagonal rings are condensed, the electron acceptor may have a naphthyl skeleton (e.g., a naphthalene-like skeleton, e.g., a skeleton with two fused hexagonal rings) containing B, and two O or S bonds directly bonded to B, and three substituted or unsubstituted benzene ring groups condensed to the naphthyl skeleton.

The electron acceptor may contain, for example, a dibenzo-thiaborinine derivative or a dibenzo-oxaborinine derivative.

In the description, the term "substituted or unsubstituted" refers to an unsubstituted functional group or a functional group substituted with at least one substituent selected from the group consisting of a deuterium atom, a halogen atom, a cyano group, a silyl group, an oxy group, a thio group, an alkyl group, an alkoxy group, a hydrocarbon ring group, an aryl group, and a heterocyclic group. In addition, each of the substituents exemplified above may be substituted or unsubstituted. For example, a biphenyl group may be interpreted as an aryl group or a phenyl group substituted with a phenyl group.

In the description, the expression "forming a ring via the combination with an adjacent group" may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with each other (e.g., with an adjacent group) may be combined with another ring to form a spiro structure.

In the description, the term "adjacent group" may refer to a substituent substituted for an atom which is directly combined with (e.g., directly linked to) an atom substituted with a corresponding substituent, another substituent substituted for an atom which is substituted with a corresponding substituent, or a substituent sterically positioned at the nearest position to a corresponding substituent. For example, in 1,2-dimethylbenzene, the two methyl groups may be interpreted as "adjacent groups" to each other, and in 1,1-diethylcyclopentene, the two ethyl groups may be interpreted as "adjacent groups" to each other.

In the description, the halogen atom may be, for example, a fluorine atom, a chlorine atom, a bromine atom and/or an iodine atom.

In the description, the alkyl group may be a linear, branched or cyclic alkyl group. The carbon number (e.g., number of carbon atoms) of the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

In the description, the methyl group may be represented by Me. In the description, MeO may represent, for example, a methoxy group.

In the description, the hydrocarbon ring group refers to an optional functional group or substituent derived from an aliphatic hydrocarbon ring. The hydrocarbon ring group may be a saturated hydrocarbon ring group having 5-20 ring-forming carbon atoms.

In the description, the aryl group refers to an optional functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc., but embodiments of the present disclosure are not limited thereto.

In the description, the fluorenyl group may be substituted, and two substituents may be combined with each other to form a spiro structure. Examples of a substituted fluorenyl group are as follows. However, embodiments of the present disclosure are not limited thereto.

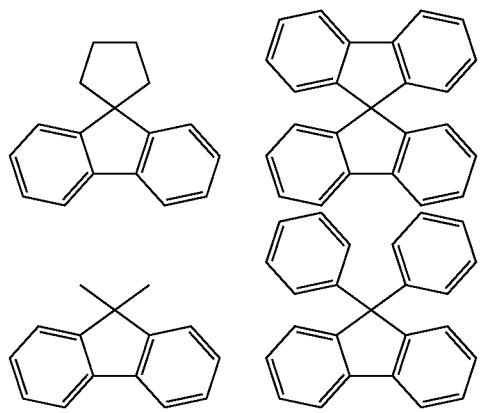

In the description, the heteroaryl group may be a heteroaryl group including O, N, P, Si, and/or S as a heteroatom. When the heteroaryl group includes at least two hetero atoms, the at least two hetero atoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a thiazole group, an oxazole group, an oxadiazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isooxazole, an oxadiazole group, a thiadiazole group, a phenothiazine group, a dibenzosilole group, a dibenzofuran group, etc., but embodiments of the present disclosure are not limited thereto.

In the description, the silyl group may include an alkylsilyl group and an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but embodiments of the present disclosure are not limited thereto.

In the description, the thio group may include an alkylthio group and an arylthio group.

In the description, the oxy group may include an alkoxy group and an aryloxy group. The alkoxy group may be a linear, branched or cyclic chain. The carbon number of the alkoxy group is not particularly limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but embodiments of the present disclosure are not limited thereto.

In the description, the carbon number of the amine group is not particularly limited, but may be 1 to 30. The amine group may include an alkylamine group and an arylamine group. Examples of the amine group may include a methylamine group, a dimethylamine group, a phenylamine group, a diphenylamine group, a naphthylamine group, a 9-methyl-anthracenylamine group, a triphenylamine group, etc., but embodiments of the present disclosure are not limited thereto.

In the description, the alkyl groups in the alkylaryl group, the alkylheteroaryl group, the silyl group, and the alkylamine group are the same as the alkyl group described above.

In the description, the aryl groups in the aryloxy group, the arylsilyl group, and the arylamine group are the same as the aryl group described above.

In the description, the term "direct linkaae" may refer to a sinale bond.

Meanwhile, in the description, "

" represents a connecting position.

A polycyclic compound of an embodiment may be represented by Formula A:

DU-AU          Formula A

In Formula A, DU may be an electron donor represented by Formula 1, and

AU may be an electron acceptor represented by Formula 2-1 or Formula 2-2.

Formula 1

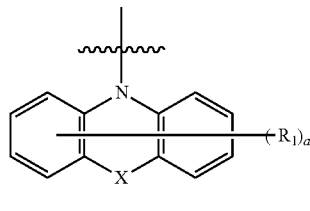

Formula 2-1]

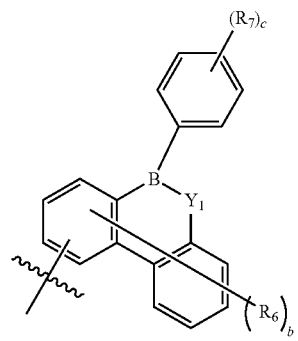

Formula 2-2

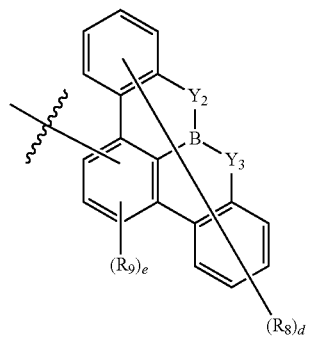

In Formula 1, $R_1$ may be a hydrogen atom, a deuterium atom, a halogen atom, a silyl group, an amine group, an alkoxy group, an alkyl group, an aryl group, or a heteroaryl group. The silyl group may be a substituted or unsubstituted silyl group, the amine group may be a substituted or unsubstituted amine group, the alkoxy group may be a substituted or unsubstituted alkoxy group having 1 to 10 carbon atoms, and the alkyl group may be a substituted or unsubstituted alkyl group having 1 to 20 carbon atoms. The aryl group may be a substituted or unsubstituted aryl group having 6 to 20 ring-forming carbon atoms, and the heteroaryl group may be a substituted or unsubstituted heteroaryl group having 3 to 20 ring-forming carbon atoms.

For example, $R_1$ may be a hydrogen atom, a fluorine atom, a methyl group, a t-butyl group, a substituted or unsubstituted arylamine group having 6 to 20 ring-forming carbon atoms, a substituted or unsubstituted phenyl group, a substituted or unsubstituted phenanthryl group, a substituted or unsubstituted thiophenyl group, a substituted or unsubstituted carbazolyl group, or a substituted or unsubstituted acridinyl group.

a may be an integer of 0 to 8. a may be, for example, 1 or 2. When a is 1, $R_1$ may not be a hydrogen atom. For example, when a is 1, $R_1$ may be a heteroaryl group. When a is 2 or larger, a plurality of $R_1$s may be the same as or different from each other.

X may be $CR_2R_3$ or $SiR_4R_5$.

$R_2$ to $R_5$ may each independently be a hydrogen atom, a deuterium atom, a halogen atom, an alkyl group, an aryl group, or a heteroaryl group, or may be bonded to adjacent groups to form a ring. The alkyl group is a substituted or unsubstituted alkyl group having 1 to 20 carbon atoms, the aryl group is a substituted or unsubstituted aryl group having 6 to 20 ring-forming carbon atoms, and the heteroaryl group is a substituted or unsubstituted heteroaryl group having 3 to 20 ring-forming carbon atoms. For example, $R_2$ to $R_5$ may each independently be a methyl group or a substituted or unsubstituted phenyl group, or may be connected to each other to form a dibenzospiro ring. When $R_2$ to $R_5$ are bonded to one or more adjacent groups to form a ring, the dibenzospiro ring may be formed. The dibenzospiro ring may be a substituted or unsubstituted aryl group, or a substituted or unsubstituted heteroaryl group.

$R_2$ to $R_5$ may be the same as or different from each other. For example, $R_2$ to $R_5$ may be the same as each other. In some embodiments, $R_2$ to $R_5$ may be bonded to adjacent groups to form a spiro ring having a symmetrical structure.

In Formula 2-1 and Formula 2-2, $Y_1$ to $Y_3$ may each independently be O or S. Y2 and Y3 may be the same as or different from each other. For example, Y2 and Y3 may be the same atom.

$R_6$ to $R_9$ may each independently be a hydrogen atom, a deuterium atom, a halogen atom, an alkoxy group, a sulfide group, an amine group, a silyl group, an alkyl group, an aryl group, or a heteroaryl group. The alkoxy group may be a substituted or unsubstituted alkoxy group having 1 to 10 carbon atoms, the sulfide group may be a substituted or unsubstituted sulfide group having 1 to 10 carbon atoms, the amine group may be a substituted or unsubstituted amine group, and the silyl group may be a substituted or unsubstituted silyl group. The alkyl group may be a substituted or unsubstituted alkyl group having 1 to 20 carbon atoms, the aryl group may be a substituted or unsubstituted aryl group having 6 to 20 ring-forming carbon atoms, and the heteroaryl group may be a substituted or unsubstituted heteroaryl group having 3 to 20 ring-forming carbon atoms. The substituted aryl group may be an aryl group substituted with an aryloxy group having 1 to 20 carbon atoms or substituted with an arylsulfide group having 1 to 20 carbon atoms.

For example, $R_6$ to $R_9$ may each independently be a methyl group, an isopropyl group, an n-hexyl group, a fluorine atom, a substituted or unsubstituted arylsilyl group having 6 to 20 carbon atoms, a substituted or unsubstituted alkoxy group having 1 to 10 carbon atoms, a substituted or unsubstituted phenyl group, a substituted or unsubstituted pyridine group, a substituted or unsubstituted pyrimidine group, or a substituted or unsubstituted acridinyl group.

b may be an integer of 0 to 7, c may be an integer of 0 to 5, d may be an integer of 0 to 8, and e may be an integer of 0 to 2. For example, b may be 0 or 1, and d may be 0, 1, or 2. When each of b to e is 1, each of $R_6$ to $R_9$ may not be a hydrogen atom.

A polycyclic compound of an embodiment may be represented by Formula 3-1 or Formula 3-2:

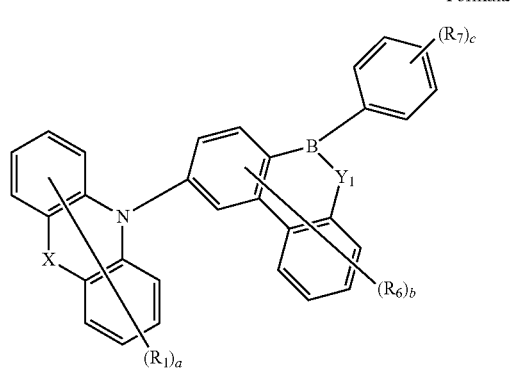

Formula 3-1

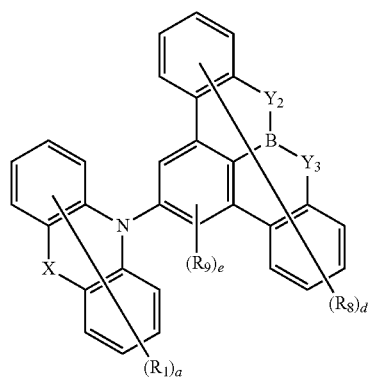

Formula 3-2

Formula 3-1 and Formula 3-2 are example (e.g., specified) Formulae embodying substitution positions of the electron donor and the electron acceptor in the polycyclic compound of an embodiment. In Formula 3-1 and Formula 3-2, $R_1$, X, $Y_1$ to $Y_3$, $R_6$ to $R_9$, and a to e may be the same as respectively defined in connection with Formula 1, Formula 2-1, and Formula 2-2.

The electron donor represented by Formula 1 may be represented by Formula 4:

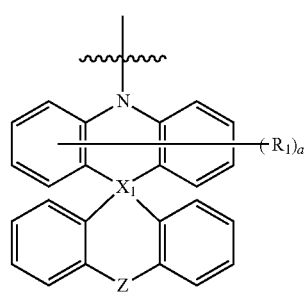

Formula 4

Formula 4 is an example (e.g., a specified) Formula embodying a structure in which $R_2$ to $R_5$ in Formula 1 adjacent to each other (e.g., $R_2$ and $R_3$, or $R_4$ and $R_5$) are bonded to form a spiro ring.

In Formula 4, $X_1$ may be C or Si, and Z may be a direct bond, O, or S. $R_1$ and a may be the same as respectively defined in connection with Formula 1.

The electron donor represented by Formula 1 may be represented by Formula 5:

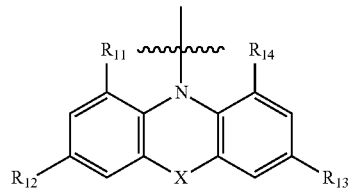

Formula 5

Formula 5 is an example (e.g., a specified) Formula embodying a substitution position of $R_1$ in Formula 1. For example, $R_1$ may be substituted to at least one position of an ortho position or a para position with respect to N.

$R_{11}$ to $R_{14}$ may be a hydrogen atom, a deuterium atom, a halogen atom, a silyl group, an amine group, an alkoxy group, an alkyl group, an aryl group, or a heteroaryl group. The silyl group may be a substituted or unsubstituted silyl group, the amine group may be a substituted or unsubstituted amine group, the alkoxy group may be a substituted or unsubstituted alkoxy group having 1 to 10 carbon atoms, and the alkyl group may be a substituted or unsubstituted alkyl group having 1 to 20 carbon atoms. The aryl group may be a substituted or unsubstituted aryl group having 6 to 20 ring-forming carbon atoms, and the heteroaryl group may be a substituted or unsubstituted heteroaryl group having 3 to 20 ring-forming carbon atoms.

For example, $R_{11}$ to $R_{14}$ may each independently be a hydrogen atom, a fluorine atom, a methyl group, a t-butyl group, a substituted or unsubstituted arylamine group having 6 to 20 ring-forming carbon atoms, a substituted or unsubstituted phenyl group, a substituted or unsubstituted phenanthryl group, a substituted or unsubstituted thiophenyl group, a substituted or unsubstituted carbazolyl group, or a substituted or unsubstituted acridinyl group. At least one of $R_{11}$ to $R_{14}$ may not be hydrogen. X may be the same as defined in connection with Formula 1.

The electron acceptor represented by Formula 2-2 may be represented by the following Formulae 5-1 or 5-2.

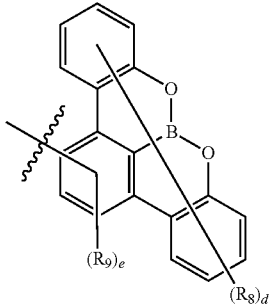

Formula 5-1

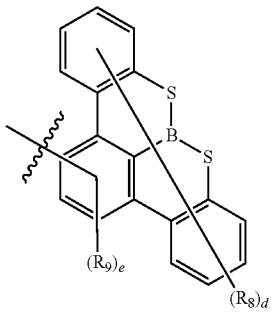

Formula 5-2

In Formula 5-1 and Formula 5-2, $R_9$, $R_8$, d, and e may be the same as respectively defined in connection with Formula 2-2.

The electron acceptor represented by Formula 2-1 may be represented by Formula 6-1, and the electron acceptor represented by Formula 2-2 may be represented by Formula 6-2:

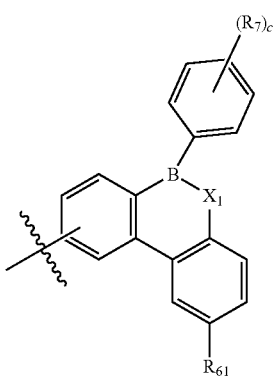

Formula 6-1

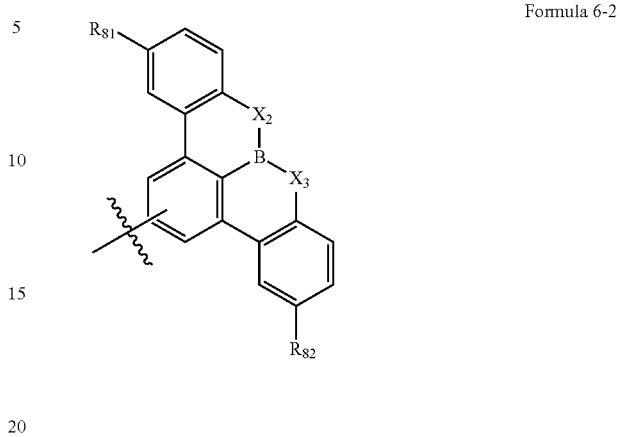

Formula 6-2

Formula 6-1 is an example (e.g., a specified) Formula embodying the number and substitution position of $R_6$ in Formula 2-1, and Formula 6-2 is an example (e.g., a specified) Formula embodying the number and substitution position of $R_8$ in Formula 2-2.

For example, Formula 6-1 is an example (e.g., a specified) Formula embodying that, in Formula 2-1, $R_6$ is substituted at the para position with respect to $X_1$, and Formula 6-2 is an example (e.g., a specified) Formula embodying that, in Formula 2-2, all $R_9$s are hydrogen atoms and $R_8$ is substituted at the para position with respect to $X_2$ or $X_3$.

$R_{61}$, $R_{81}$, and $R_{82}$ may each independently be a hydrogen atom, a deuterium atom, a halogen atom, an alkoxy group, a sulfide group, an amine group, a silyl group, an alkyl group, an aryl group, or a heteroaryl group. The alkoxy group may be a substituted or unsubstituted alkoxy group having 1 to 10 carbon atoms, the sulfide group may be a substituted or unsubstituted sulfide group having 1 to 10 carbon atoms, the amine group may be a substituted or unsubstituted amine group, and the silyl group may be a substituted or unsubstituted silyl group. The alkyl group may be a substituted or unsubstituted alkyl group having 1 to 20 carbon atoms, the aryl group may be a substituted or unsubstituted aryl group having 6 to 20 ring-forming carbon atoms, and the heteroaryl group may be a substituted or unsubstituted heteroaryl group having 3 to 20 ring-forming carbon atoms. The substituted aryl group may be an aryl group substituted with an aryloxy group having 1 to 20 carbon atoms or substituted with an arylsulfide group having 1 to 20 carbon atoms.

For example, $R_{61}$, $R_{81}$, and $R_{82}$ may each independently be a methyl group, an isopropyl group, an n-hexyl group, a fluorine atom, a substituted or unsubstituted arylsilyl group having 6 to 20 carbon atoms, a substituted or unsubstituted alkoxy group having 1 to 10 carbon atoms, a substituted or unsubstituted phenyl group, a substituted or unsubstituted pyridine group, a substituted or unsubstituted pyrimidine group, or a substituted or unsubstituted acridinyl group.

$X_1$ to $X_3$, $R_7$, and c may be the same as respectively defined in connection with Formula 2-1 and Formula 2-2.

A polycyclic compound of an embodiment may be any one of the compounds shown in Compound Group 1:
Compound Group 1
1
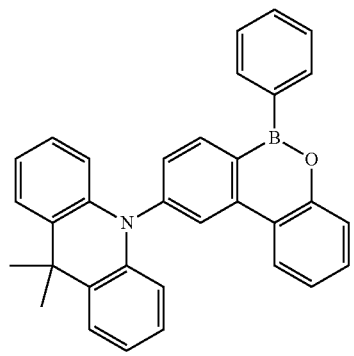
2
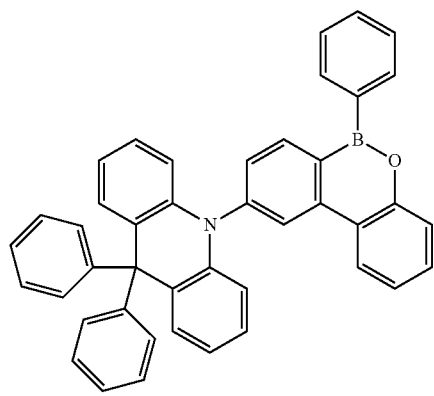
3
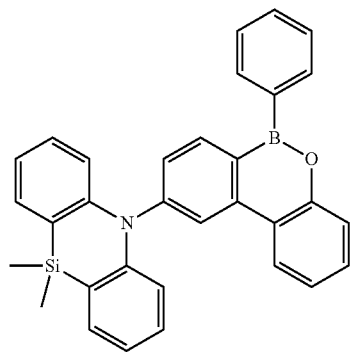
4
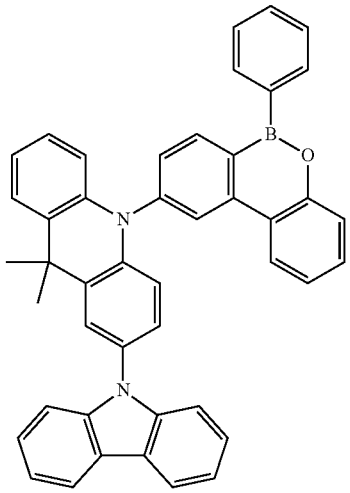
5
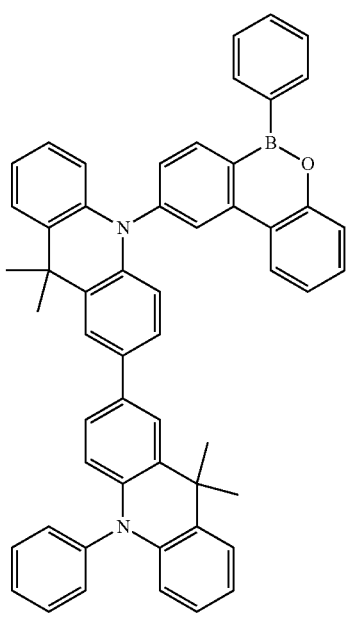
6
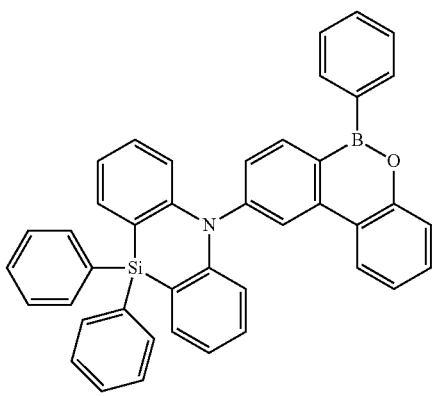

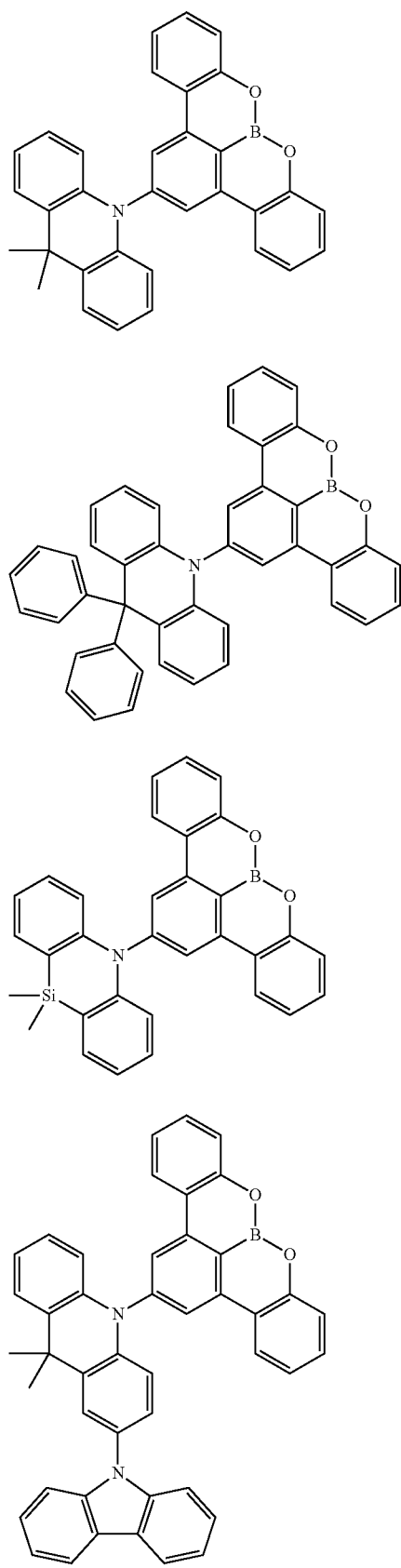
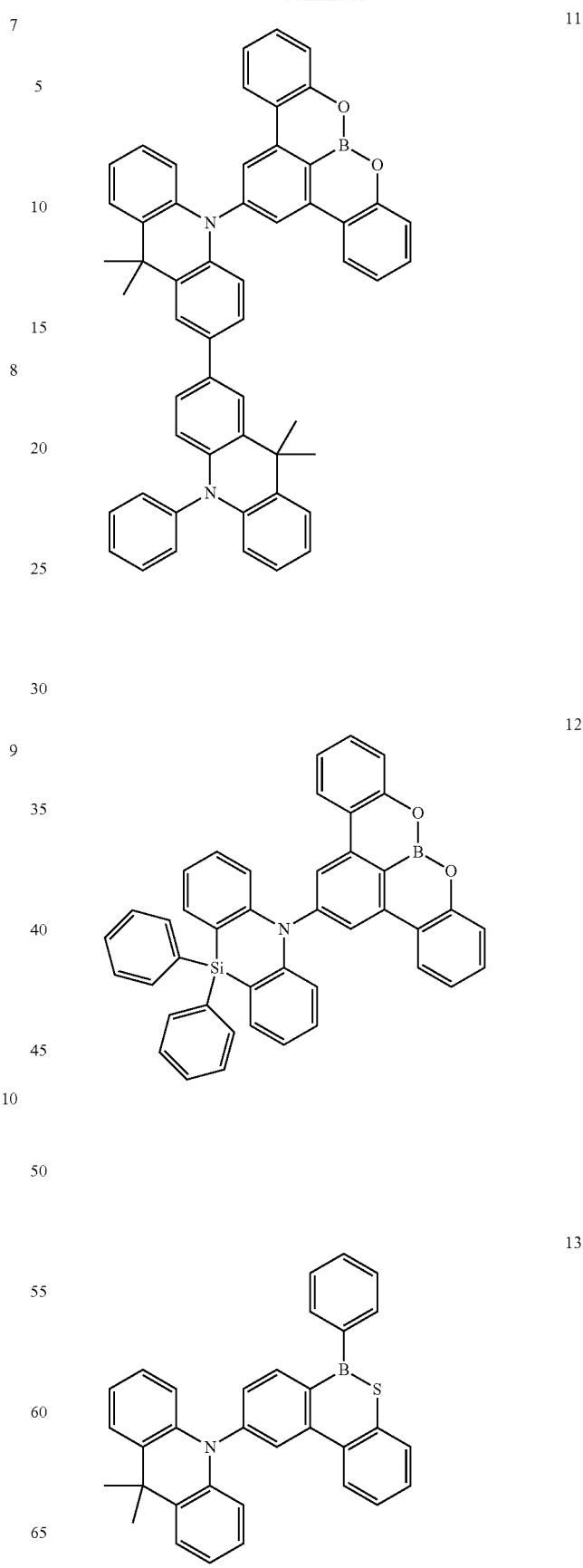

14
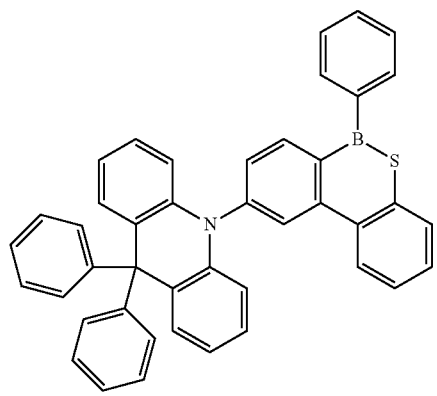
15
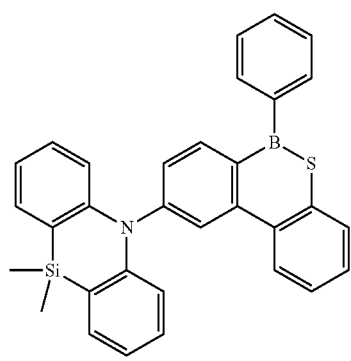
16
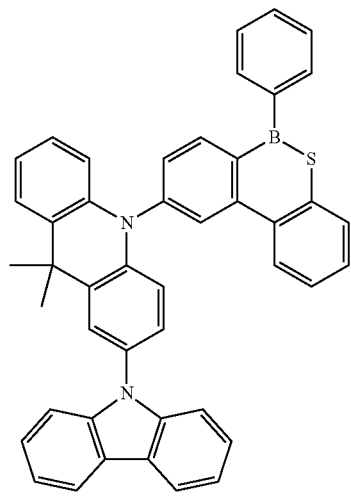
17
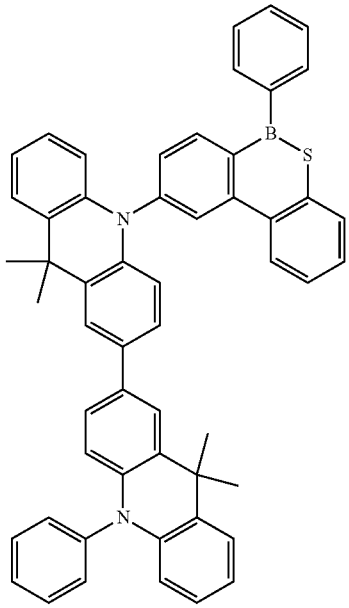
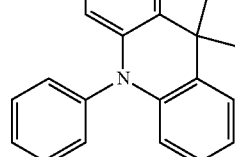
18
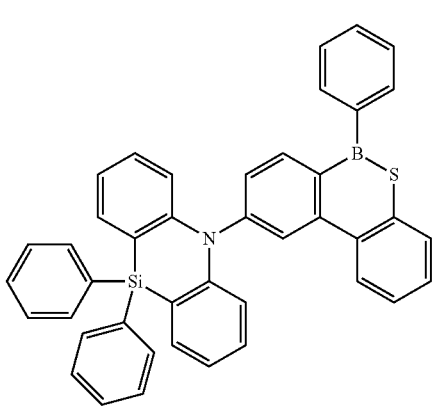
19
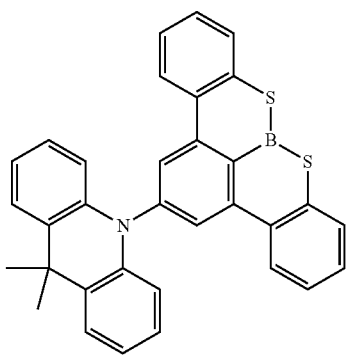

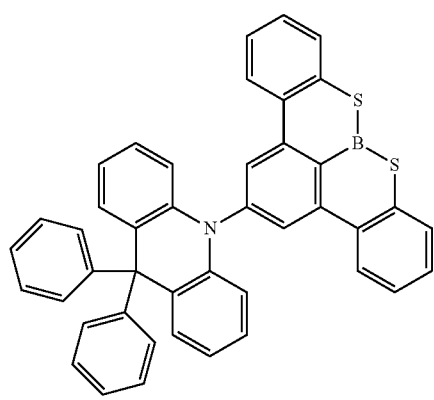
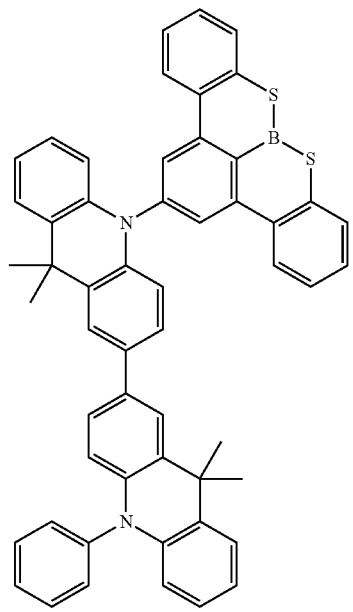
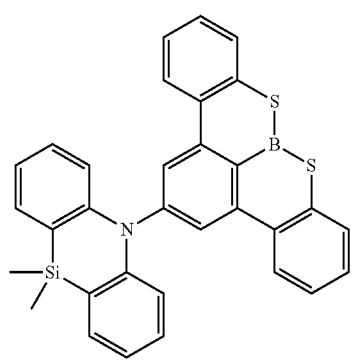
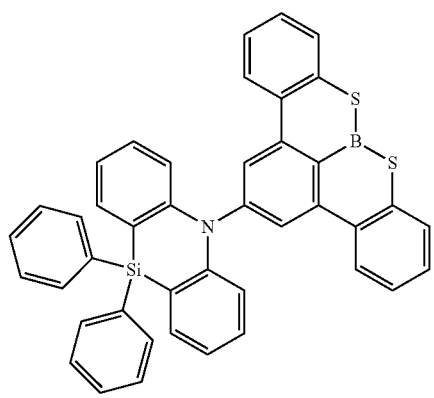
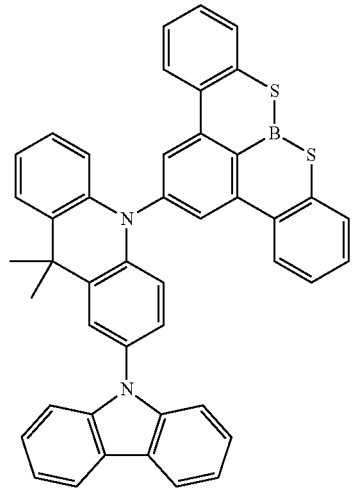
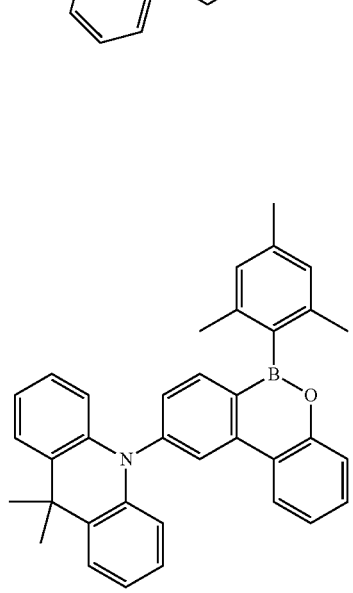

-continued
26
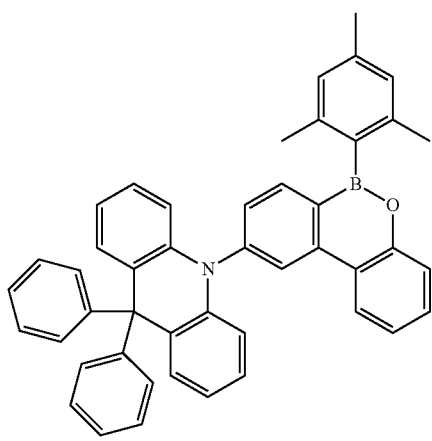
27
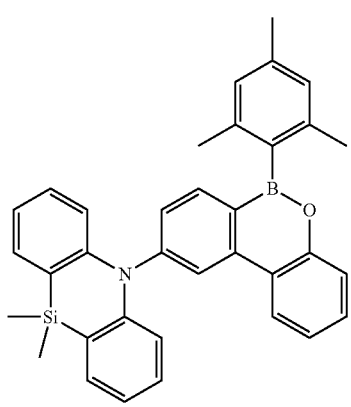
28
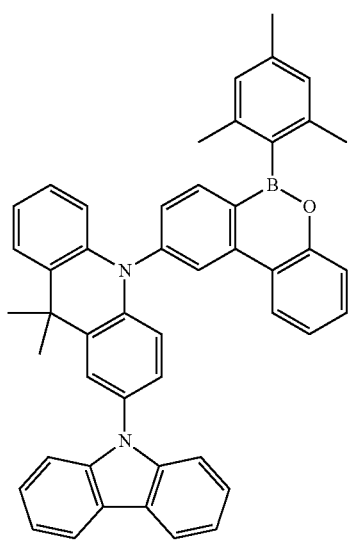
-continued
29
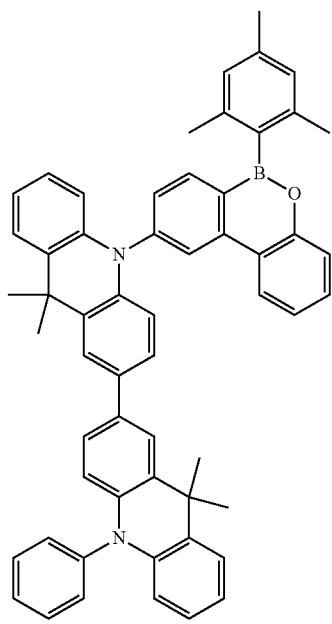
30
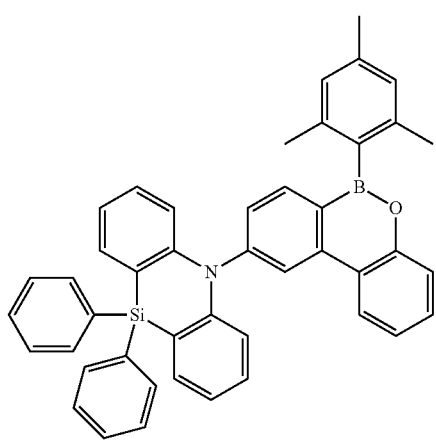
31
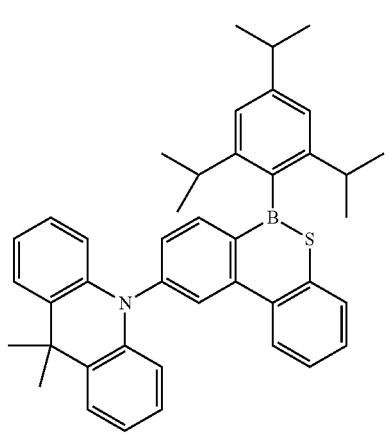

32
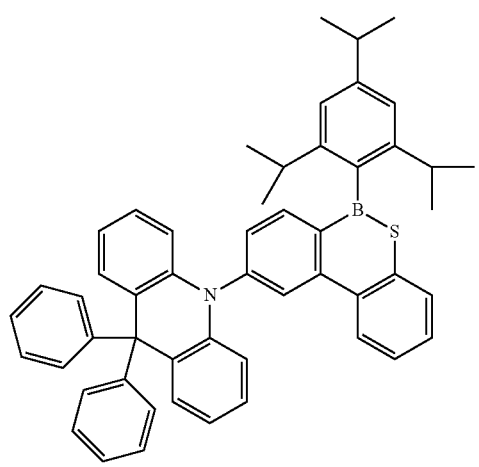
33
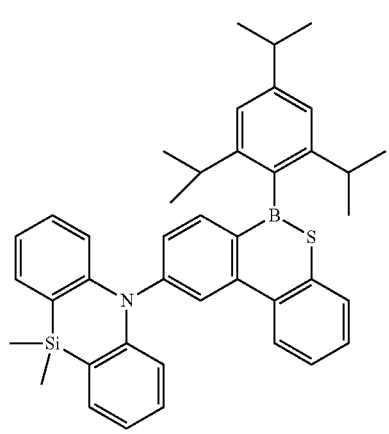
34
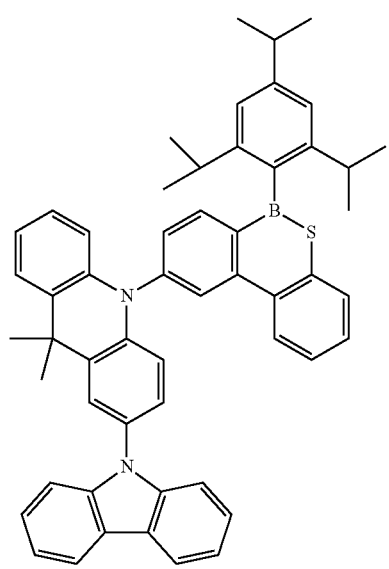
35
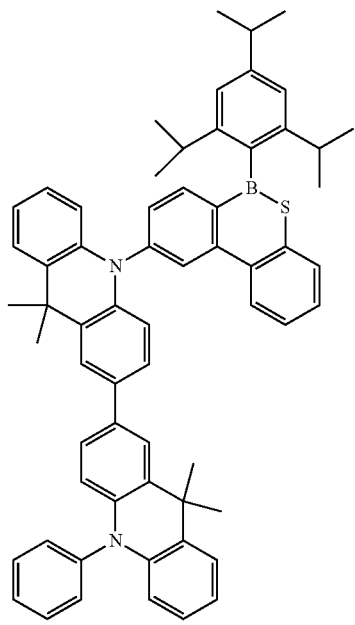
36
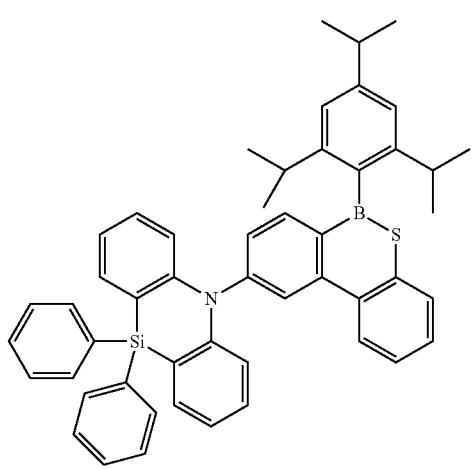
37
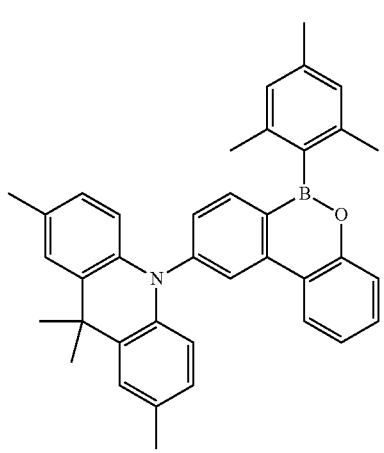

-continued
38
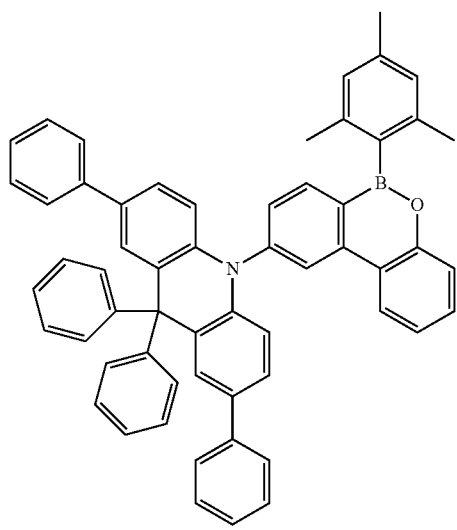
39
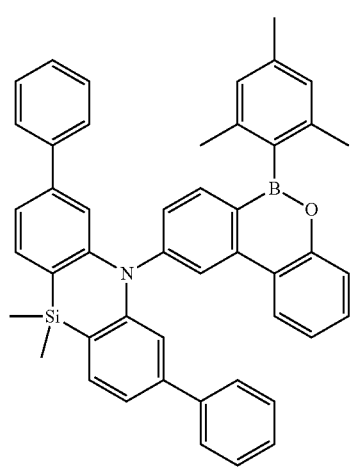
40
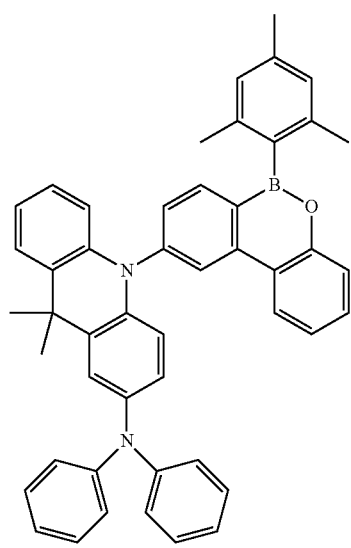
-continued
41
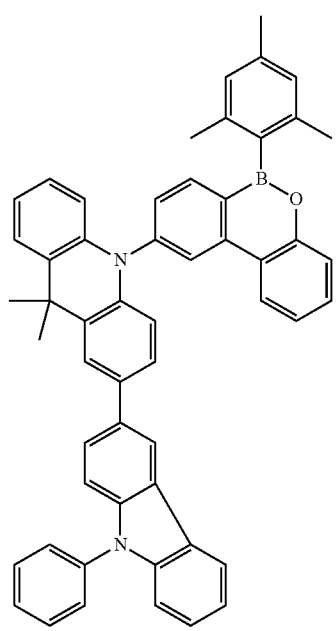
42
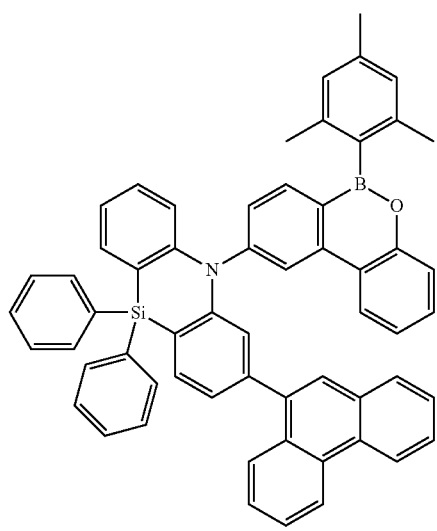
43
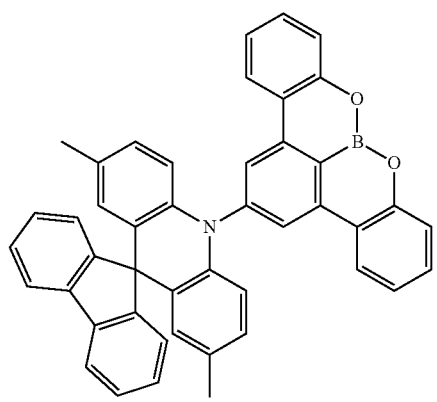

44
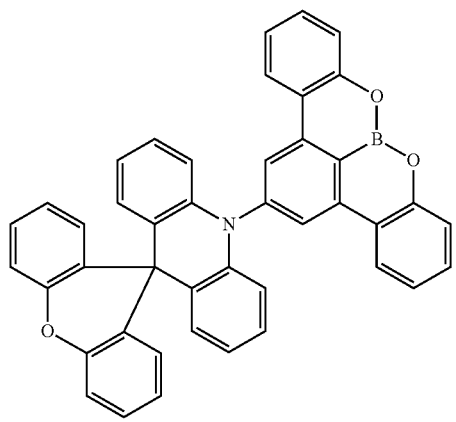
45
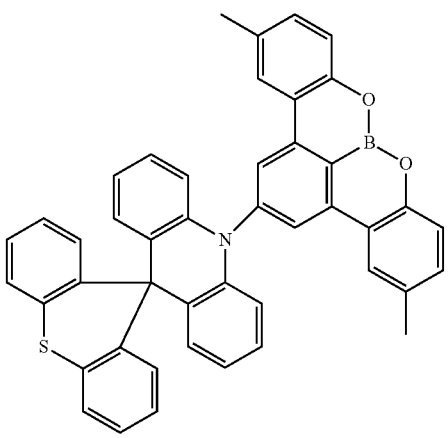
46
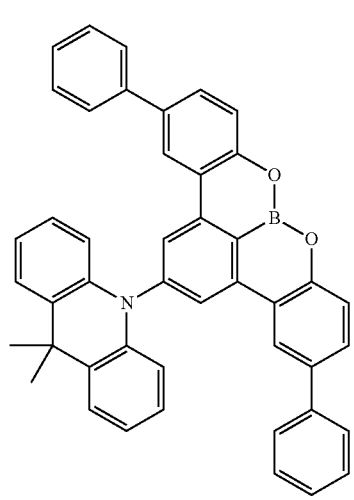
47
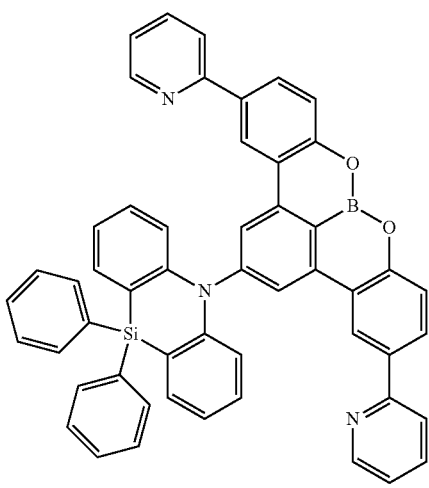
48
49
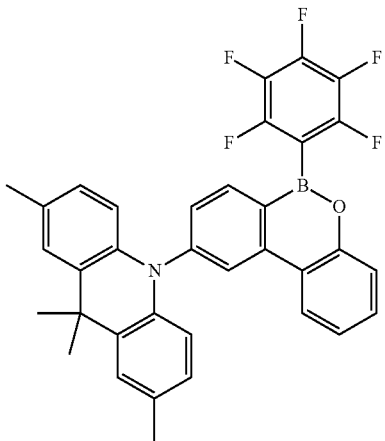

-continued
50
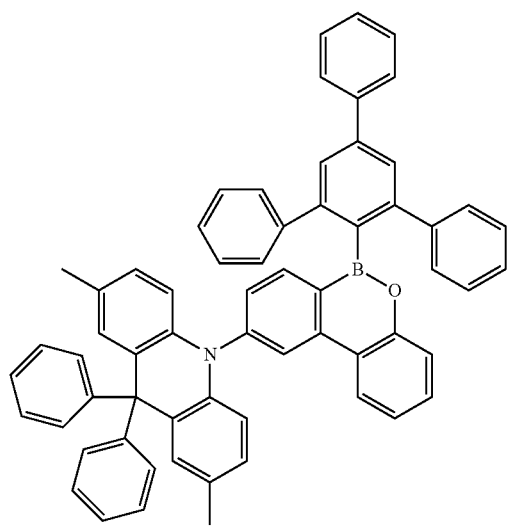
51
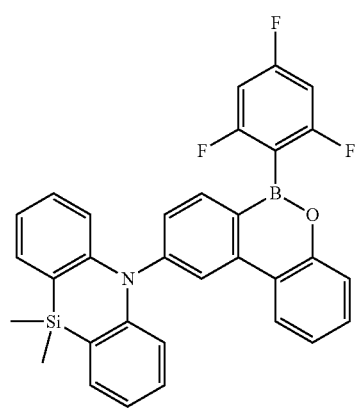
52
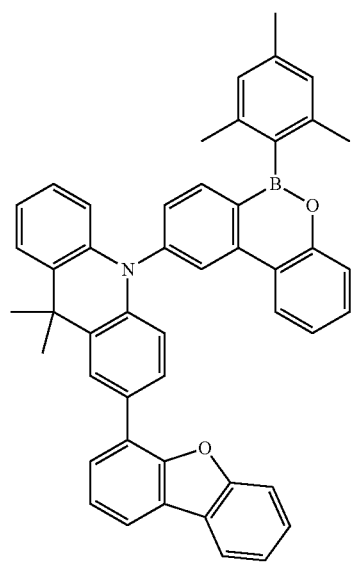
-continued
53
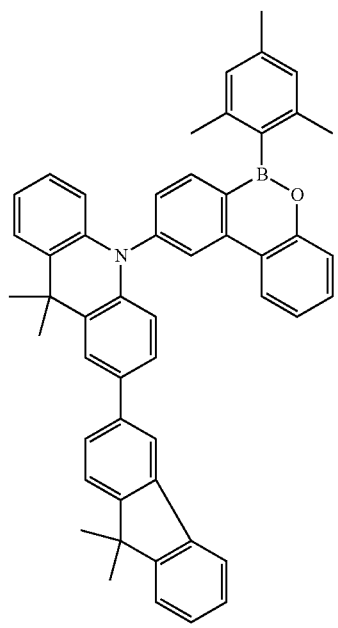
54
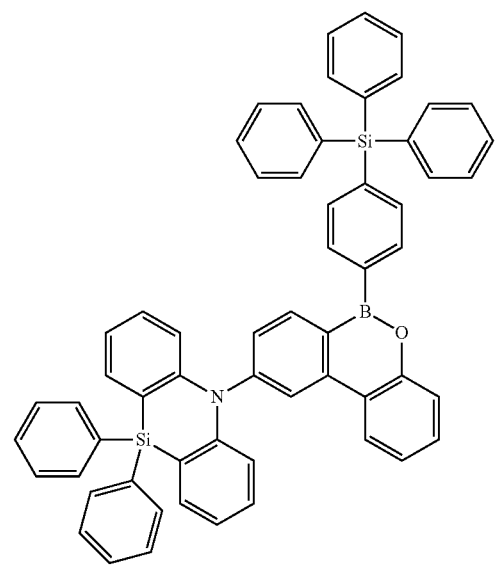
55
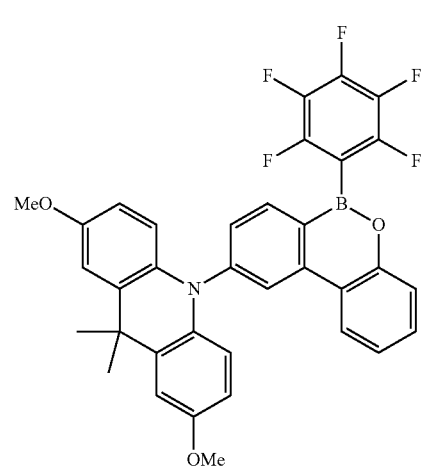

56
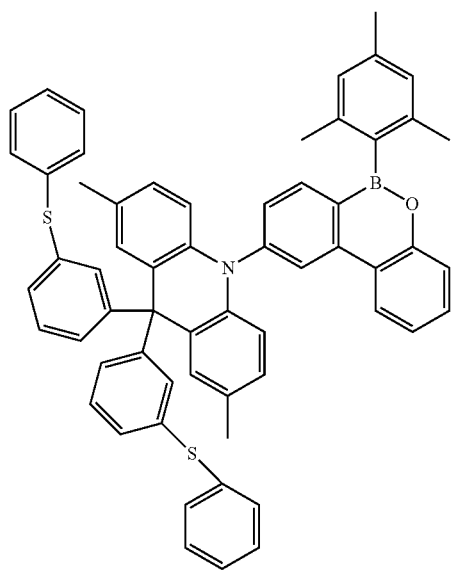
57
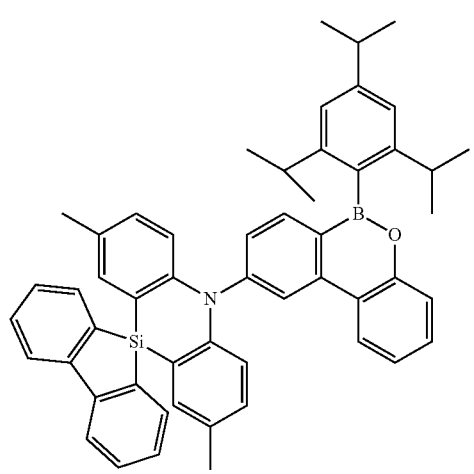
58
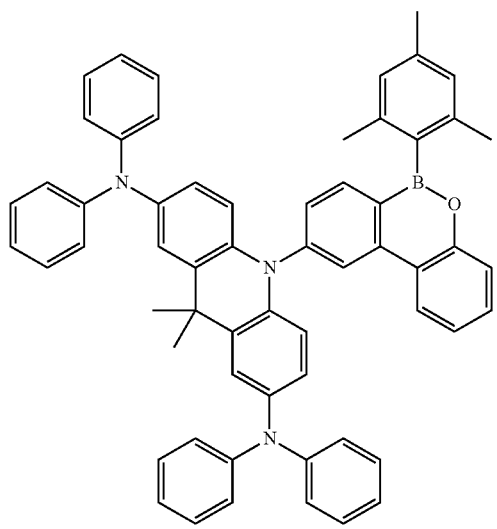
60
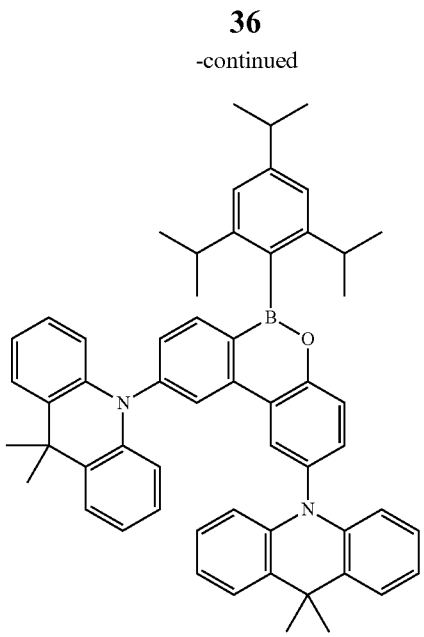
61
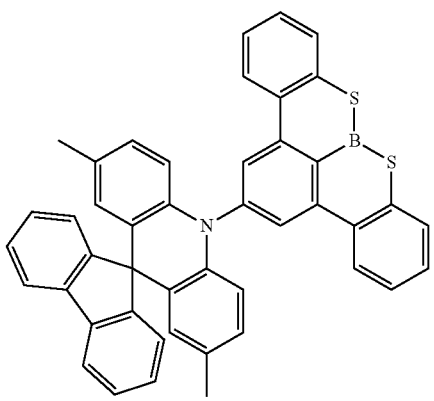
62
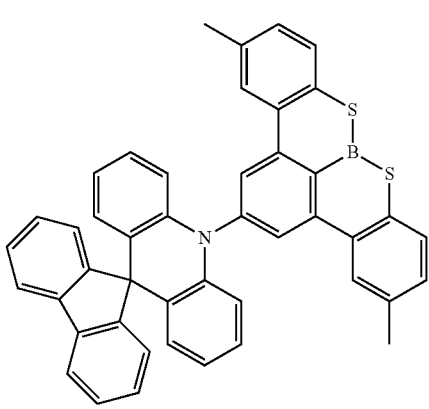

63
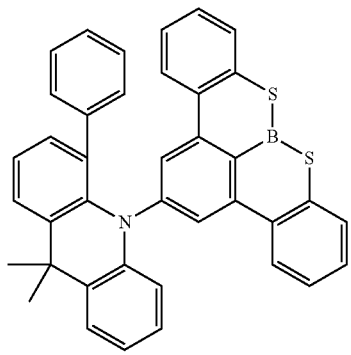
64
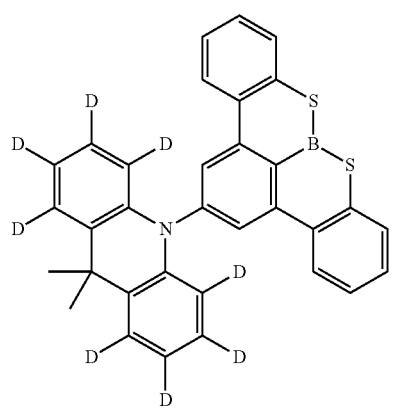
65
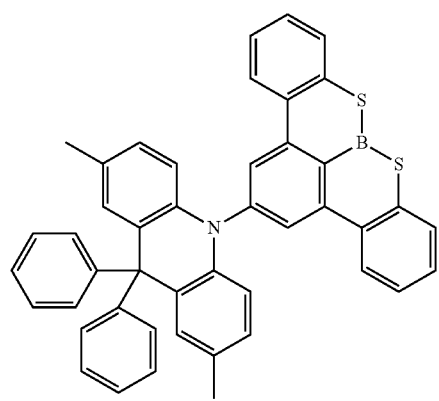
66
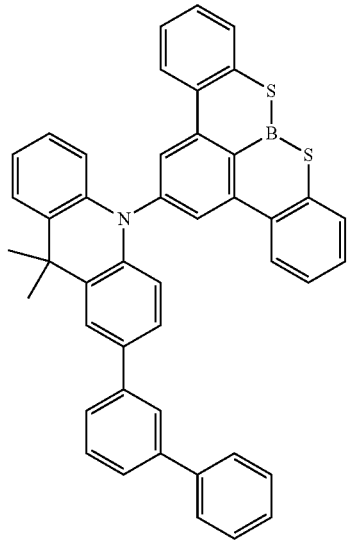
67
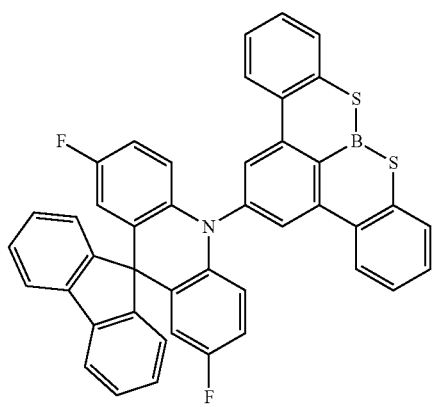
68
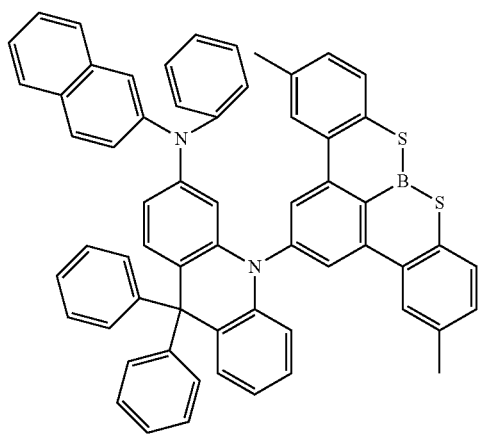

69
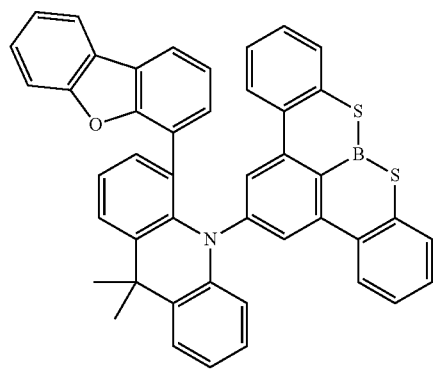
70
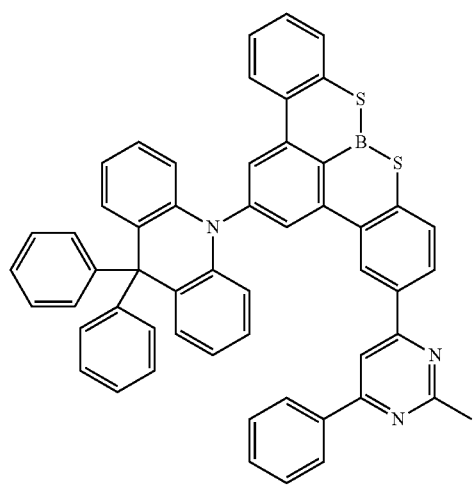
71
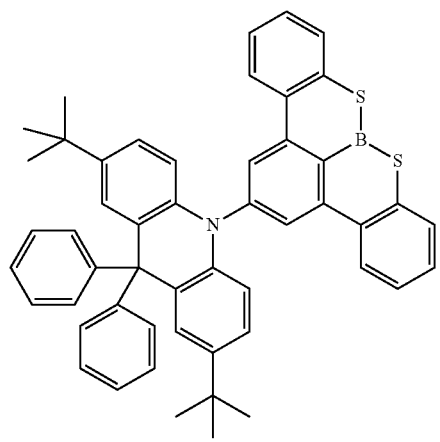
72
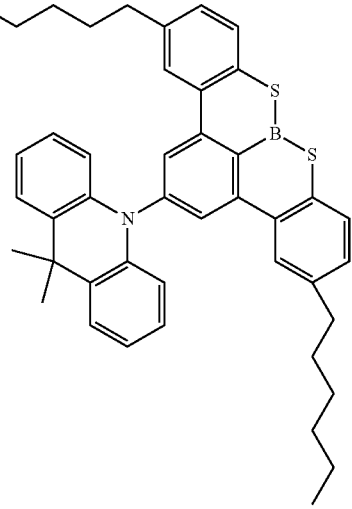
73
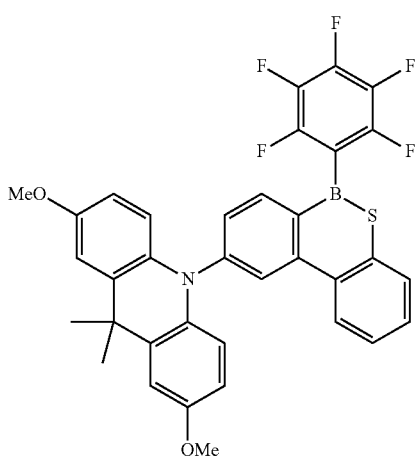
74
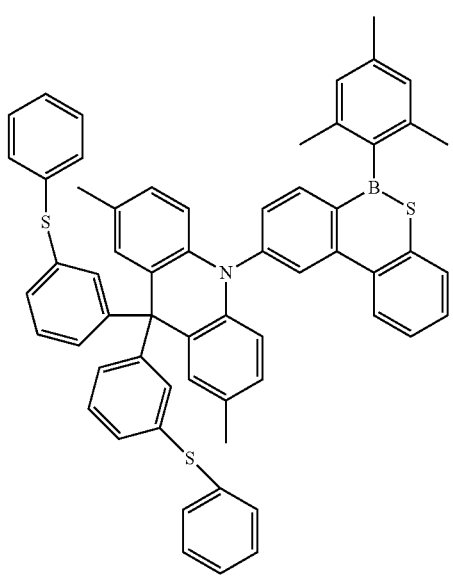

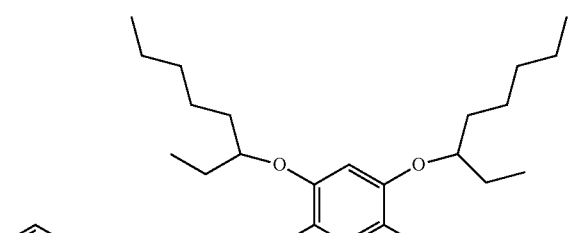
75
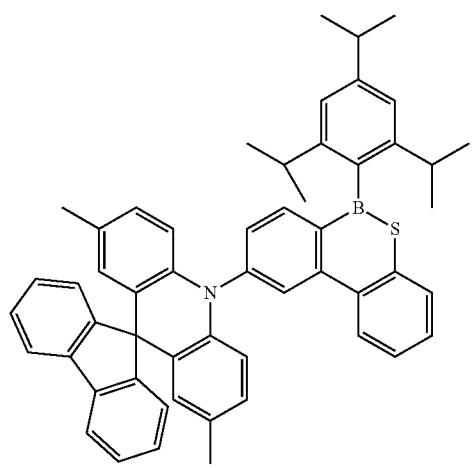
76
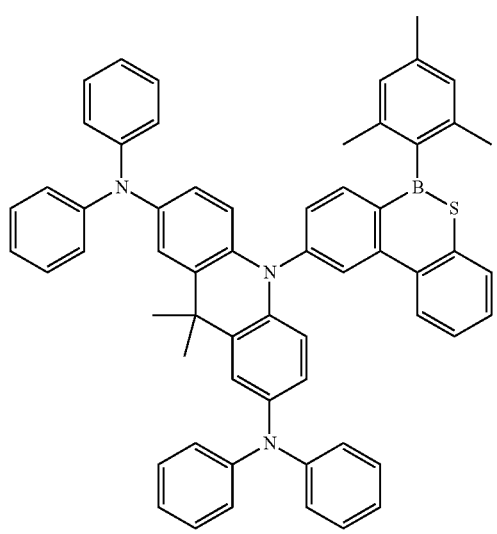
78
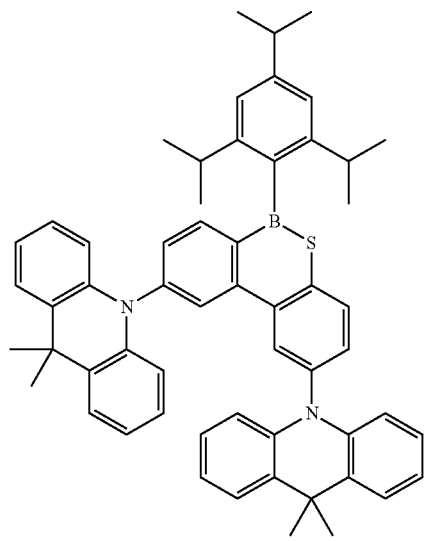
79
80
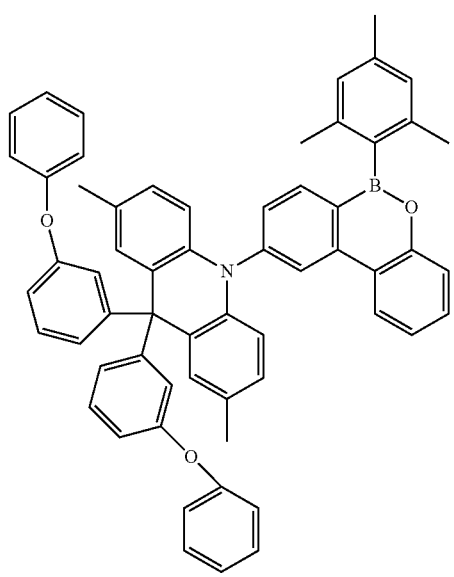
81
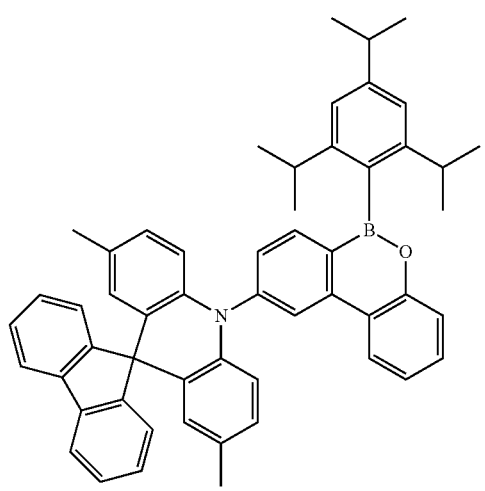

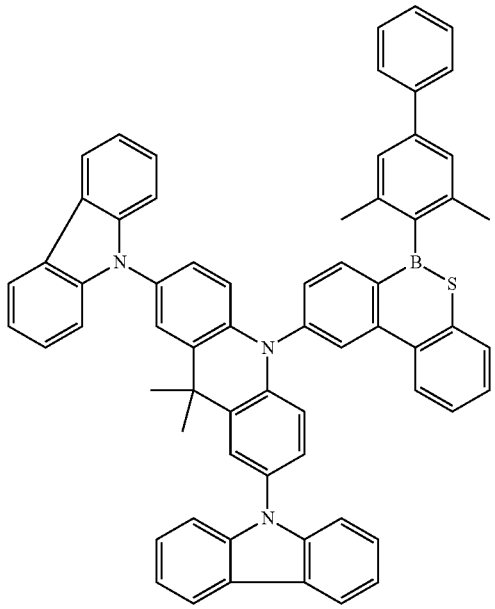

82

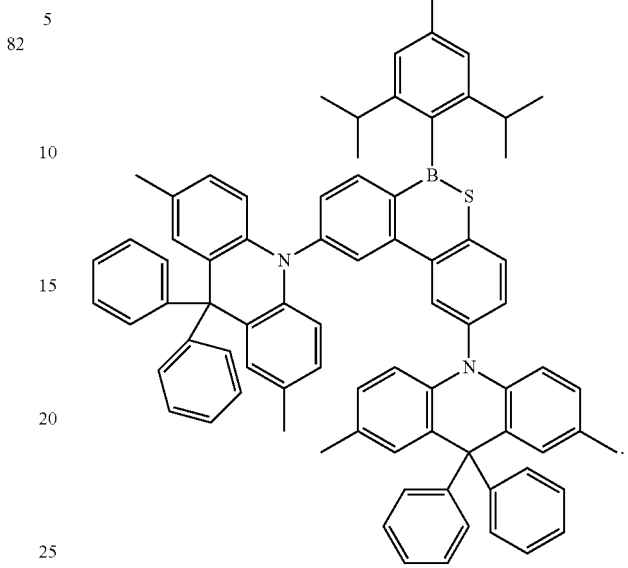

84

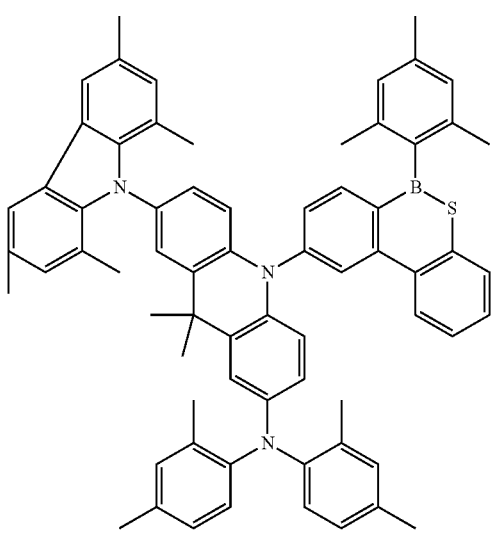

83

The emission layer EML may include one, two, or more polycyclic compounds of an embodiment.

The emission layer EML may further include a suitable (e.g., known) material in addition to a polycyclic compound of an embodiment. In the organic electroluminescence device 10 of an embodiment, the emission layer EML may include, for example, an anthracene derivative, a pyrene derivative, a fluoranthene derivative, a chrysene derivative, a dihydrobenzanthracene derivative, or a triphenylene derivative. For example, the emission layer EML may include an anthracene derivative or a pyrene derivative.

In the organic electroluminescence device 10 of an embodiment illustrated in FIGS. 1 to 3, the emission layer EML may include a host and a dopant, and the emission layer EML may include the described polycyclic compound as a dopant material. However, embodiments of the present disclosure are not limited thereto, and a polycyclic compound of an embodiment may be utilized (e.g., contained) as a host material in the emission layer EML.

A polycyclic compound of an embodiment may be included in the emission layer EML as a dopant for thermally activated delayed fluorescence.

The emission layer EML may emit light in a visible light range by including a polycyclic compound of an embodiment. For example, the emission layer EML may emit green light or blue light. For example, the emission layer EML may emit visible light having a wavelength range of about 440-540 nm or about 440-500 nm.

The emission layer EML may include a suitable material (e.g., a typical material known in the art) as a host material. The emission layer EML may include a host material, for example, bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TcTa), and/or 1,3,5-tris(N-phenylbenzimidazole-2-yl)benzene (TPBi). However, embodiments of the present disclosure are not limited thereto, and for example, tris(8-hydroxyquinolino)aluminum (Alq$_3$), 4,4'-bis(N-carbazolyl)-1,1'-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPE PO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), and/or the like may be utilized as a host material.

In an embodiment, the emission layer EML may include a suitable (e.g, known) dopant material, for example, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-Avinyl)phenyl)-N-phenylbenzenamine (N-BDAVBi)), perylene and derivatives thereof (for example, 2,5,8,11-tetra-t-butylperylene (TBP)), pyrene and derivatives thereof (for example, 1,1-dipyrene, 1,4-dipyrenylbenzene, and/or 1,4-bis(N,N-diphenylamino)pyrene), and/or the like.

In the organic electroluminescence device 10 of an embodiment illustrated in FIGS. 1 to 3, the electron transport region ETR may be disposed on the emission layer EML. The electron transport region ETR may include a hole blocking layer HBL, an electron transport layer ETL, and/or an electron injection layer EIL, but embodiments of the present disclosure are not limited thereto.

The electron transport region ETR may have a structure of: a single layer formed of a single material; a single layer formed of a plurality of different materials; or a multi-layer having a plurality of layers formed of a plurality of different materials.

For example, the electron transport region ETR may have a structure of a single layer which is an electron injection layer EIL or an electron transport layer ETL, or may have a structure of a single layer formed of an electron injection material and an electron transport material. In some embodiments, the electron transport region ETR may have a structure of a single layer formed of a plurality of different materials, or may have a structure of, sequentially laminated from the emission layer EML, electron transport layer ETL/electron injection layer EIL or hole blocking layer HBL/electron transport layer ETL/electron injection layer EIL, but embodiments of the present disclosure are not limited thereto. A thickness of the electron transport region ETR may be, for example, from about 1000-1500 Å.

The electron transport region ETR may be formed utilizing various suitable methods such as a vacuum deposition method, a spin coating method, a casting method, a Langmuir-Blodgett (LB) method, an inkjet printing method, a laser printing method, and/or a laser induced thermal imaging (LITI) method.

When the electron transport region ETR includes the electron transport layer ETL, the electron transport region ETR may include an anthracene-based compound. However, embodiments of the present disclosure are not limited thereto, and the electron transport region ETR may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), or a mixture thereof. A thickness of the electron transport layer ETL may be about 100-1000 A, for example, about 150-500 Å. When the thickness of the electron transport layer ETL satisfies the above described ranges, suitable or satisfactory electron transport performance may be achieved without substantial rise of a driving voltage.

When the electron transport region ETR includes the electron injection layer EIL, the electron transport region ETR may include (e.g., employ): an alkaline metal or an alkaline earth metal containing compound (such as LiF, lithium quinolate (LiQ), Li$_2$O, BaO, NaCI, CsF), a lanthanide metal (such as Yb), or a halogenated metal (such as RbCI and/or RbI), but embodiments of the present disclosure are not limited thereto. The electron injection layer EIL may also be formed of a mixture of an electron transport material and an insulating organo-metal salt. The organo-metal salt may be a material having an energy band gap of about 4 eV or more. For example, the organo-metal salt may contain, for example, a metal acetate, a metal benzoate, a metal acetoacetate, a metal acetylacetonate, and/or a metal stearate. Thickness of the electron injection layer EIL may be about 1-100 Å, for example, about 3-90 Å. When the thickness of the electron injection layer EIL satisfies the above described ranges, suitable or satisfactory electron injection performance may be achieved without substantial rise of a driving voltage.

The electron transport region ETR may include a hole blocking layer HBL as described above. The hole blocking layer HBL may include, for example, 2,9-dimethyl-4,7-diphenyl-1,10-phenanthroline (BCP) and/or 4,7-diphenyl-1,10-phenanthroline (Bphen), but embodiments of the present disclosure are not limited thereto. A thickness of the hole blocking layer HBL may be about 100-1000 Å, for example, about 150-500 Å. When the thickness of the hole blocking layer HBL satisfies the above described ranges, suitable or satisfactory hole blocking performance may be achieved without substantial rise of a driving voltage.

The second electrode EL2 may be disposed on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the second electrode EL2 may have a structure which has a plurality of layers including: a reflective layer or a transflective layer formed of the above described materials; and a transparent conductive layer formed of ITO, IZO, ZnO, ITZO, and/or the like.

In one embodiment, the second electrode EL2 may be connected to an auxiliary electrode. When the second electrode EL2 is connected to the auxiliary electrode, the resistance of the second electrode EL2 may be reduced.

In one embodiment, a capping layer may be further disposed on the second electrode EL2 of the organic electroluminescence device 10 of an embodiment. The capping layer may include, for example, α-NPD, NPB, TPD, m-MTDATA, $Alq_3$, Cu Pc, N4,N4,N4',N4'-tetra(biphenyl-4-yl)biphenyl-4,4'-diamine (TPD15), 4,4',4''-tris(carbazol-9-yl)-triphenylamine (TCTA), N,N'-bis(naphthalene-1-yl), and/or the like.

The polycyclic compound of an embodiment described above may be included as a material for the organic electroluminescence device 10 in the organic layer in addition to the emission layer EML. The organic electroluminescence device 10 according to an embodiment of the present disclosure may include the polycyclic compound in at least one organic layer disposed between the first electrode EL1 and the second electrode EL2, or in a capping layer disposed on the second electrode EL2.

In the organic electroluminescence device 10, as a voltage is applied to the first electrode EL1 and the second electrode EL2 respectively, the holes injected from the first electrode EL1 may move through the hole transport region HTR to the emission layer EML, and the electrons injected from the second electrode EL2 may move through the electron transport region ETR to the emission layer EML. The electrons and the holes may be recombined in the emission layer EML to generate excitons, and the excitons may emit light when the excitons fall back from an excited state to a ground state.

According to an embodiment of the present disclosure, an organic electroluminescence device 10 having high efficiency may be achieved.

According to an embodiment of the present disclosure, a polycyclic compound may be applied to (e.g., included in) an organic electroluminescence device 10 to improve efficiency.

According to an embodiment of the present disclosure, a polycyclic compound may have a difference between a lowest singlet energy level and a lowest triplet energy level of 0.2 eV or less, 0.15 eV or less, or 0.1 eV or less, and thus the polycyclic compound may be utilized as a thermally activated delayed fluorescent material. Therefore, according to an embodiment of the present disclosure, the polycyclic compound may be applied as a material for an organic electroluminescence device, thereby contributing to improved efficiency.

Hereinafter, a polycyclic compound according to an embodiment of the present disclosure and an organic electroluminescence device 10 of an embodiment including the polycyclic compound of an embodiment will be explained in more detail with reference to examples and comparative examples. In addition, the following embodiments are only examples to assist the understanding of the subject matter of the present disclosure, and the scope of the present disclosure is not limited thereto.

(Synthesis Example)

A polycyclic compound according to an embodiment of the present disclosure may be synthesized, for example, as in the following examples. However, the synthesis method of the polycyclic compound according to an embodiment of the present disclosure is not limited thereto.

1-1. Synthesis of Compounds 43 and 61

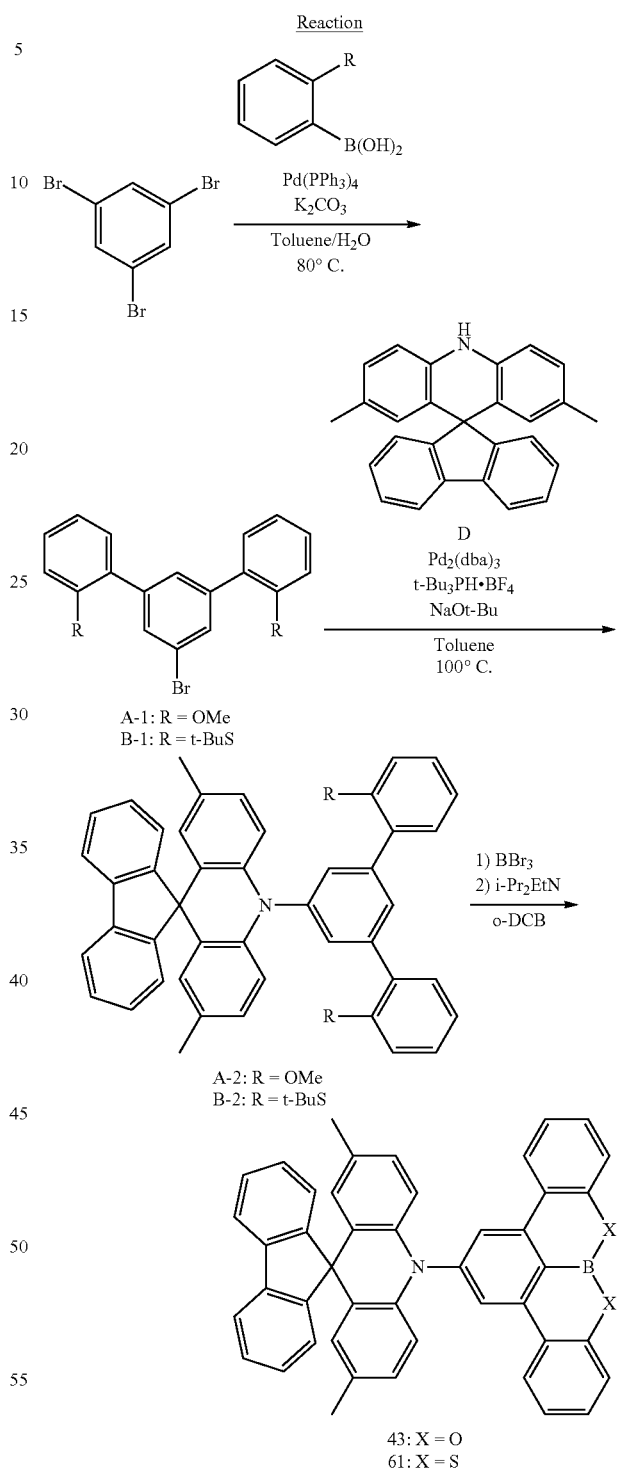

Synthesis of intermediate A-1

A mixture of 2-methoxyphenylboronic acid (1.83 g, 12.0 mmol), 1,3,5-tribromobenzene (1.89 g, 6.00 mmol), $Pd(PPh_3)_4$ (136 mg, 0.118 mmol), and $K_2CO_3$ (3.32 g, 24.0 mmol) was added to a mixed solvent of toluene (60 ml) and water (20 ml) under nitrogen atmosphere, and the mixture was stirred at 80° C. for 24 hours. Then, water was added thereto, and the product was extracted with toluene. The extracted organic layer was washed with brine, dried over anhydrous $Na_2SO_4$, and concentrated under reduced pressure. The resulting crude product was purified by silica gel column chromatography (utilizing hexane and toluene at a volume ratio of 5:1 as an eluent) to obtain intermediate A-1 as a colorless viscous oil (yield of 54%: 1.19 g, 3.22 mmol).

The result for intermediate A-1 measured by $^1$H NMR (400 MHz, $CDCl_3$) was as follows:

δ7.64 (d, J=1.6 Hz, 2H), δ7.60 (t, J=1.6 Hz, 1 H), δ7.36-7.31 (m, 4H), δ7.03 (ddd, J=7.2, 7.2, 1.2 Hz, 2H), δ6.90 (dd, J=8.0, 1.2 Hz, 2H), and δ3.83 (s, 6H).

Synthesis of intermediate A-2

A mixture of intermediate A-1 (554 mg, 1.50 mmol), D (542 mg, 1.50 mmol), $Pd_2(dba)_3$ (29 mg, 0.032 mmol), $P(t-Bu)_3H.BF_4$ (36 mg, 0.12 mmol), and sodium tert-butoxide (289 mg, 3.01 mmol) was added to toluene (7.5 ml) under nitrogen atmosphere, and the mixture was stirred at 100° C. for 20 hours. Then, a $NH_4Cl$ aqueous solution was added thereto, and the product was extracted with toluene. The extracted organic layer was washed with brine, dried over anhydrous $Na_2SO_4$, and concentrated under reduced pressure. The resulting crude product was purified by silica gel column chromatography (utilizing hexane and toluene at a volume ratio of 1:1 as an eluent) to obtain intermediate A-2 as a white solid (yield of 83%: 809 mg, 1.25 mmol). The result for intermediate A-2 measured by $^1$H NMR (400 MHz, $CDCl_3$) was as follows:

δ7.87 (t, J=1.6 Hz, 1H), δ7.80 (d, J=7.6 Hz, 2H), δ7.64 (d, J=1.6 Hz, 2H), δ7.49 (dd, J=7.6, 1.6 Hz, 2H), δ7.46 (d, J=7.6 Hz, 2H), δ7.39-7.33 (m, 4H), δ7.24 (ddd, J=7.6, 7.6, 1.6 Hz, 2H), δ7.07 (ddd, J=7.6, 7.6, 1.2 Hz, 2H), δ7.02 (d, J=8.0 Hz, 2H), δ6.77 (ddd, J=8.0, 1.6 Hz, 2H), δ6.60 (d, J=8.0 Hz, 2H), δ6.18 (d, J=2.0 Hz, 2H), δ3.86 (s, 6H), and δ1.96 (s, 6H).

Synthesis of Compound 43

Intermediate A-2 (648 mg, 1.00 mmol) was added to o-dichlorobenzene (o-DCB; 5 mL), and the mixture was stirred. Then, $BBr_3$ (1.0 M, 1.0 mL, 1.0 mmol, in heptane) was added thereto under nitrogen atmosphere at 0° C. The reaction solution was stirred at room temperature for 15 hours, and N,N-diisopropylethylamine (i-$Pr_2EtN$; 0.34 mL, 2.0 mmol) was added thereto. After removal of the solvent in vacuum, the resulting crude product was washed with hexane and acetonitrile to obtain compound 43 as a white solid (yield of 57%: 360 mg, 0.574 mmol). The result for compound 43 measured by $^1$H NMR (400 MHz, $CDCl_3$) was as follows:

δ8.19 (s, 2H), δ8.16 (d, J=7.6 Hz, 2H), δ7.85 (d, J=7.2 Hz, 2H), δ7.54-7.49 (m, 6H), δ7.43 (ddd, J=7.6, 7.6, 1.2 Hz, 2H), δ7.35-7.29 (m, 4H), δ6.70 (dd, J=8.0, 2.0 Hz, 2H), δ6.31 (d, J=8.8 Hz, 2H), δ6.23 (d, J=2.4 Hz, 2H), and δ1.96 (s, 6H).

A [M]+value of compound 43 measured by matrix assisted laser desorption/ionization-time of flight mass spectrometry (MALDI-TOF MS) measurement was 627.45 (m/z).

Synthesis of intermediate B-1

A mixture of (2-(tert-butylthio)phenyl)boronic acid (2.56 g, 12.2 mmol), 1,3,5-tribromobenzene (1.91 g, 6.07 mmol), $Pd(PPh_3)_4$ (209 mg, 0.181 mmol), and $K_2CO_3$ (3.36 g, 24.3 mmol) was added to a mixed solvent of toluene (45 ml) and water (15 ml) under nitrogen atmosphere, and the mixture was stirred at 80° C. for 24 hours. Then, water was added thereto, and the product was extracted with ethyl acetate. The extracted organic layer was washed with brine, dried over anhydrous $Na_2SO_4$, and concentrated under reduced pressure. The resulting crude product was purified by silica gel column chromatography (utilizing hexane and toluene at a volume ratio of 10:1 as an eluent) to obtain intermediate B-1 as a colorless viscous oil (yield of 77%: 2.26 g, 4.65 mmol). The result for intermediate B-1 measured by $^1$H NMR (400 MHz, $CDCl_3$) was as follows:

δ7.70 (d, J=8.0 Hz, 2H), δ7.55 (d, J=1.6 Hz, 2H), δ7.41-7.38 (m, 5H), δ7.35-7.30 (m, 2H), δ6.90 (dd, J=8.0, 1.2 Hz, 2H), and δ1.10 (s, 18H).

Synthesis of intermediate B-2

A mixture of intermediate B-1 (1.43 g, 2.95 mmol), D (1.12 g, 3.10 mmol), $Pd_2(dba)_3$ (55 mg, 0.060 mmol), $P(t-Bu)_3H.BF_4$ (69 mg, 0.24 mmol), and sodium tert-butoxide (575 mg, 5.98 mmol) was added to toluene (15 ml) under nitrogen atmosphere, and the mixture was stirred at 100° C. for 20 hours. Then, a $NH_4Cl$ aqueous solution was added thereto and the product was extracted with toluene. The extracted organic layer was washed with brine, dried over anhydrous $Na_2SO_4$, and concentrated under reduced pressure. The resulting crude product was purified by silica gel column chromatography (utilizing hexane and toluene at a volume ratio of 2:1 as an eluent) to obtain intermediate B-2 as a white solid (yield of 87%: 1960 mg, 2.57 mmol). The result for intermediate B-2 measured by $^1$H NMR (400 MHz, $CDCl_3$) was as follows:

δ7.80 (d, J=7.6 Hz, 2H), δ7.74 (dd, J=7.6, 1.2 Hz, 2H), δ7.65 (t, J=1.6 Hz, 1 H), δ7.57 (dd, J=7.6, 1.6 Hz, 2H), δ7.54 (d, J=1.6 Hz, 2H), δ7.48-7.43 (m, 4H), δ7.38 (dd, J=7.6, 1.2 Hz, 2H), δ7.34 (dd, J=7.6, 1.2 Hz, 2H), δ7.25 (ddd, J=7.6, 7.6, 1.2 Hz, 2H), δ6.73 (dd, J=8.4, 1.6 Hz, 2H), δ6.60 (d, J=8.4 Hz, 2H), δ6.16 (d, J=2.0 Hz, 2H), δ1.95 (s, 6H), and δ1.17 (s, 18H).

Synthesis of Compound 61

Intermediate B-2 (1.15 g, 1.50 mmol) was added to o-dichlorobenzene (9 mL), and the mixture was stirred. Then, $BBr_3$ (1.0 M, 1.5 mL, 1.5 mmol, in heptane) was added thereto under nitrogen atmosphere at 0° C. The reaction mixture was stirred at 40° C. for 15 hours, and N,N-diisopropylethylamine (0.50 ml, 2.9 mmol) was added thereto. After removal of the solvent in vacuum, the resulting crude product was washed with hexane and acetonitrile to obtain compound 61 as a yellow solid (yield of 96%: 948 mg, 1.44 mmol). The result for compound 61 measured by $^1$H NMR (400 MHz, $CDCl_3$) was as follows:

δ8.54 (s, 2H), δ8.35-7.32 (m, 2H), δ7.85 (d, J=7.2 Hz, 2H), δ7.73-7.70 (m, 2H), δ7.52 (d, J=7.6 Hz, 2H), δ7.45-7.40 (m, 6H), δ7.33 (ddd, J=7.6, 7.6, 1.2 Hz, 2H), δ6.71 (dd, J=8.4, 1.6 Hz, 2H), δ6.34 (d, J=8.4 Hz, 2H), δ6.23 (d, J=2.0 Hz, 2H), and δ1.96 (s, 6H).

A [M]+value of compound 61 measured by matrix assisted laser desorption/ionization-time of flight mass spectrometry (MALDI-TOF MS) measurement was 659.13 (m/z).

1-2. Synthesis of Compound 81

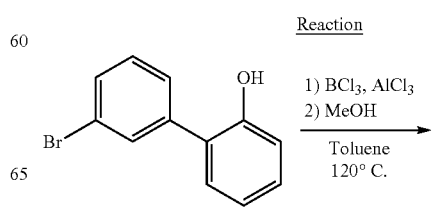

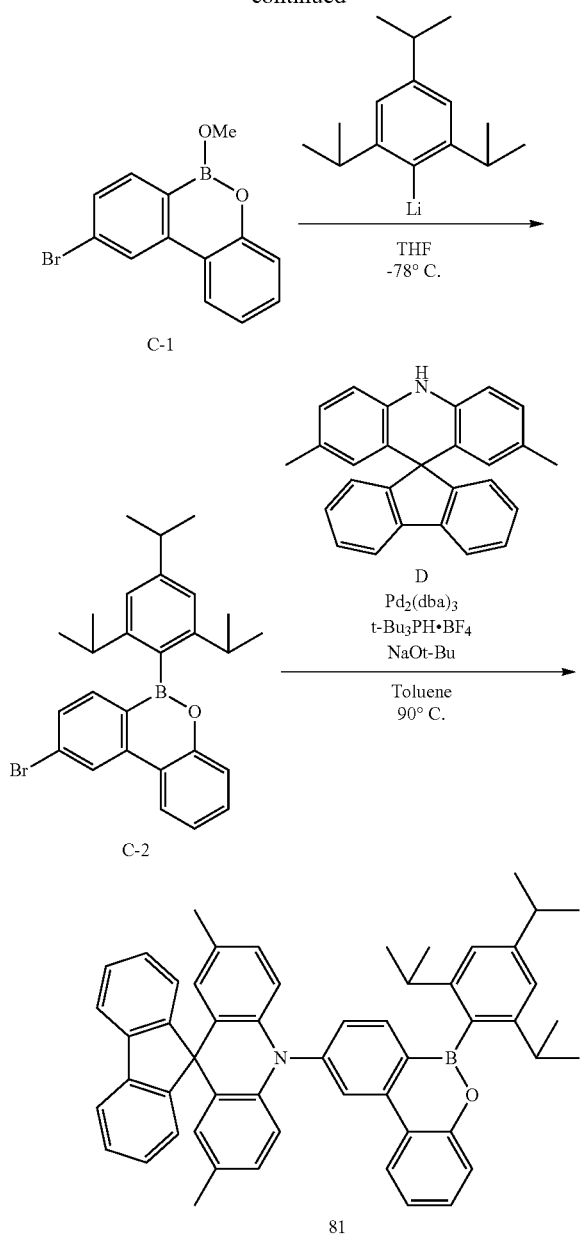

Synthesis of Intermediate C-1

BCl$_3$ (1.0 M, 6.0 ml, 6.0 mmol, in heptane) was added to anhydrous toluene (30 ml) under nitrogen atmosphere, and 3'-bromo-biphenyl-2-ol (996 mg, 4.00 mmol) mixed with anhydrous toluene (8 ml) was dripped thereto. The reaction mixture was heated to room temperature, and thereafter, AlCl$_3$ (60 mg, 0.45 mmol) was added. Then, the reaction mixture was stirred at 120° C. for 15 hours, and methanol (4 ml) was added thereto at 0° C. After removal of the solvent in vacuum, the resulting crude product was filtered in anhydrous CH$_2$Cl$_2$. The filtrate was concentrated under reduced pressure, and then the resulting crude product was washed with methanol to obtain intermediate C-1 as a brown solid (yield of 81%: 934 mg, 3.23 mmol). The resulting crude product was utilized in the subsequent (e.g., next) reaction without additional purification.

Synthesis of Intermediate C-2

1-bromo-2,4,6-triisopropylbenzene was added to anhydrous tetrahydrofuran (20 ml), and n-BuLi (1.57 M, 2.57 ml, 4.03 mmol, in hexane) was added thereto at −78° C. The reaction mixture was stirred at the same temperature for 1 hour, and intermediate C-1 (934 mg, 3.23 mmol, in anhydrous THF) was added thereto. The reaction mixture was heated to 0° C., and thereafter slowly heated to room temperature. After addition of water, the product was extracted with ethyl acetate. The extracted organic layer was washed with brine, dried over anhydrous Na$_2$SO$_4$, and concentrated under reduced pressure. Then, the resulting crude product was purified by silica gel column chromatography (utilizing hexane and toluene at a volume ratio of 4:1 as an eluent) and re-precipitated from hexane and ethanol to obtain intermediate C-2 as a white solid (yield of 29%: 528 mg, 1.14 mmol). The result for intermediate C-2 measured by $^1$H NMR (400 MHz, CDCl$_3$) was as follows:

δ8.46 (s, 1 H), δ8.24 (d, J=7.6 Hz, 1 H), δ7.69 (d, J=8.4 Hz, 1 H), δ7.56-7.51 (m, 3H), δ7.07 (s, 2H), δ2.96 (sept, J=6.4 Hz, 1 H), δ2.54 (sept, J=6.4 Hz, 2H), δ1.32 (d, J=7.2 Hz, 6H), δ1.19 (d, J=6.8 Hz, 6H), and δ1.08 (d, J=6.8 Hz, 6H).

Synthesis of Compound 81

A mixture of intermediate C-2 (162 mg, 0.351 mmol), D (127 mg, 0.351 mmol), Pd$_2$(dba)$_3$ (6.8 mg, 0.0076 mmol), P(t-Bu)$_3$H.BF$_4$ (8.9 mg, 0.031 mmol), and sodium tert-butoxide (NaOt-Bu; 51 mg, 0.531 mmol) was added to toluene (3.5 mL) under nitrogen atmosphere, and the mixture was stirred at 90° C. for 16 hours. Then, water was added thereto, and the product was extracted with toluene. The extracted organic layer was washed with brine, dried over anhydrous Na$_2$SO$_4$, and concentrated under reduced pressure. The resulting crude product was purified by silica gel column chromatography (utilizing hexane and toluene at a volume ratio of 3:1 as an eluent) and re-precipitated from CH$_2$Cl$_2$ and methanol to obtain compound 81 as a white solid (yield of 65%: 169 mg, 0.228 mmol). The result for compound 81 measured by $^1$H NMR (400 MHz, CDCl$_3$) was as follows:

δ8.43 (s, 1 H), δ8.29 (d, J=8.0 Hz, 1 H), δ8.15 (d, J=8.4 Hz, 1 H), δ7.83 (d, J=7.6 Hz, 2H), δ7.60-7.36 (m, 8H), δ7.29 (d, J=7.6 Hz, 2H), δ7.13 (s, 2H), δ6.72 (d, J=8.4 Hz, 2H), δ6.30 (d, J=8.4 Hz, 2H), δ6.21 (s, 2H), δ2.99 (sept, J=6.4 Hz, 1 H), δ2.71 (sept, J=6.4 Hz, 2H), δ1.95 (s, 6H), δ1.35 (d, J=6.8 Hz, 6H), δ1.28 (d, J=6.4 Hz, 6H), and δ1.19 (d, J=6.4 Hz, 6H).

A [M]+value of compound 81 measured by matrix assisted laser desorption/ionization-time of flight mass spectrometry (MALDI-TOF MS) measurement was 739.45 (m/z).

2. Manufacture and Evaluation of Polycyclic Compound and Organic Electroluminescence Device Including the Polycyclic Compound 2-1. Energy Level of the Polycyclic Compound Lowest singlet (S1) energy levels and lowest triplet (T1) energy levels of the compounds 43, 61, and 81 in Examples and X-1, X-2, and X-3 in Comparative Examples were measured (e.g., calculated) by a nonempirical molecular orbital method. For example, the calculation was performed by utilizing the Gaussian09 software package from Gaussian, Inc., and applying density functional theory (DFT) utilizing the B3LYP hybrid functional for a general function and the 6-31G(d) basis set for a base function.

COMPOUNDS IN EXAMPLES

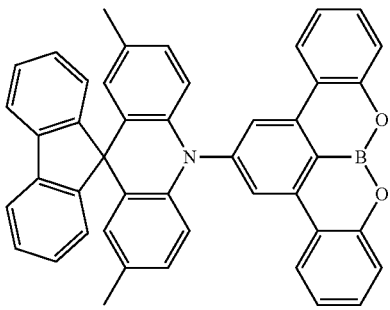
43

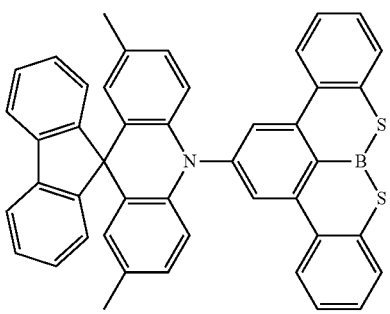
61

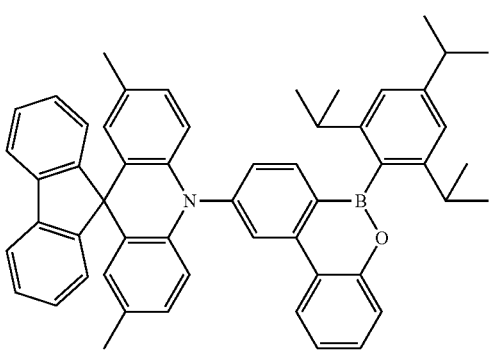
81

COMPOUNDS IN COMPARATIVE EXAMPLES

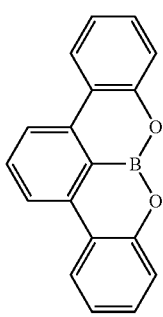
X-1

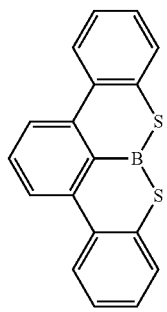
X-2

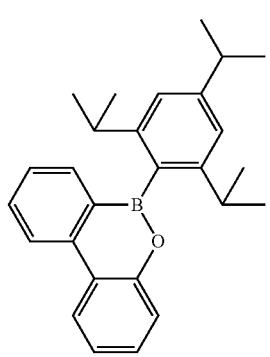
X-3

TABLE 1

| Compound | S1 energy level | T1 energy level | $\Delta E_{ST}$ |
| --- | --- | --- | --- |
| Compound 43 in Example | 2.79 | 2.75 | 0.04 |
| Compound 61 in Example | 2.55 | 2.55 | 0.00 |
| Compound 81 in Example | 2.77 | 2.76 | 0.01 |
| Compound X-1 in Comparative Example | 3.78 | 2.83 | 0.95 |
| Compound X-2 in Comparative Example | 3.53 | 2.82 | 0.71 |
| Compound X-3 in Comparative Example | 3.84 | 3.10 | 0.74 |

In Table 1, $\Delta E_{ST}$ represents a difference value between a lowest singlet energy level and a lowest triplet energy level. The S1 and T1 energy level units are eV. The $\Delta E_{ST}$ values of the compounds in Examples are about 0.00-0.04 eV, and the $LE_{ST}$ values of the compounds in Comparative Examples are about 0.71-0.95 eV. Accordingly, it was found that the compounds in Examples have lower $\Delta E_{ST}$ values than the compounds in Comparative Examples. Therefore, all the compounds in Examples may be more suitable as thermally activated delayed fluorescence materials than the compounds in Comparative Examples, and all the compounds in Examples may emit highly efficient (e.g., very efficiently emit) thermally activated delayed fluorescence.

Evaluation of Fluorescence Emission Characteristics

A JASCO V-670 spectrometer was utilized for evaluation of fluorescence emission characteristics. For measuring the compounds in Examples, a film was formed on quartz glass by doping PPF with 20 wt % of the compound of Example or Comparative Example, and a fluorescence emission spectrum thereof was measured. For the fluorescence emission spectrum of the comparative example compounds, known data were described. A fluorescence quantum yield of Example and Comparative example was measured utilizing a JASCO ILF-835 integrating sphere system. A value based on the CIE 1931 color space was utilized as a Z stimulus value in the CIE tristimulus values of the CIE color matching functions at each maximum emission wavelength, and when the wavelength was 360 nm or less, the value at the 360 nm wavelength was utilized as a Z stimulus value. A blue fluorescence efficiency index was defined as multiplication of the fluorescence quantum yield and the Z stimulus value at each maximum emission wavelength, and relative luminous efficiency of each material was compared.

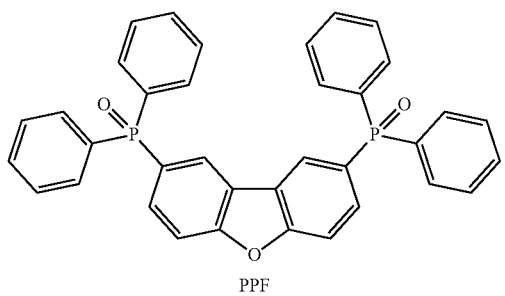

PPF

TABLE 2

| Compound | λ max (nm) | Fluorescence quantum yield (%) | Z stimulus value (in λ max) | Blue fluorescence efficiency index (in λ max) |
|---|---|---|---|---|
| Compound 43 in Example | 461 | 28 | 1.65 | 4.61 × 10 |
| Compound 61 in Example | 491 | 81 | 4.40 × 10$^{-1}$ | 3.56 × 10 |
| Compound 81 in Example | 458 | 53 | 1.71 | 9.04 × 10 |
| Compound X-1 in Comparative Example | 335 | 60 | 6.06 × 10$^{-4}$ | 3.64 × 10$^{-2}$ |
| Compound X-3 in Comparative Example | 341 | 35 | 6.06 × 10$^{-4}$ | 2.12 × 10$^{-2}$ |

In Table 2, the blue fluorescence efficiency indices of the compounds in Examples were about 3.56×10 to 9.04×10, and the blue fluorescence efficiency indices of the compounds in Comparative Examples X-1 and X-3 were 3.64× 10$^{-2}$ and 2.12×10$^{-2}$, respectively. Accordingly, the compounds in Examples have higher blue relative luminous efficiency than the compounds in Comparative Examples, and thus, when the compounds in Examples are utilized as blue light emission materials in applications such as display devices, high-efficiency may be achieved.

Manufacture of Organic Electroluminescence Devices

The organic electroluminescence devices in Examples 1 to 3 were manufactured by utilizing the compounds 43, 61, and 81 in Examples as dopant materials in the emission layer.

In the organic electroluminescence devices in Examples 1 to 3, a first electrode EL1 having a thickness of about 1500 Å was formed with ITO, cleaned with ultrapure water, and subjected to UV ozone treatment for 10 minutes. A hole injection layer HIL having a thickness of about 400 Å was formed with NPB, and an emission layer EML having a thickness of 200 Å was formed with PPF doped with the compounds in Examples at a ratio of 20%, respectively. A hole blocking layer HBL having a thickness of 100 Å was formed with PPF, an electron transport layer ETL having a thickness of 300 Å was formed with TPBi, and an electron injection layer EIL having a thickness of 10 Å was formed with Liq. A second electrode EL2 having a thickness of 1000 Å was formed with Al. Each layer was formed by a vacuum deposition method utilizing vacuum deposition apparatus.

Evaluation of Characteristics of Organic Electroluminescence Devices

To evaluate characteristics of the organic electroluminescence devices according to Examples and Comparative Examples, maximum values of external quantum efficiency were evaluated. A voltage and current density of the organic electroluminescence device were measured utilizing a source meter (2400 series manufactured by Keithley Instruments), and luminance and external quantum efficiency were measured utilizing external quantum efficiency measuring apparatus C9920-12 manufactured by Hamamatsu Photonics.

TABLE 3

| Device manufacturing example | Emission layer dopant | λ max (nm) | EQE max (%) | Maximum current efficiency (cd/A) |
|---|---|---|---|---|
| Example 1 | compound 43 | 471 | 5.2 | 9.1 |
| Example 2 | compound 61 | 489 | 20.9 | 46.7 |
| Example 3 | compound 81 | 459 | 13.3 | 16.1 |

Referring to the results in Table 3, each of the devices in Examples 1 to 3 emits deep blue light or blue green light in a wavelength range of about 459-489 nm, and thus, the devices in Examples are more suitable for usage as blue light emission materials when compared with the devices in Comparative Examples, which emit light in the ultraviolet or violet wavelength range (referring to Table 2). In addition, the devices in Examples 1 to 3 have external quantum efficiencies of about 5.2-20.9% and maximum current efficiencies of about 9.1-46.7 cd/A, and thus, it was found that the devices in Examples have high efficiency characteristics when compared with other fluorescent light emission materials which generally have external quantum efficiencies of about 5% or less. For example, the devices in Examples 2 and 3 have external quantum efficiencies of 13.3% and 20.9% respectively, and thus, these devices have excellent luminescence efficiencies.

A polycyclic compound according to an embodiment of the present disclosure includes an electron donor represented by Formula 1 and an electron acceptor represented by Formula 2-1 or Formula 2-2. Distortion in the molecular structure occurs due to steric characteristics of the electron donor represented by Formula 1 and the electron acceptor represented by Formula 2-1 or Formula 2-2, and the highest occupied molecular orbital (HOMO) and the lowest unoccupied molecular orbital (LUMO) are separated. The separation of the HOMO and LUMO leads to reduced $\Delta E_{ST}$, and as a result, reverse intersystem crossing is likely to occur, so that the polycyclic compound of an embodiment may function as a thermally activated delayed fluorescent material.

Furthermore, each of Formula 2-1 and Formula 2-2 includes a structure of borinate ester (Formula 2-1) or boronate ester (Formula 2-2) in which B, which is an electron accepting atom, is directly bonded to O or S, which is an electron donating atom, and thus, the electron deficiency of B is relaxed (e.g., compensated) by O or S, so that the polycyclic compound may function as a thermally activated delayed fluorescent material which emits light in the blue wavelength range.

A polycyclic compound of an embodiment includes an electron donor and an electron acceptor bonded to the electron donor. The electron donor may contain an acridine derivative or a dibenzo-azasiline derivative. The electron acceptor may contain B as a ring-forming atom, O or S directly bonded to B, and may also contain a heterocyclic group in which three or five hexagonal rings are condensed.

An organic electroluminescence device including a polycyclic compound according to an embodiment of the present disclosure may achieve have high efficiency.

A polycyclic compound according to an embodiment of the present disclosure may be applied to an organic electroluminescence device to contribute to high efficiency.

Expressions such as "at least one of" or "at least one selected from" when preceding a list of elements, modify the entire list of elements and do not modify the individual elements of the list. Further, the use of "may" when describing embodiments of the present disclosure refers to "one or more embodiments of the present disclosure." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed, and equivalents thereof.

What is claimed is:

1. An organic electroluminescence device comprising:
   a first electrode;
   a second electrode on the first electrode; and
   a plurality of organic layers between the first electrode and the second electrode, and comprising an emission layer,
   wherein the emission layer comprises a polycyclic compound comprising an electron donor and an electron acceptor bonded to the electron donor,
   the electron donor comprises an acridine derivative or a dibenzo-azasiline derivative, and
   the electron acceptor comprises B as a ring-forming atom, O or S directly bonded to B, and a heterocyclic group in which three or five hexagonal rings are condensed.

2. The organic electroluminescence device of claim 1, wherein the electron acceptor comprises a dibenzo-thiaborinine derivative or a dibenzo-oxaborinine derivative.

3. The organic electroluminescence device of claim 2, wherein the emission layer comprises a host and a dopant, and
   the dopant comprises the polycyclic compound.

4. The organic electroluminescence device of claim 1, wherein a difference ($\Delta E_{ST}$) between a lowest singlet energy level and a lowest triplet energy level of the polycyclic compound is 0.2 eV or less.

5. The organic electroluminescence device of claim 1, wherein the emission layer is to emit light in a wavelength range of 440-500 nm.

6. The organic electroluminescence device of claim 1, wherein the electron donor is represented by Formula 1, and the electron acceptor is represented by Formula 2-1 or Formula 2-2:

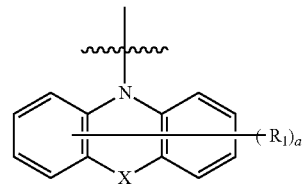

Formula 1

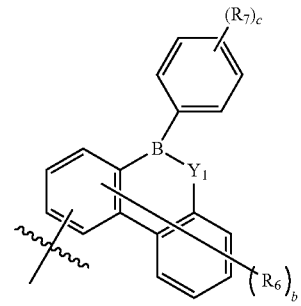

Formula 2-1

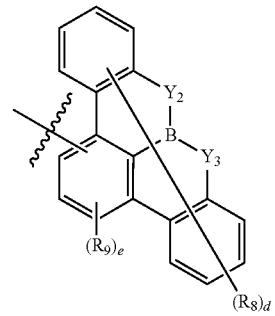

Formula 2-2 wherein in Formula 1,
$R_1$ is a hydrogen atom, a deuterium atom, a halogen atom, a substituted or unsubstituted silyl group, a substituted or unsubstituted amine group, a substituted or unsubstituted alkoxy group having 1 to 10 carbon atoms, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms,
a is an integer of 0 to 8,
X is $CR_2R_3$ or $SiR_4R_5$, $R_2$ to $R_5$ are each independently a hydrogen atom, a deuterium atom, a halogen atom, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, or are bonded with one or more adjacent groups to form a ring, wherein in Formula 2-1 and in Formula 2-2, $Y_1$ to $Y_3$ are each independently O or S, $R_6$ to $R_9$ are each independently a hydrogen atom, a deuterium atom, a halogen atom, a substituted or unsubstituted alkoxy group having 1 to 10 carbon atoms, a substituted or unsubstituted sulfide group having 1 to 10 carbon atoms, a substituted or unsubstituted amine group, a substituted or unsubstituted silyl group, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, b is an integer of 0 to 7, c is an integer of 0 to 5, d is an integer of 0 to 8, and e is an integer of 0 to 2.

7. The organic electroluminescence device of claim 6, wherein the polycyclic compound is represented by Formula 3-1 or Formula 3-2:

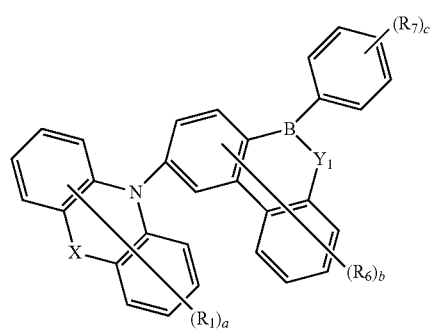

Formula 3-1

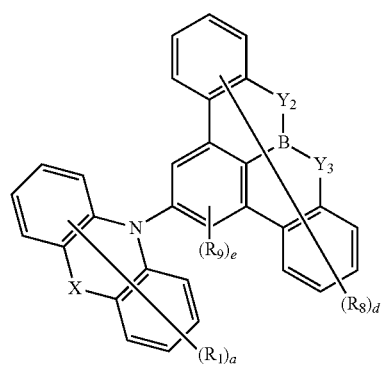

Formula 3-2 wherein in Formula 3-1 and Formula 3-2, $R_1$, X, $Y_1$ to $Y_3$, $R_6$ to $R_9$, and a to e are the same as respectively defined in connection with Formula 1, Formula 2-1, and Formula 2-2.

8. The organic electroluminescence device of claim 6, wherein the electron donor represented by Formula 1 is represented by Formula 4:

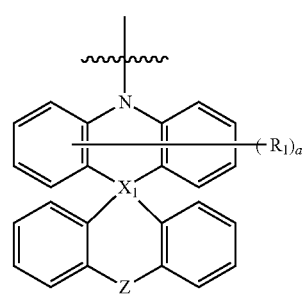

Formula 4 wherein in Formula 4, $X_1$ is C or Si,

Z is a direct bond, O, or S, and $R_1$ and a are the same as respectively defined in connection with Formula 1.

9. The organic electroluminescence device of claim 6, wherein $Y_2$ and $Y_3$ are the same.

10. The organic electroluminescence device of claim 6, wherein Ri is a hydrogen atom, a fluorine atom, a methyl group, a t-butyl group, a substituted or unsubstituted arylamine group having 6 to 20 ring-forming carbon atoms, a substituted or unsubstituted phenyl group, a substituted or unsubstituted phenanthryl group, a substituted or unsubstituted thiophenyl group, a substituted or unsubstituted carbazolyl group, or a substituted or unsubstituted acridinyl group.

11. The organic electroluminescence device of claim 6, wherein $R_2$ to $R_5$ are each independently a methyl group or a substituted or unsubstituted phenyl group, or are bonded to one or more adjacent groups to form a dibenzospiro ring.

12. The organic electroluminescence device of claim 1, wherein the polycyclic compound comprises at least one of compounds represented in Compound Group 1:

Compound Group 1

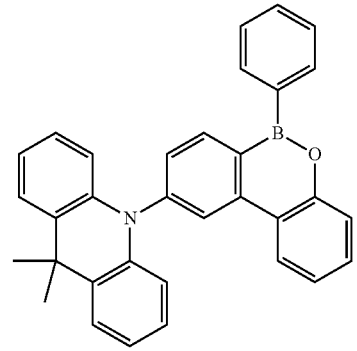

1

2
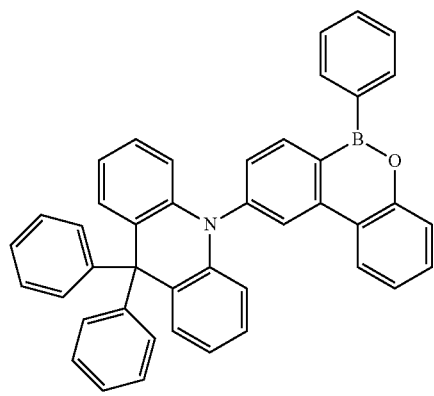
3
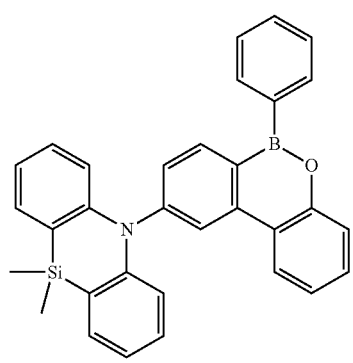
4
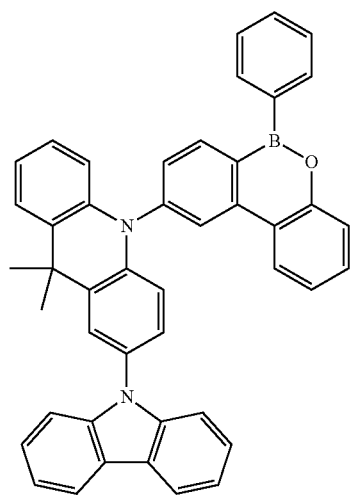
5
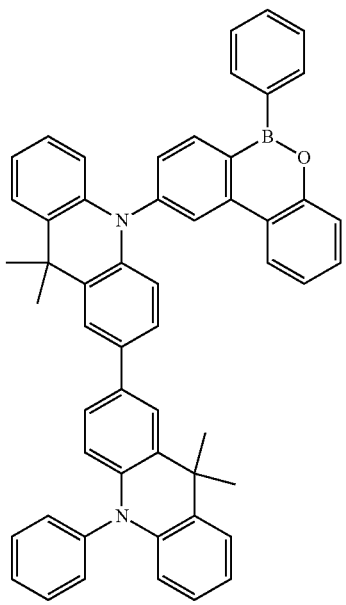
6
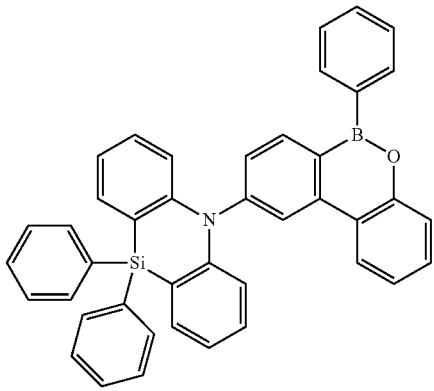
7
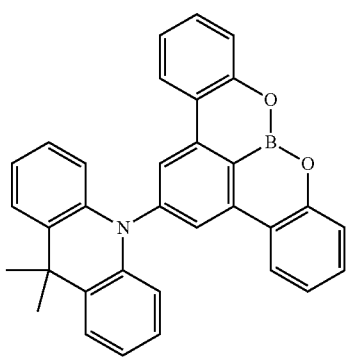

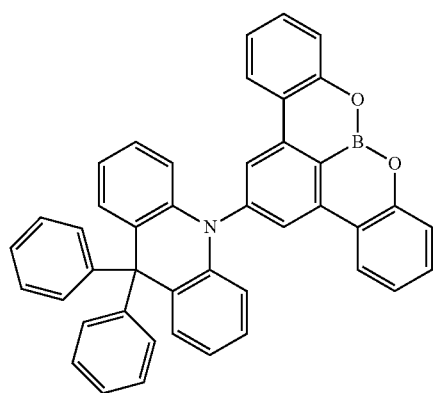
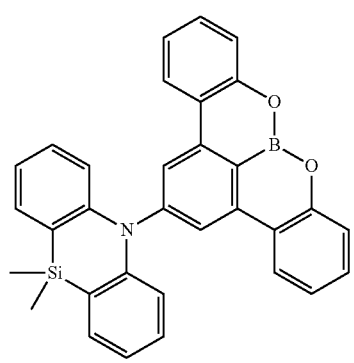
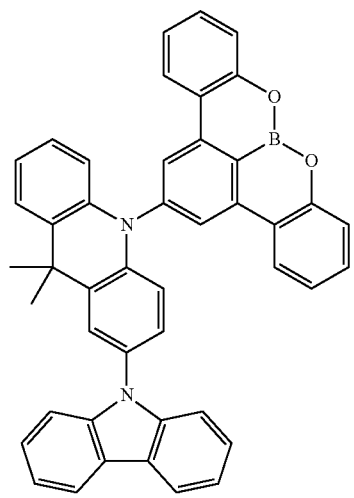
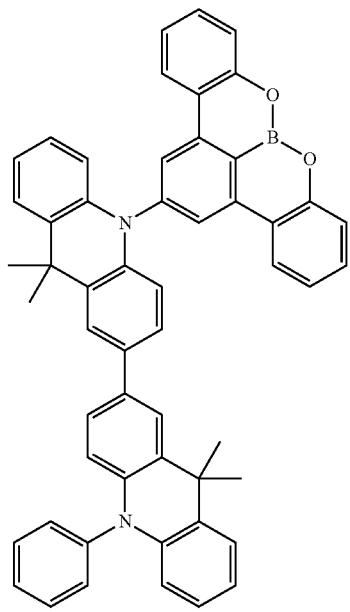
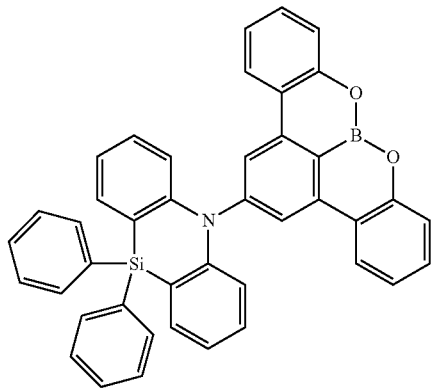
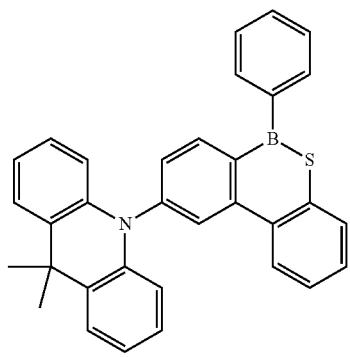

14
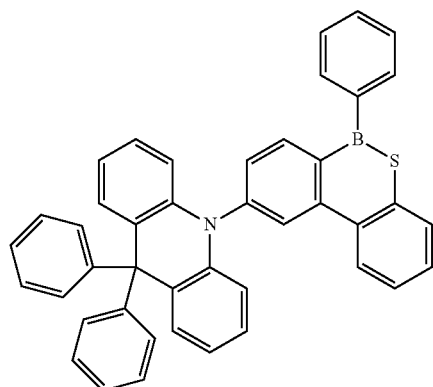
15
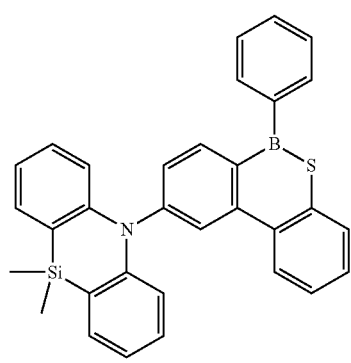
16
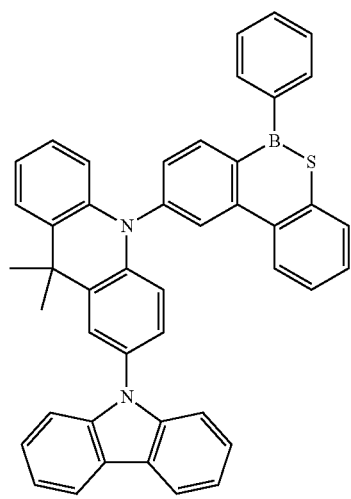
17
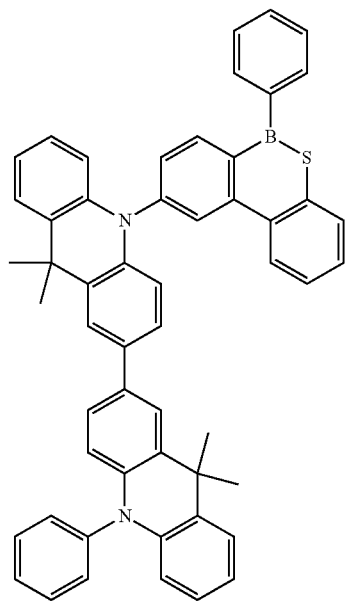
18
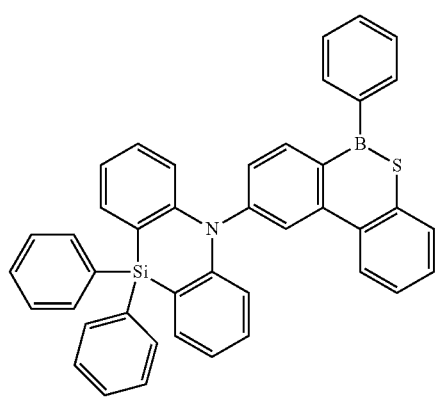
19
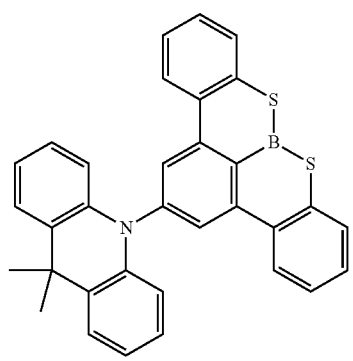

20
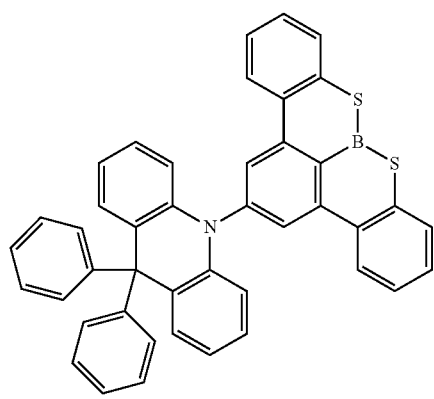
21
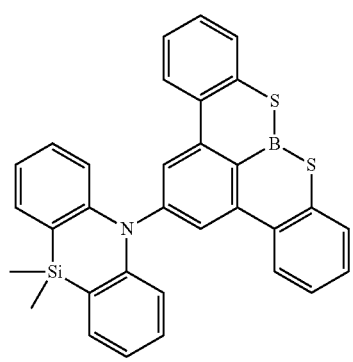
22
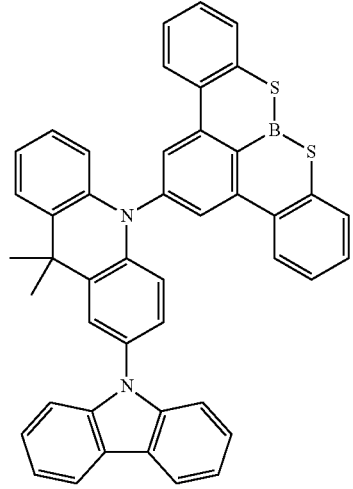
23
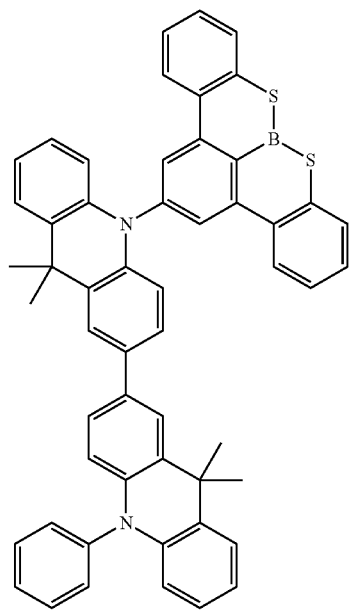
24
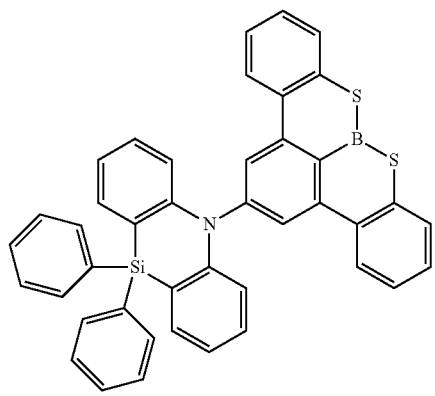
25
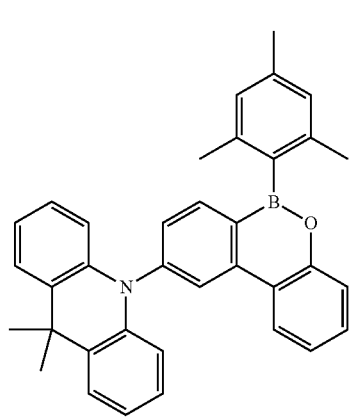

26
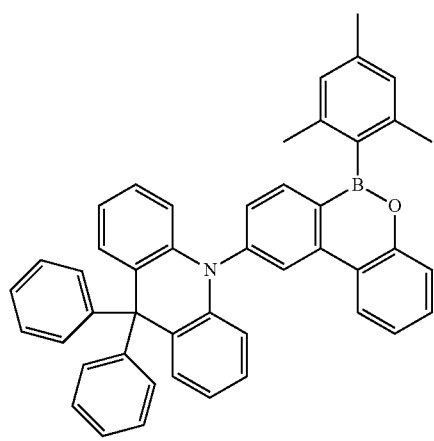
27
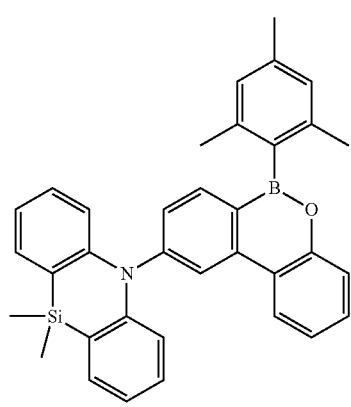
28
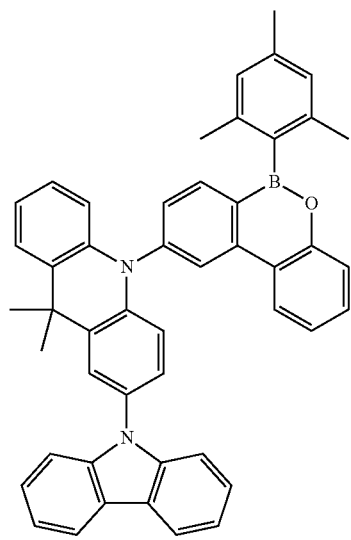
29
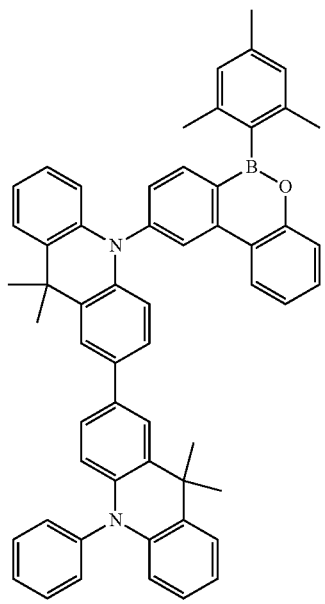
30
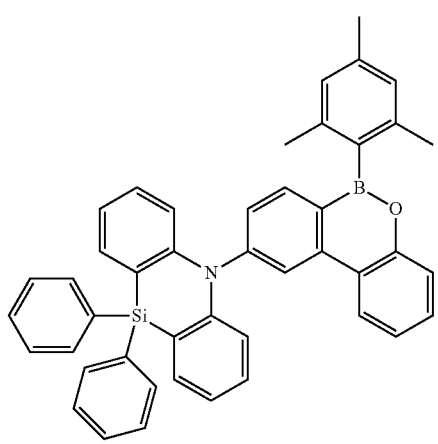
31
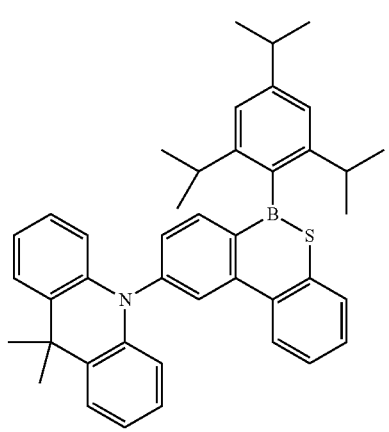

-continued
32
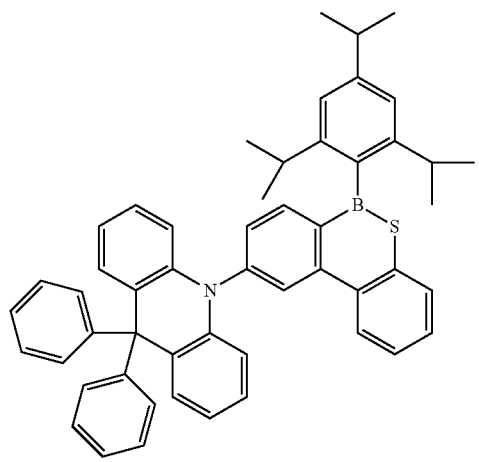
33
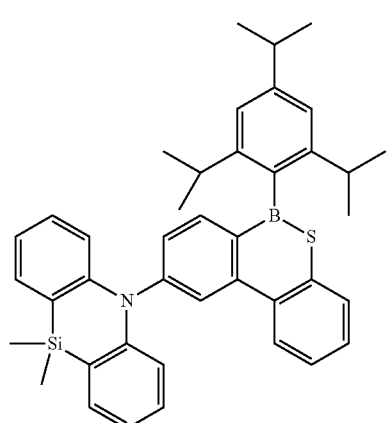
34
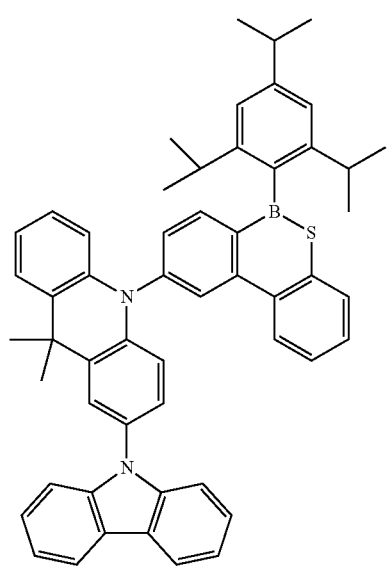
-continued
35
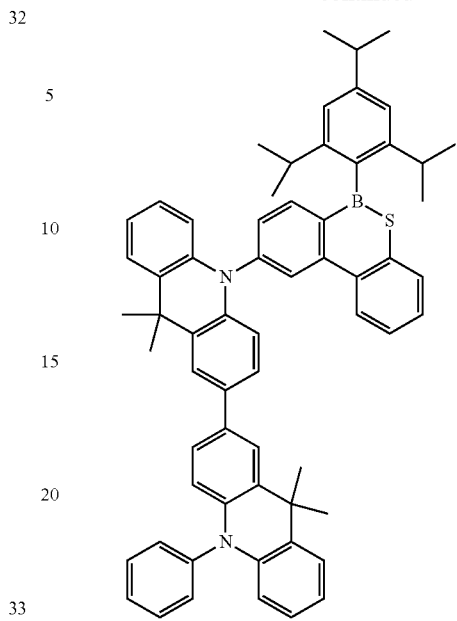
36
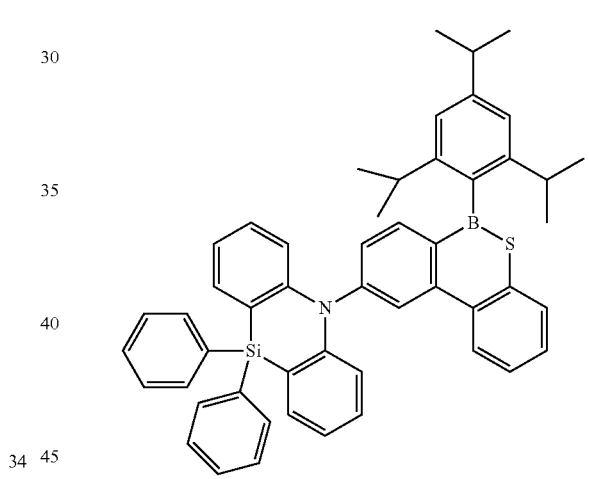
37
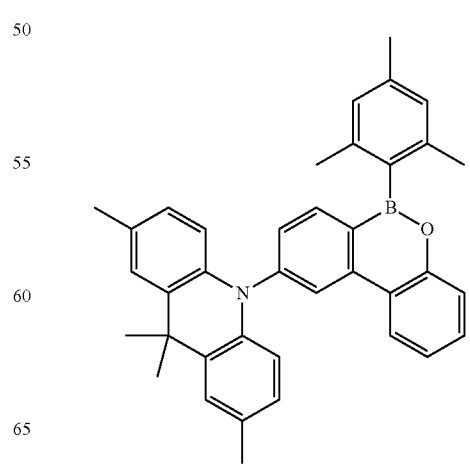

38
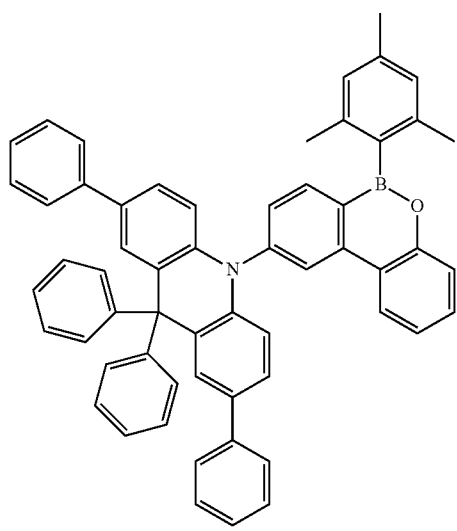
39
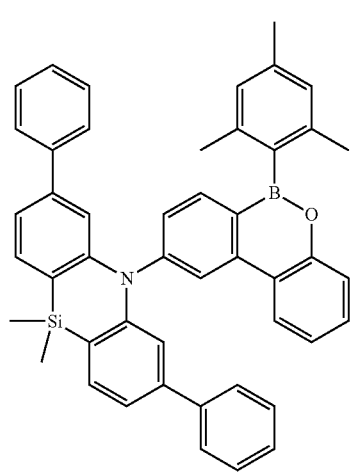
40
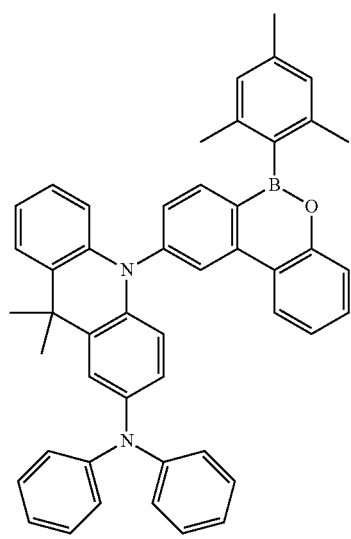
41
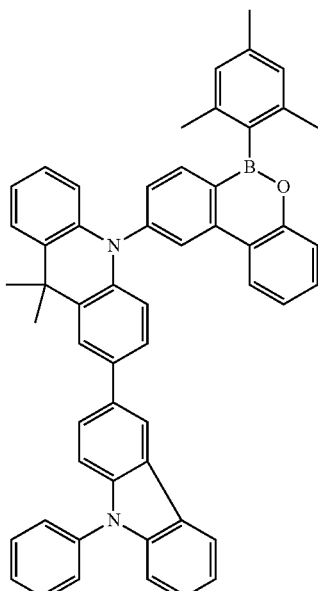
42
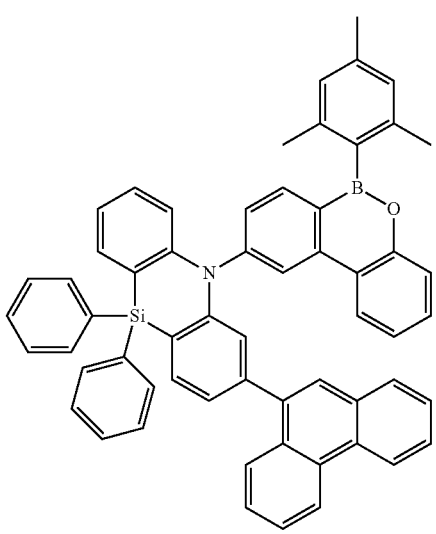
43
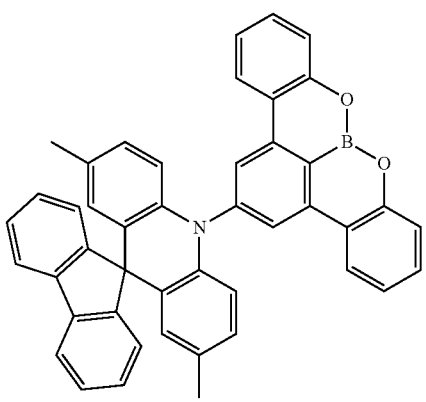

44
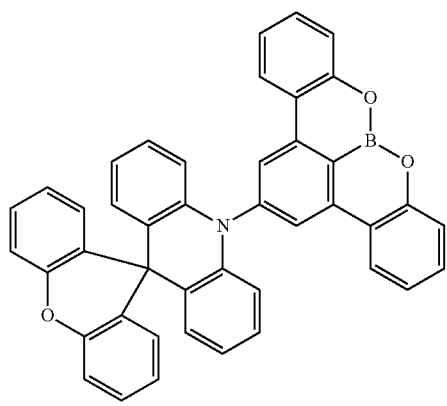
45
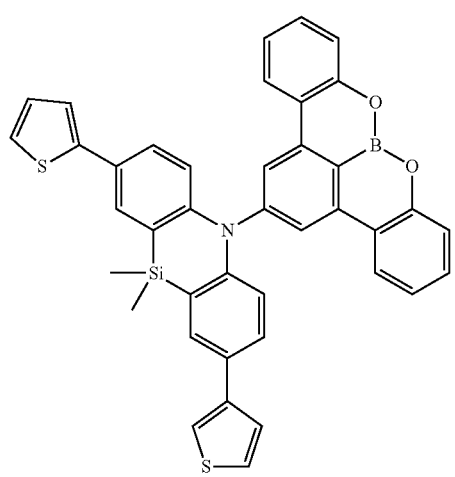
46
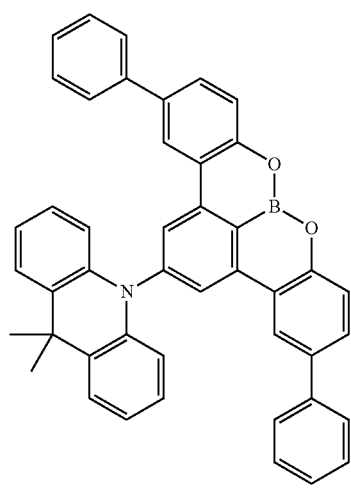
47
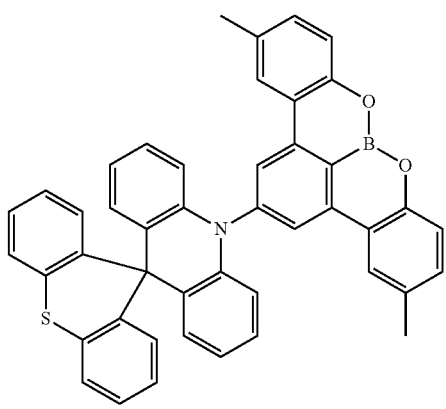
48
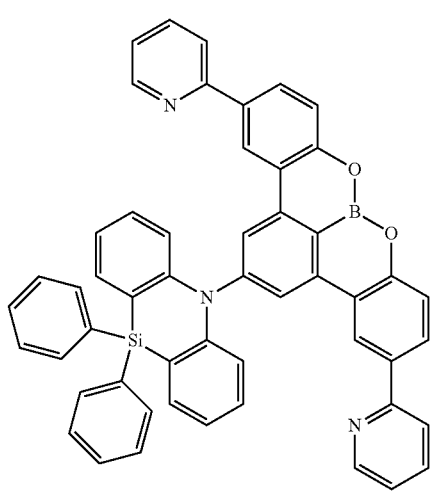
49
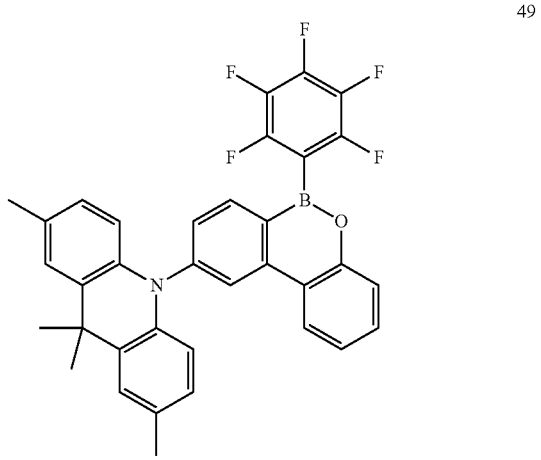

50
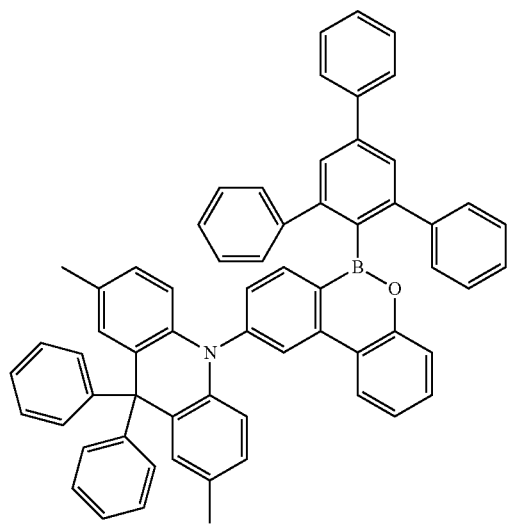
51
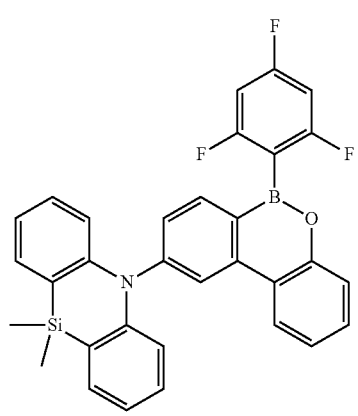
52
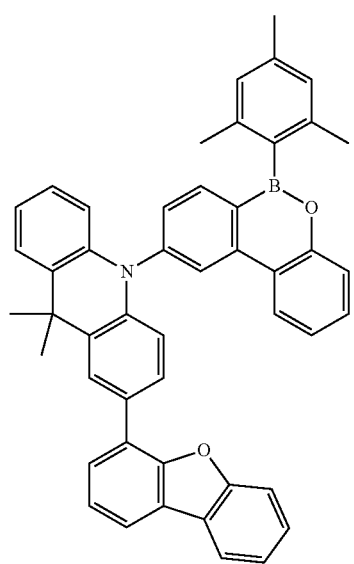
53
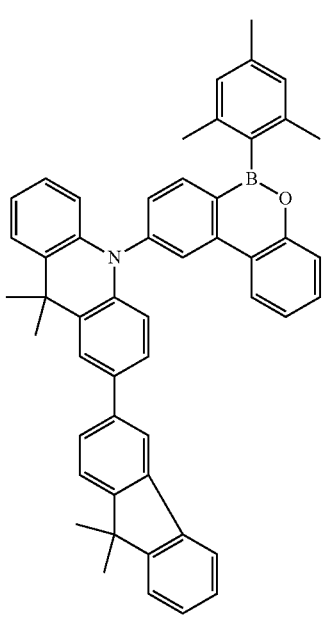
54
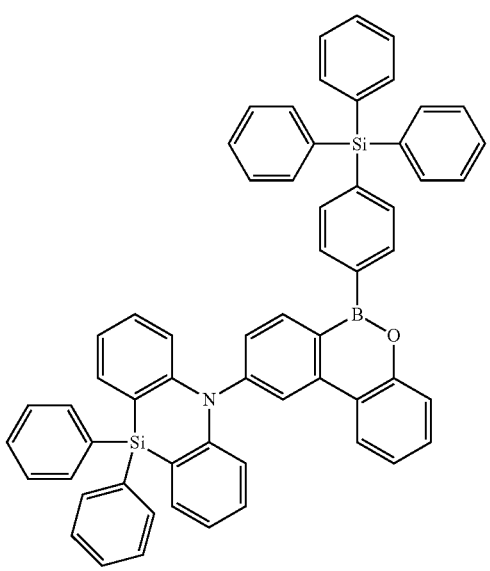
55
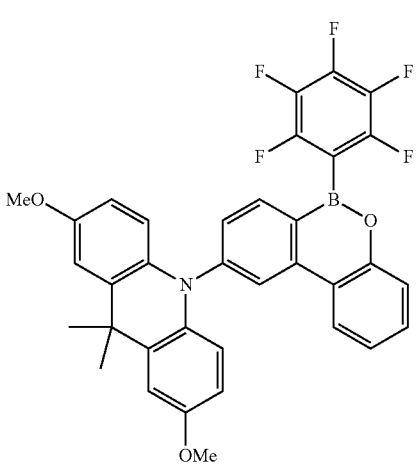

56
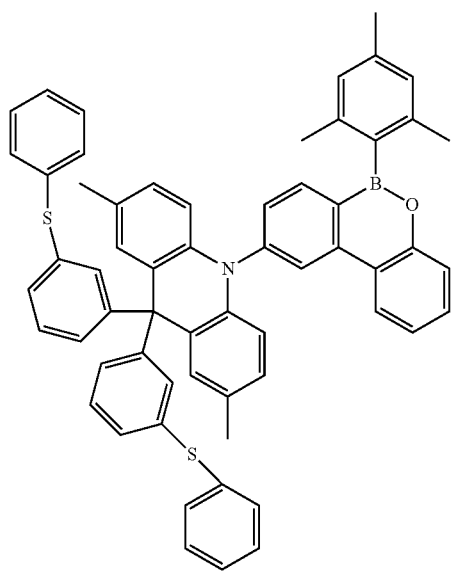
57
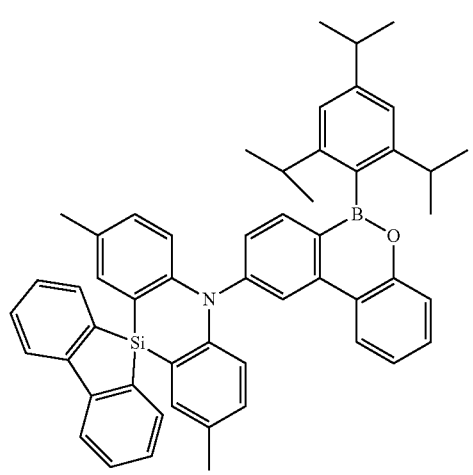
58
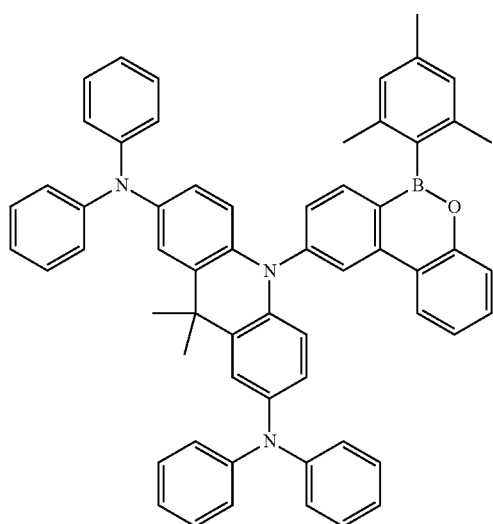
60
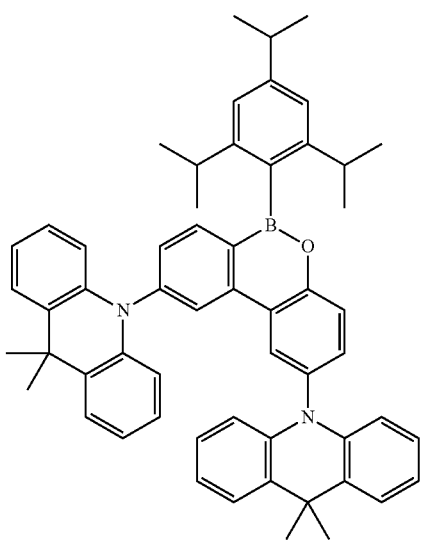
61
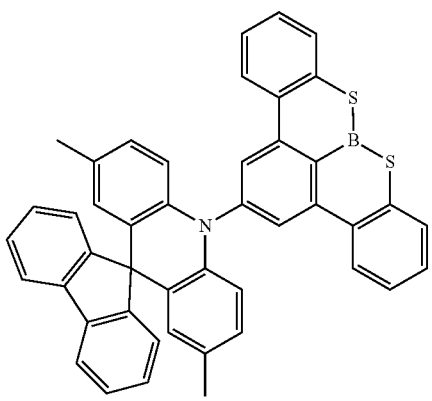
62
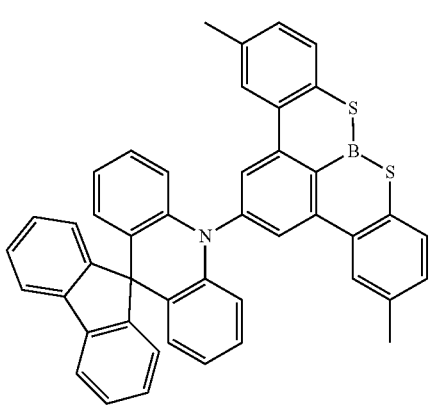

63
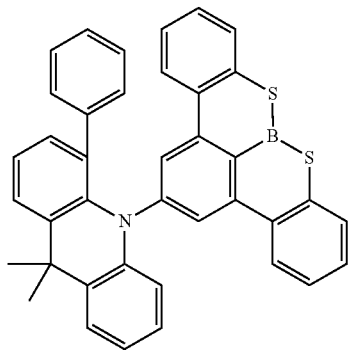
64
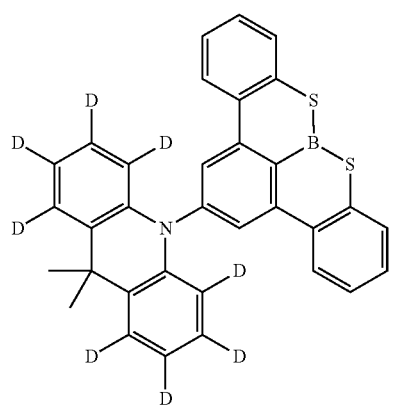
65
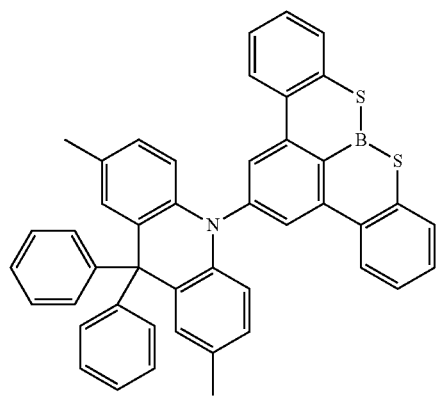
66
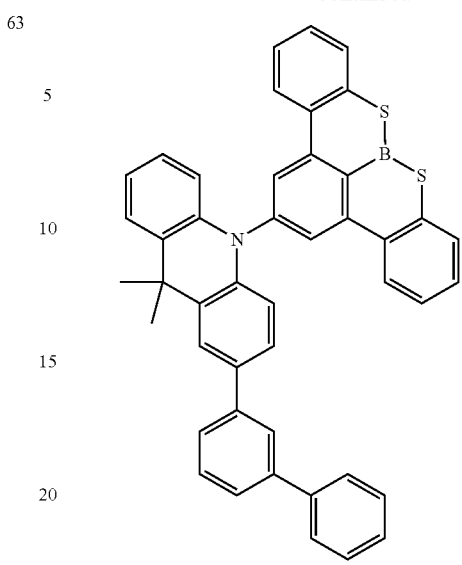
67
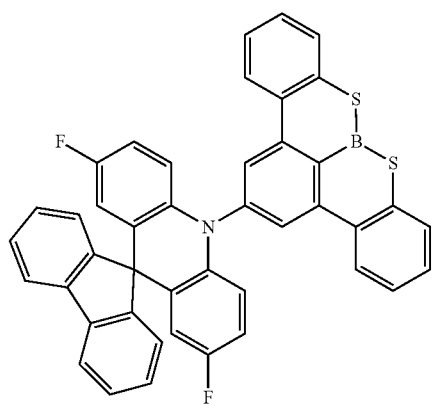
68
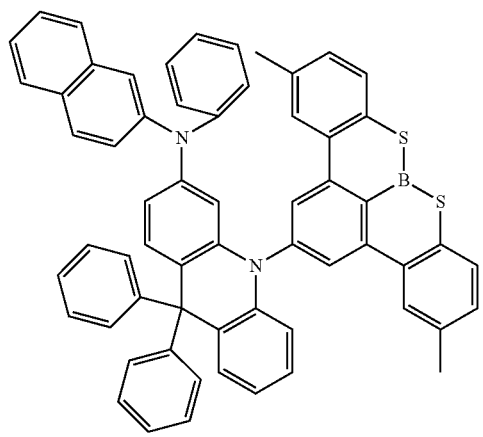

83
-continued
69
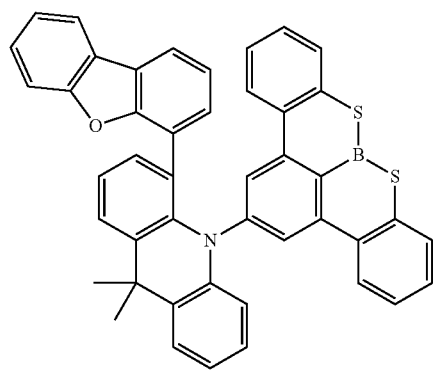
70
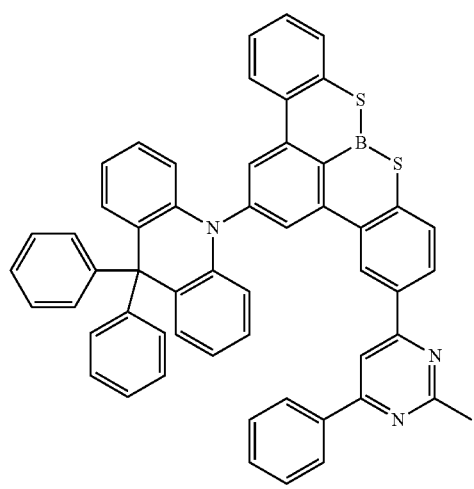
71
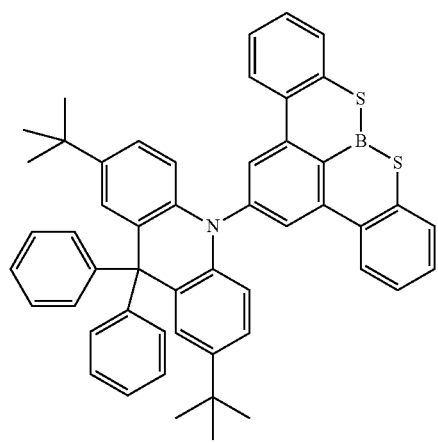
84
-continued
72
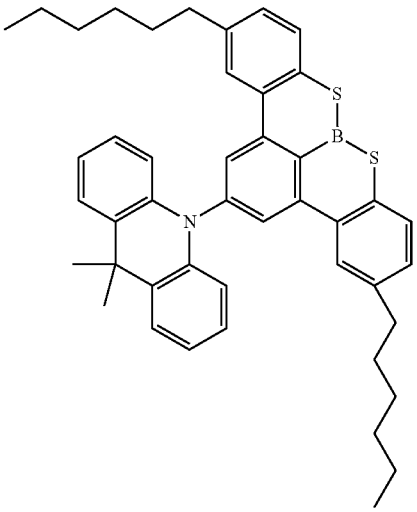
73
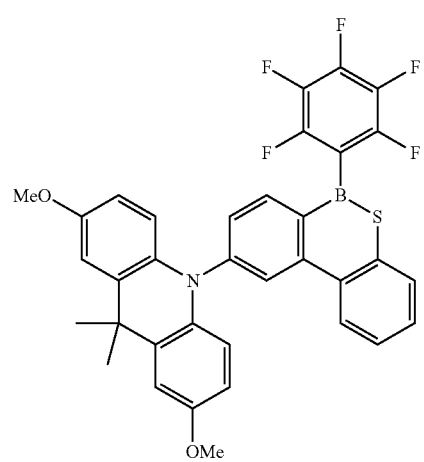
74
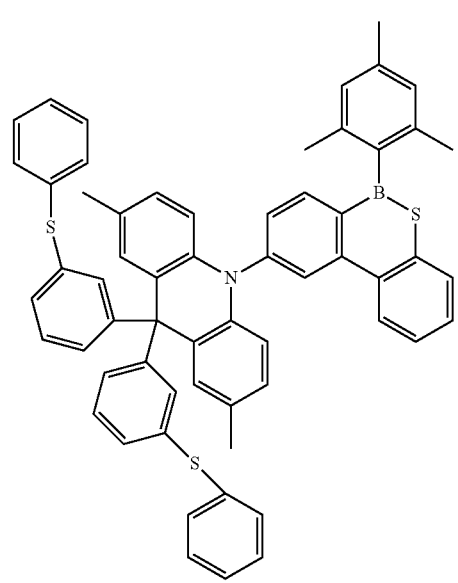

85
-continued
75
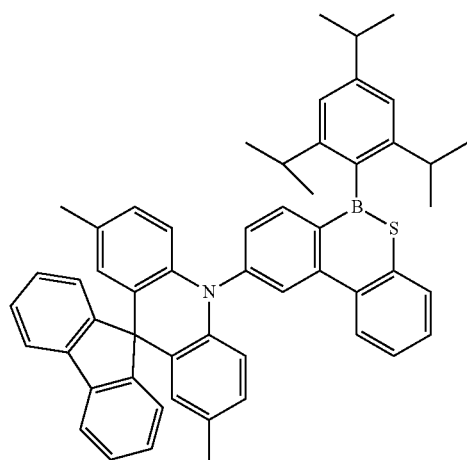
76
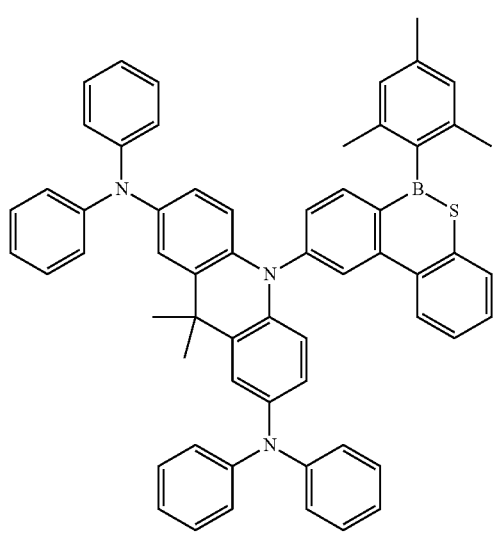
78
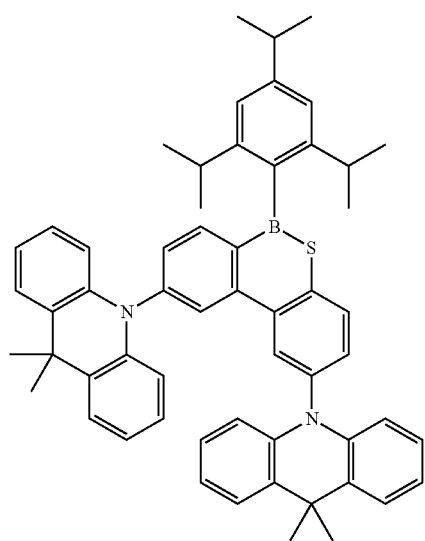
86
-continued
79
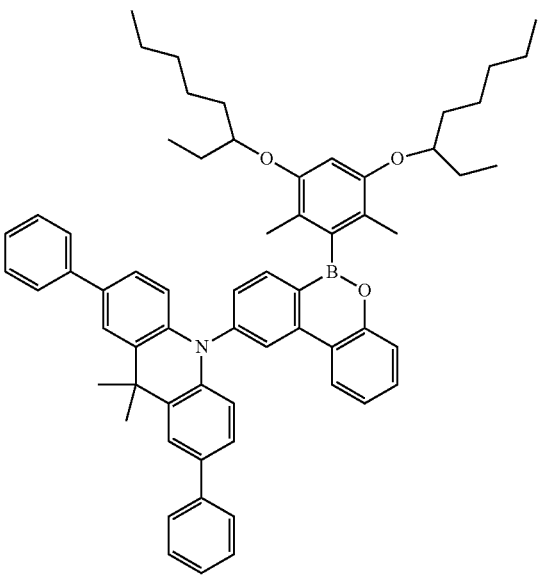
80
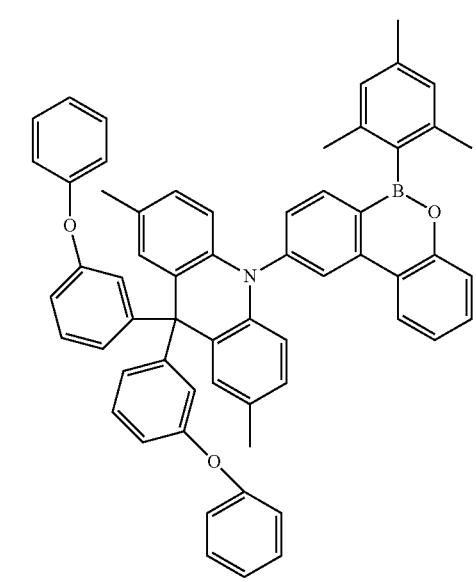
81
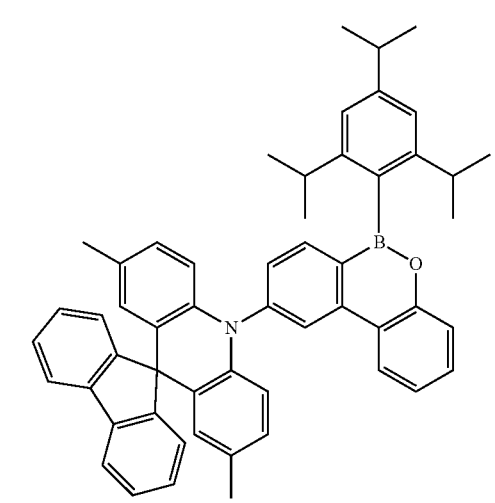

82

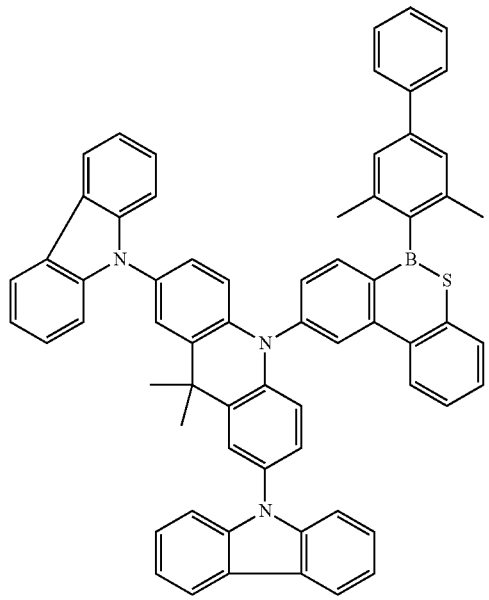

84

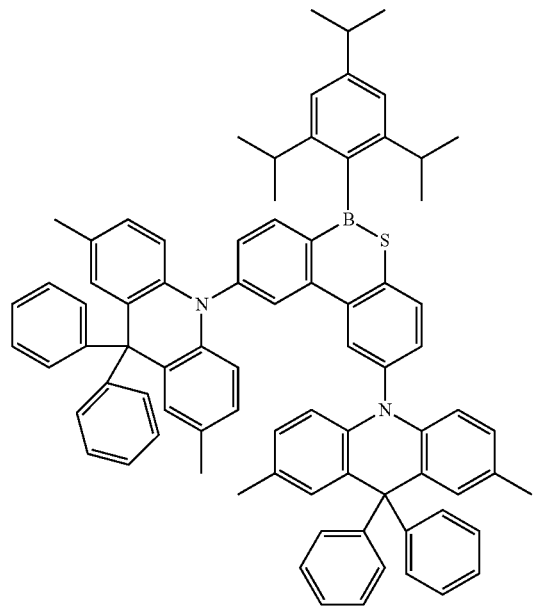

13. An organic electroluminescence device comprising:
  a first electrode;
  a second electrode on the first electrode; and
  a plurality of organic layers between the first electrode and the second electrode, and comprising an emission layer,
  wherein at least one organic layer of the plurality of organic layers comprises a polycyclic compound represented by Formula A:

DU-AU            Formula A wherein in Formula A,

DU is represented by Formula 1, and AU is represented by Formula 2-1 or Formula 2-2:

Formula 1

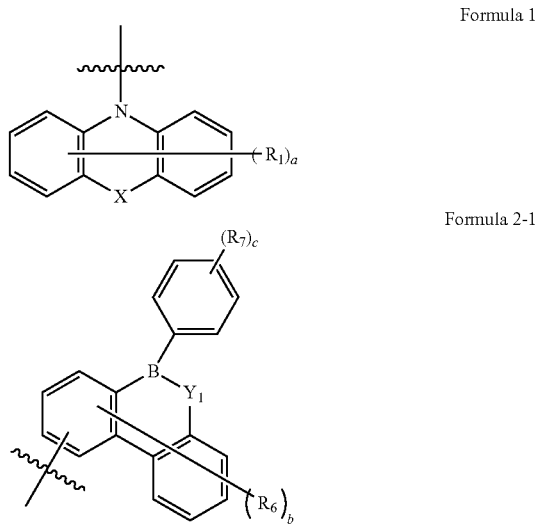

83

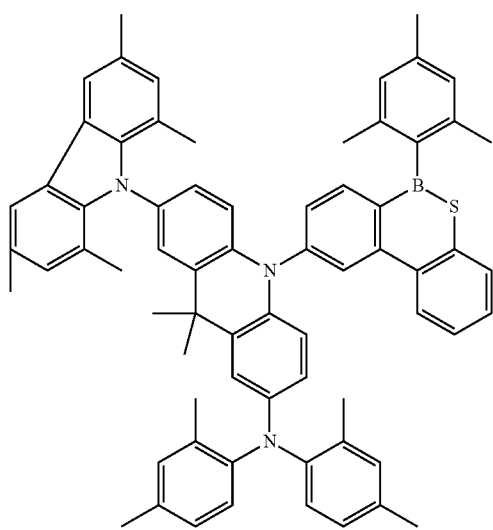

Formula 2-1

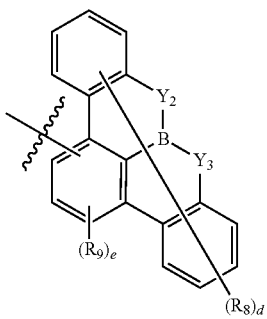

Formula 2-2

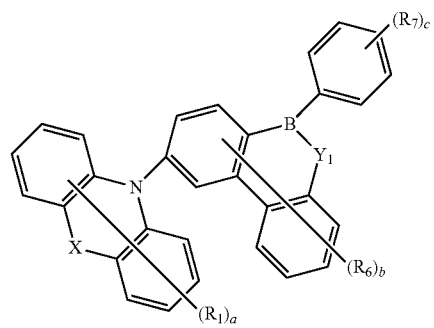

Formula 3-1 wherein in Formula 1,

R$_1$ is a hydrogen atom, a deuterium atom, a halogen atom, a substituted or unsubstituted silyl group, a substituted or unsubstituted amine group, a substituted or unsubstituted alkoxy group having 1 to 10 carbon atoms, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, a is an integer of 0 to 8, X is CR$_2$R$_3$ or SiR$_4$R$_5$, R$_2$ to R$_5$ are each independently a hydrogen atom, a deuterium atom, a halogen atom, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, or are bonded to one or more adjacent groups to form a ring, wherein in Formula 2-1 and in Formula 2-2, Y$_1$ to Y$_3$ are each independently O or S, R$_6$ to R$_9$ are each independently a hydrogen atom, a deuterium atom, a halogen atom, a substituted or unsubstituted alkoxy group having 1 to 10 carbon atoms, a substituted or unsubstituted sulfide group having 1 to 10 carbon atoms, a substituted or unsubstituted amine group, a substituted or unsubstituted silyl group, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, b is an integer of 0 to 7, c is an integer of 0 to 5, d is an integer of 0 to 8, and e is an integer of 0 to 2.

14. The organic electroluminescence device of claim 13, wherein the polycyclic compound represented by Formula A is represented by Formula 3-1 or Formula 3-2:

Formula 3-2

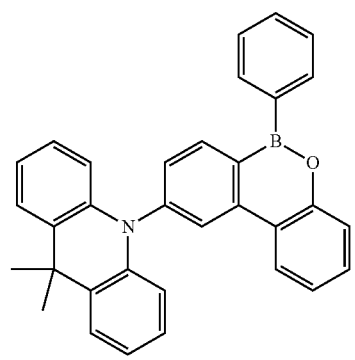

wherein in Formula 3-1 and Formula 3-2,

R$_1$, X, Y$_1$ to Y$_3$, R$_6$ to R$_9$, and a to e are the same as respectively defined in connection with Formula 1, Formula 2-1, and Formula 2-2.

15. The organic electroluminescence device of claim 13, wherein the polycyclic compound comprises at least one of compounds represented in Compound Group 1:

Compound Group 1

1

2
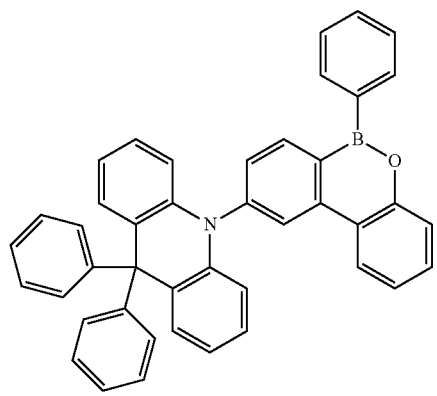
3
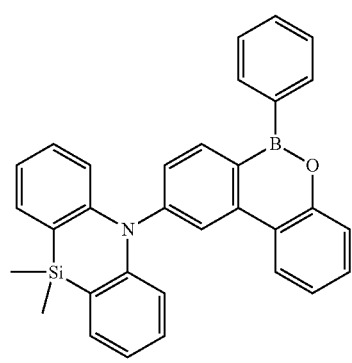
4
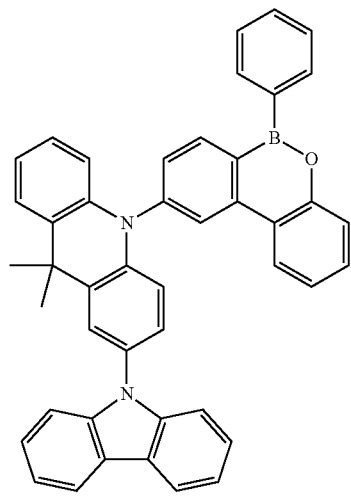
5
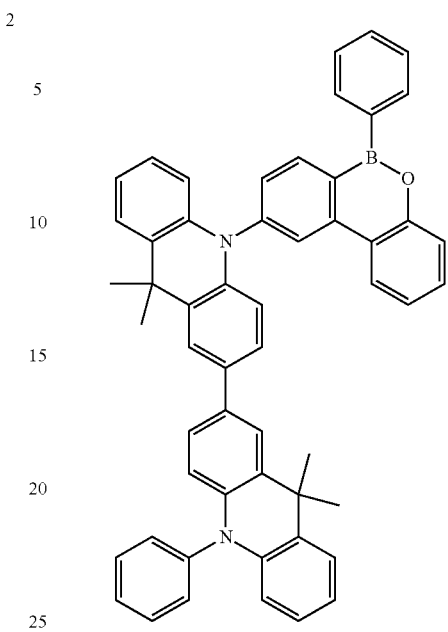
6
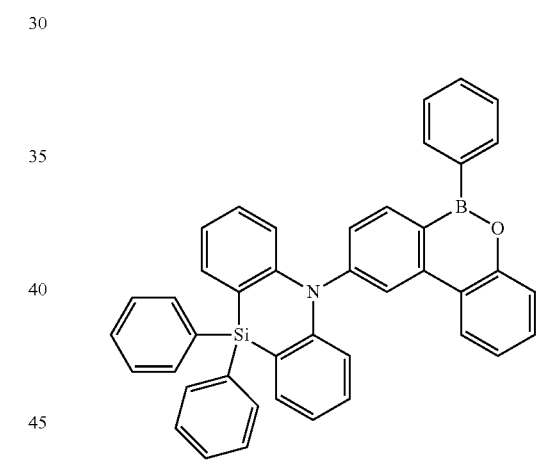
7
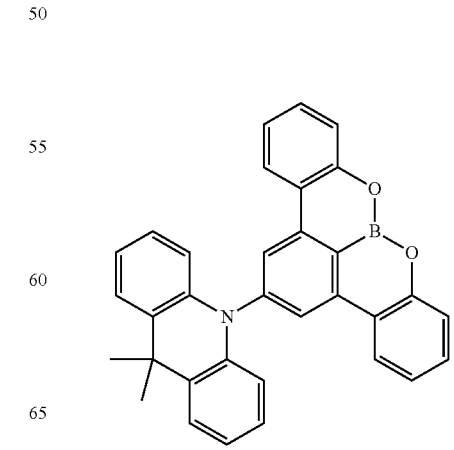

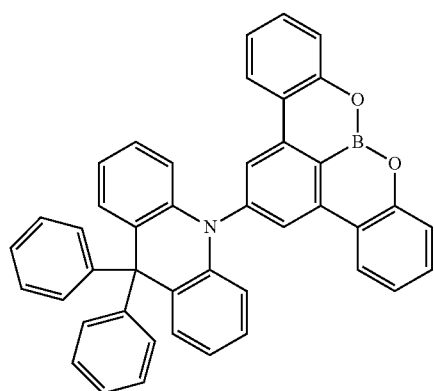
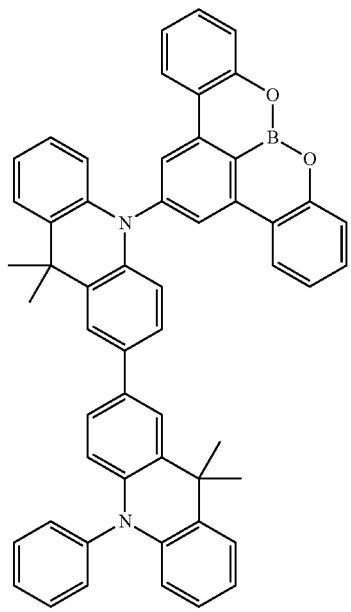
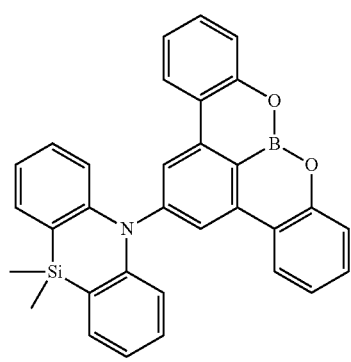
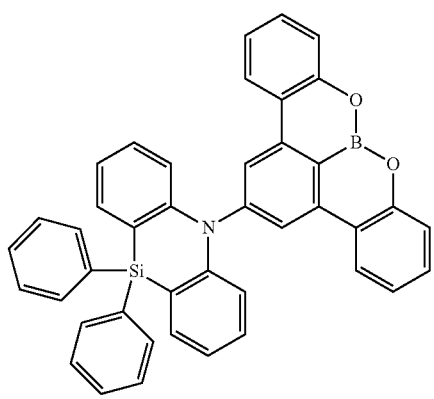
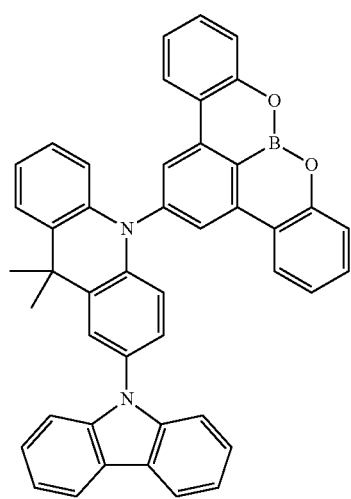
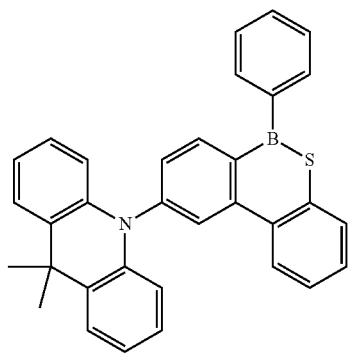

14
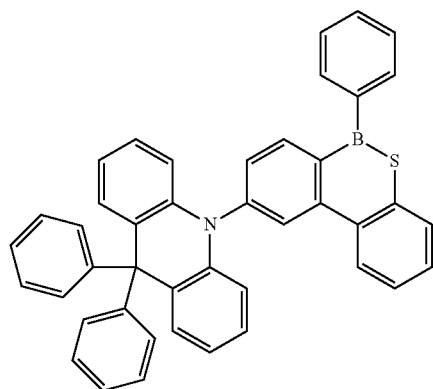
15
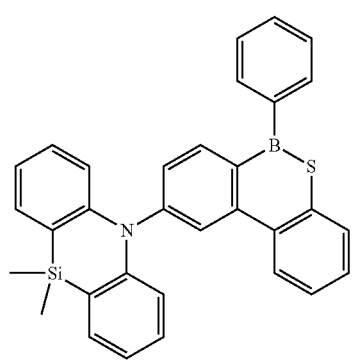
16
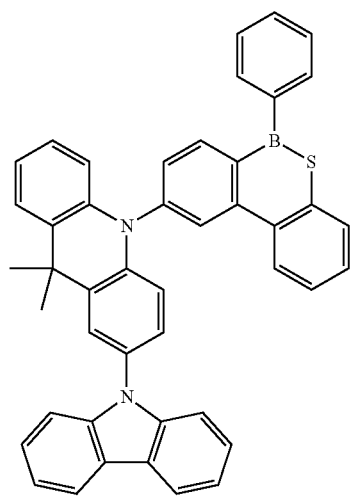
17
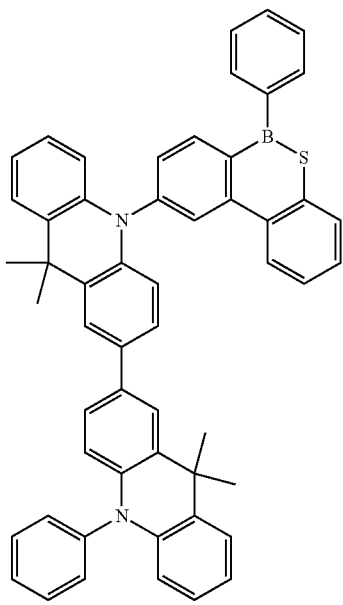
18
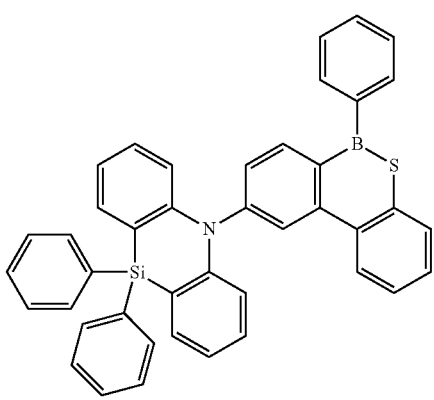
19
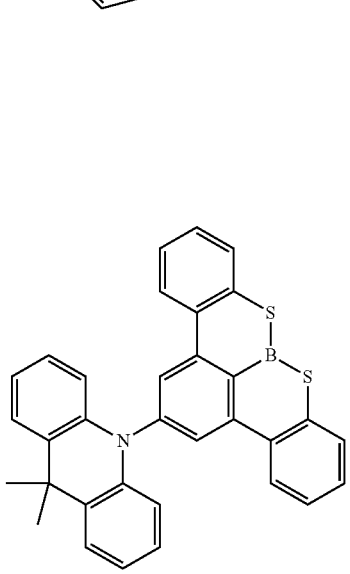

-continued
20
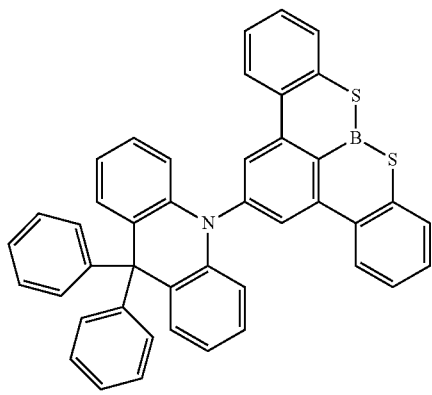
21
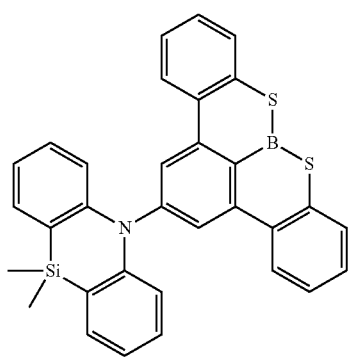
22
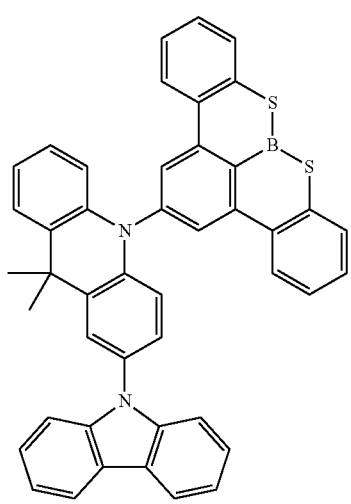
-continued
23
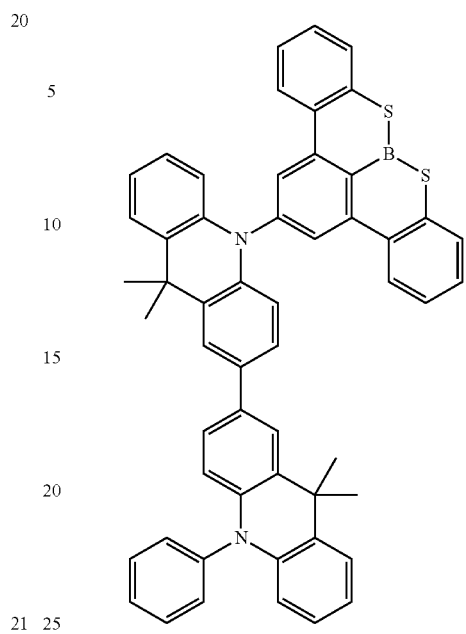
24
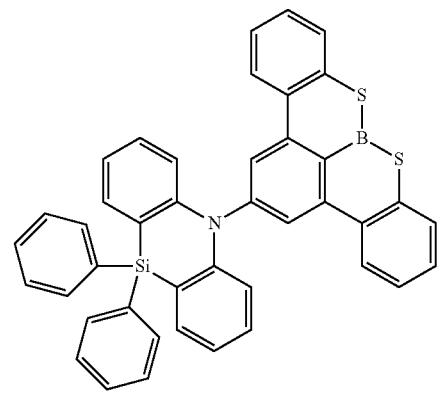
25
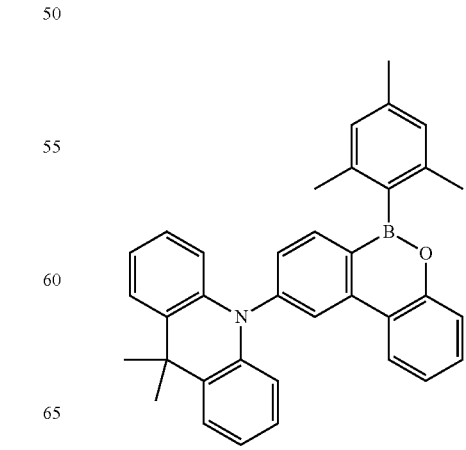

26
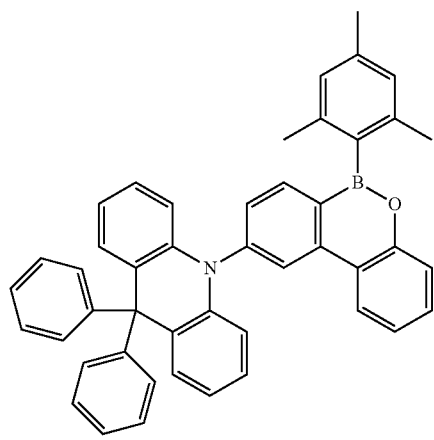
27
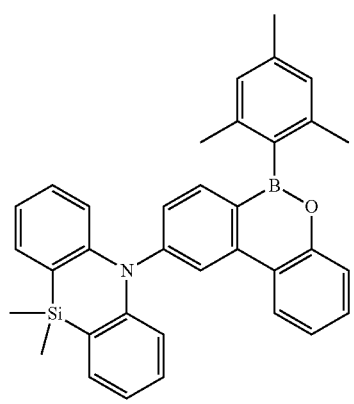
28
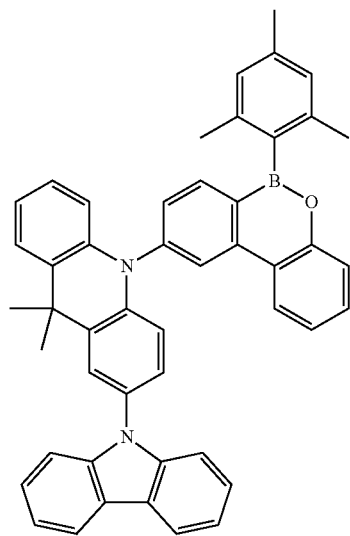
29
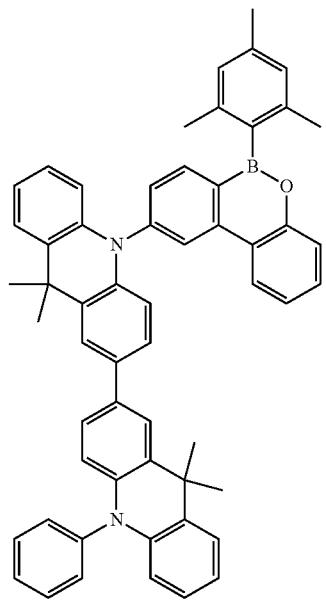
30
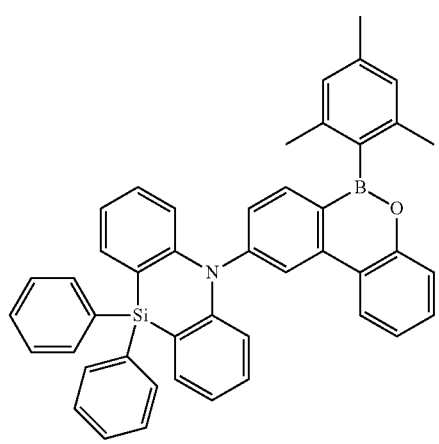
31
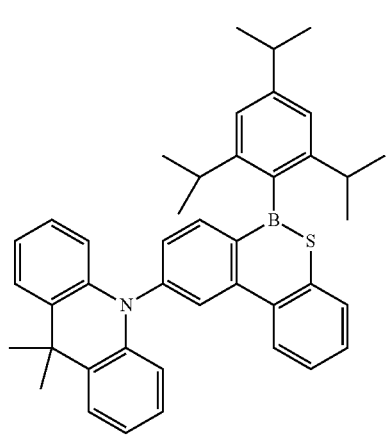

-continued
32
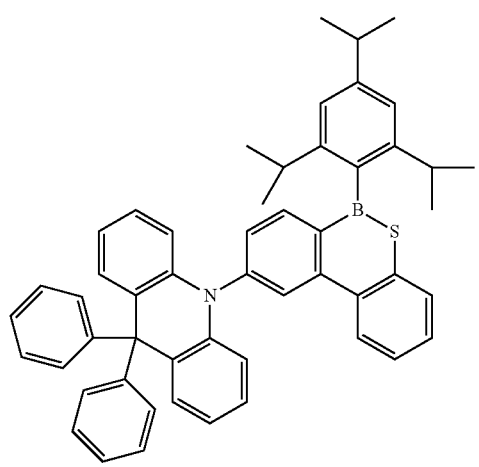
33
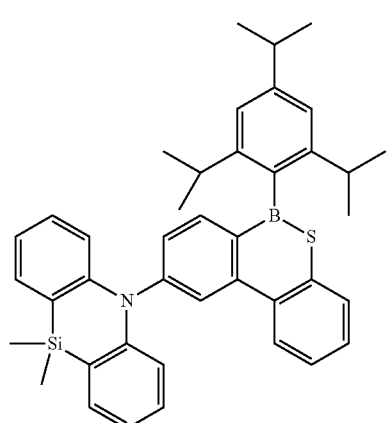
34
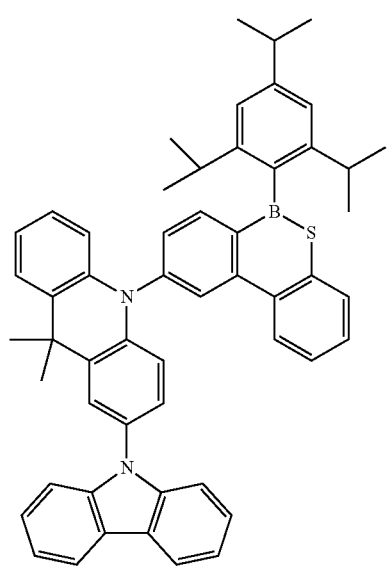
-continued
35
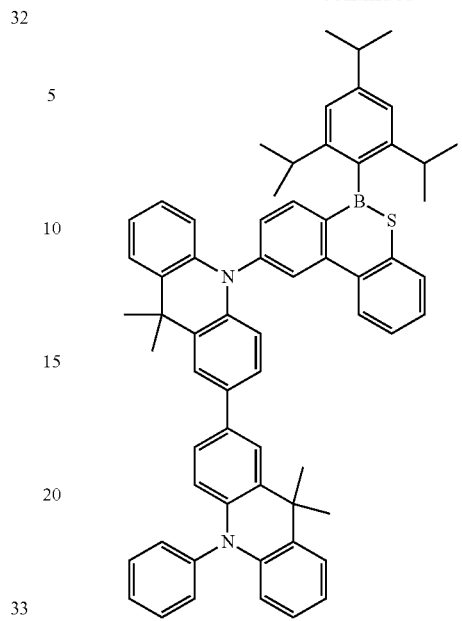
36
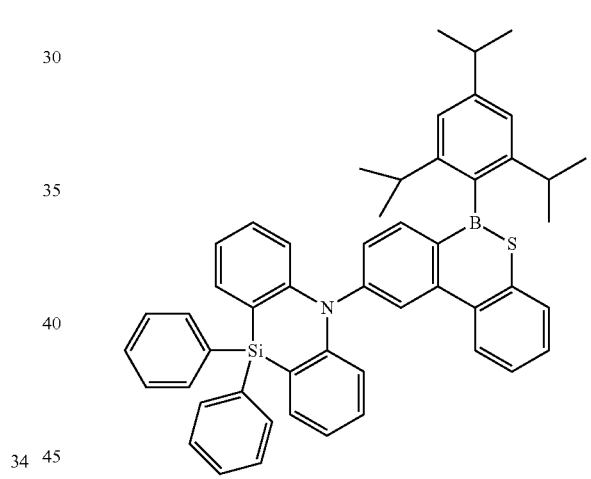
37
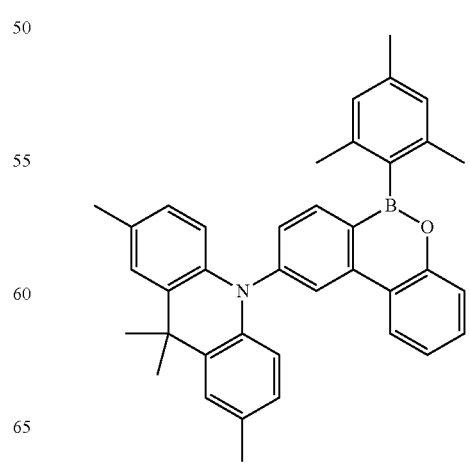

38
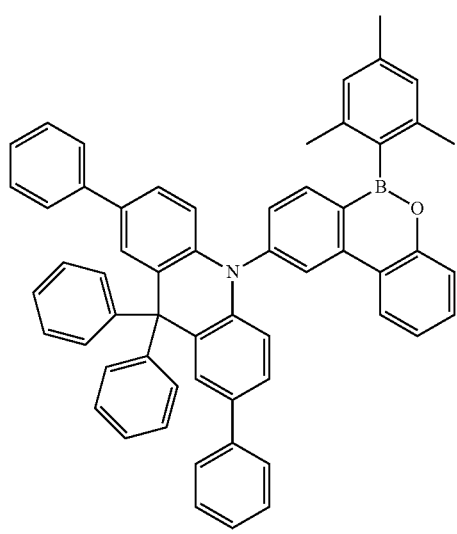
39
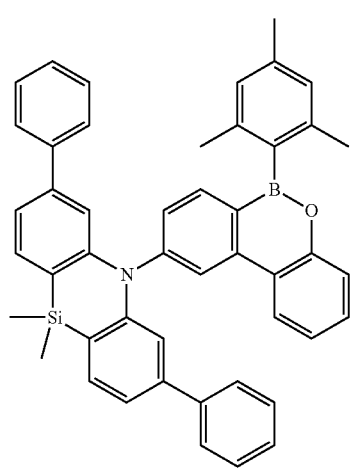
40
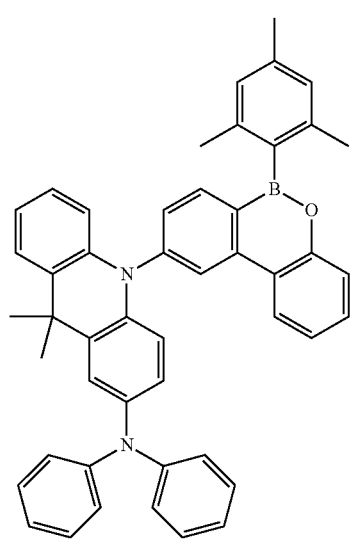
41
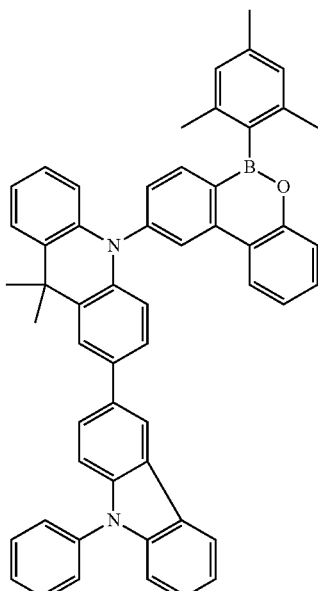
42
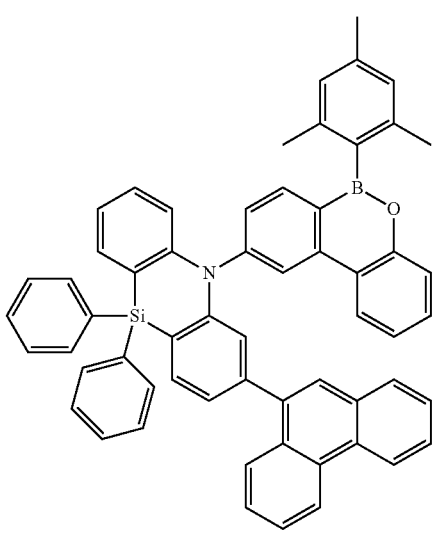
43
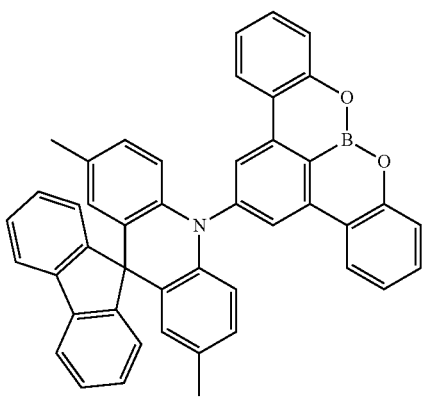

44
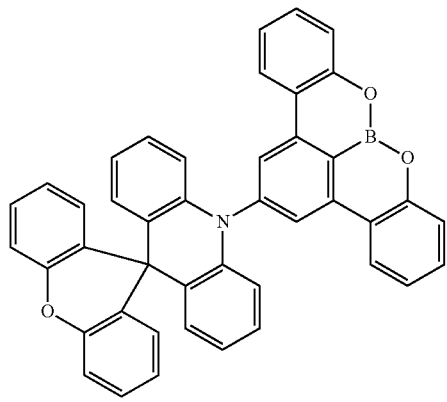
45
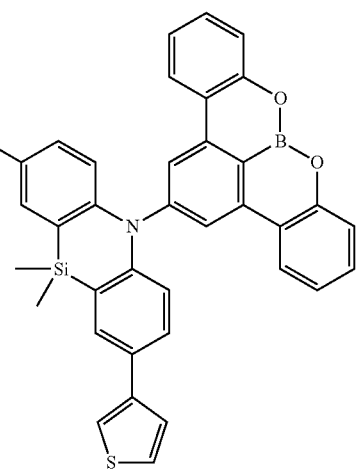
46
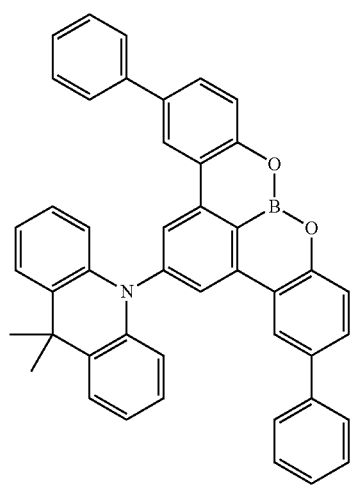
47
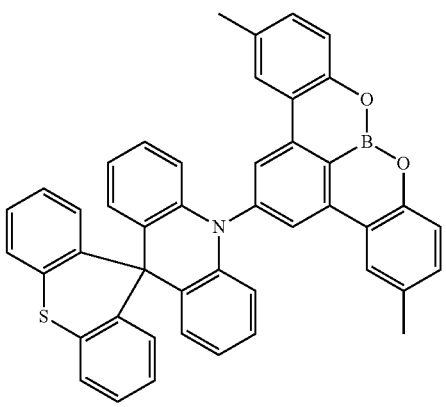
48
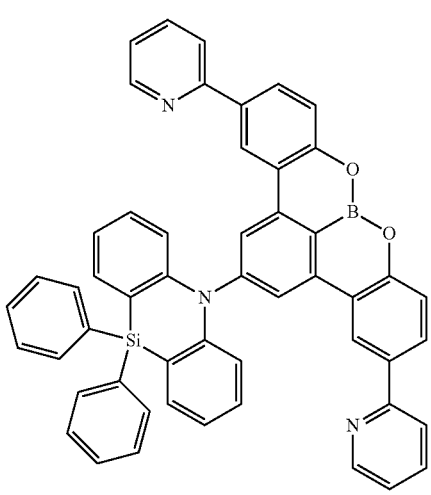
49
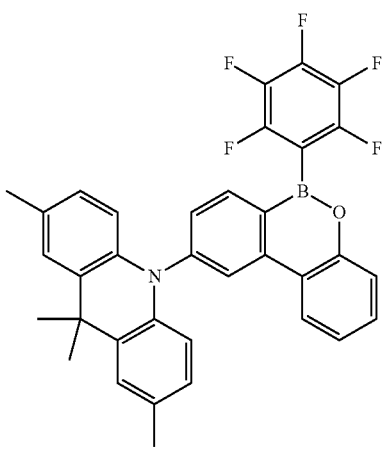

50
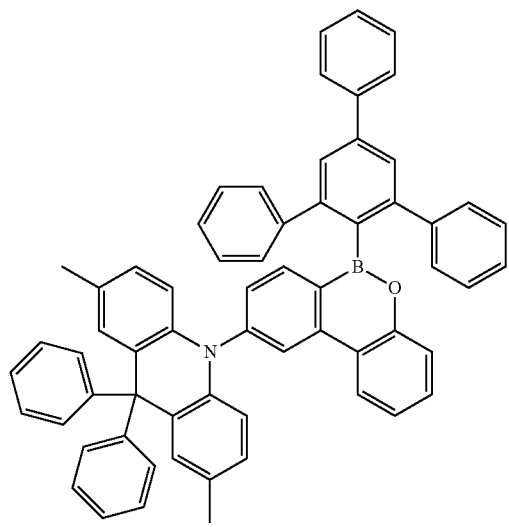
51
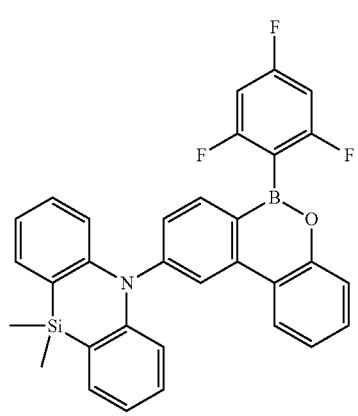
52
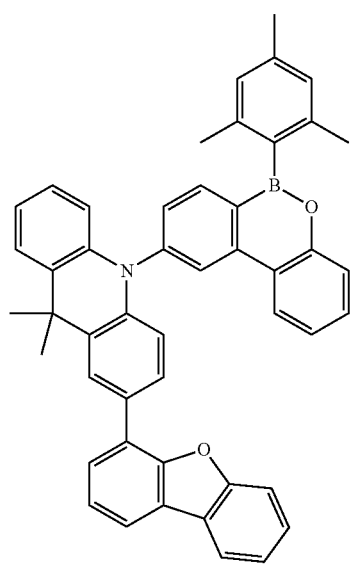
53
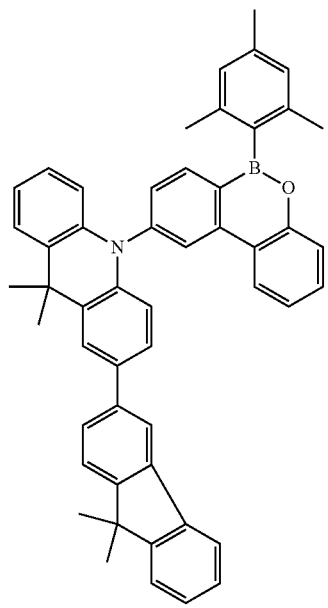
54
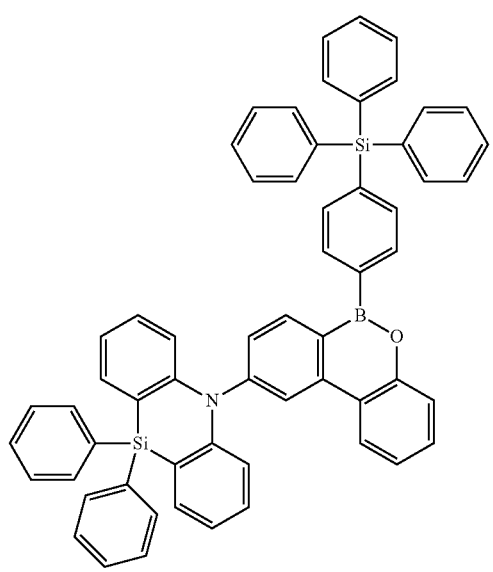
55
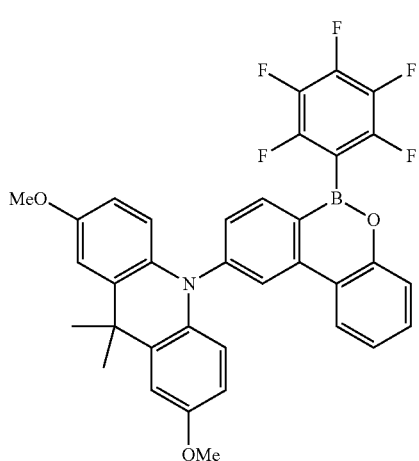

56
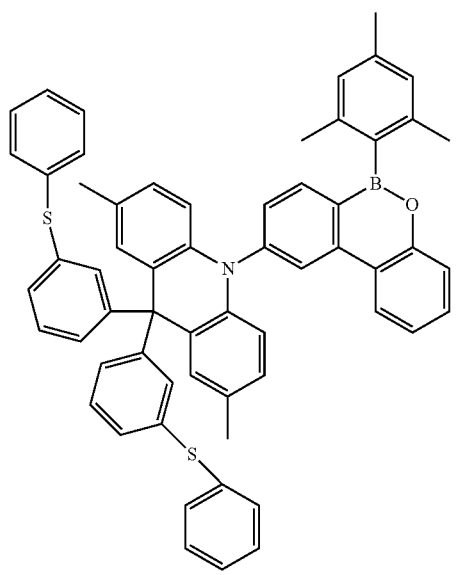
57
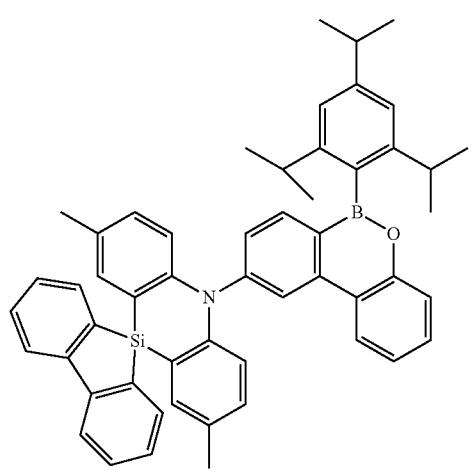
58
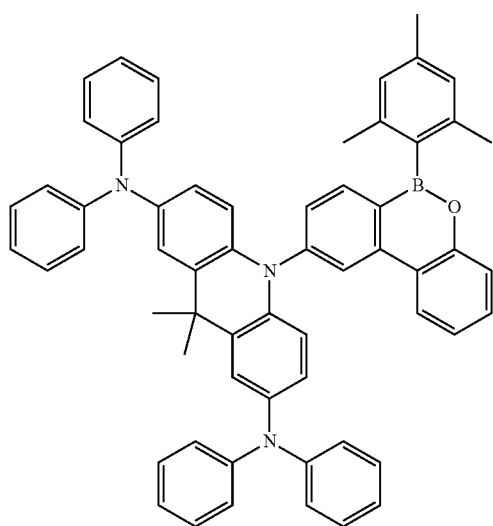
60
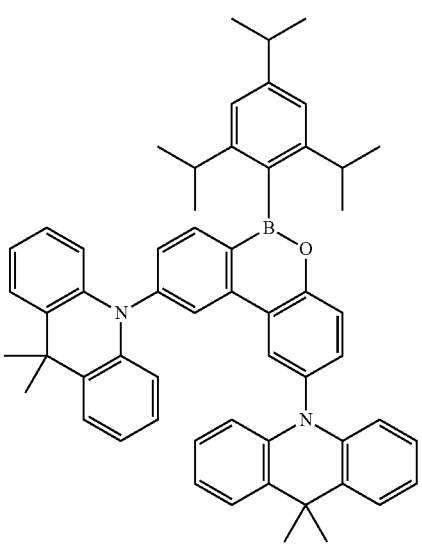
61
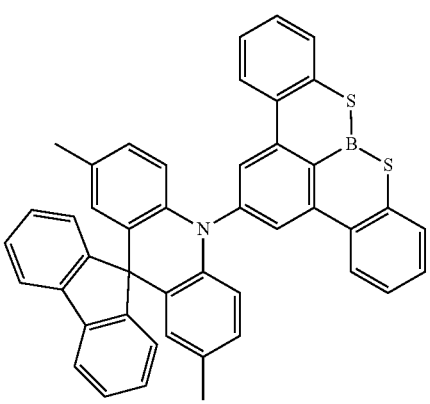
62
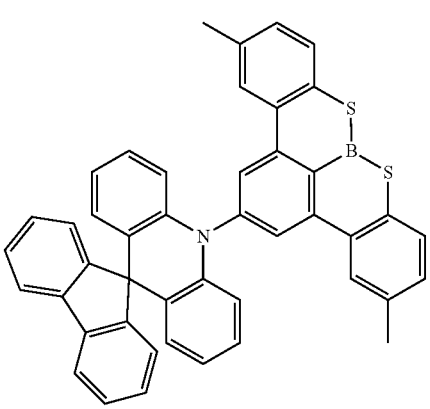

63
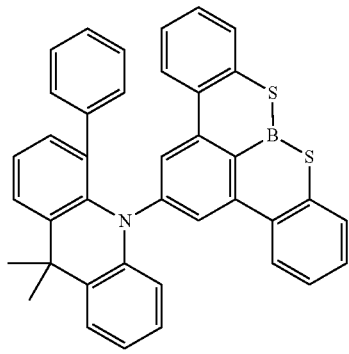
64
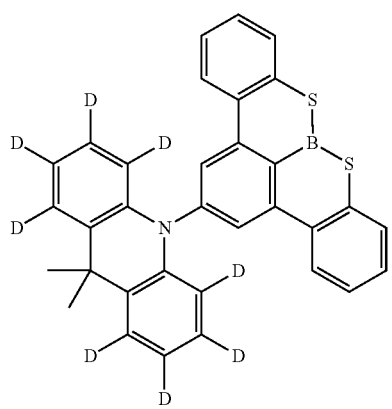
65
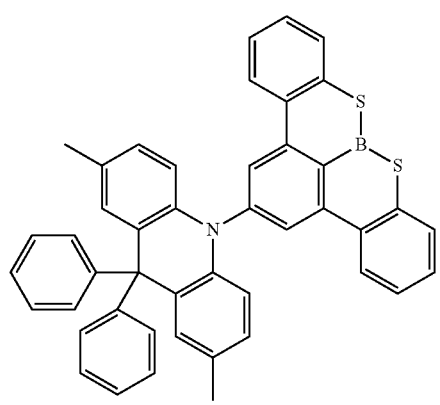
66
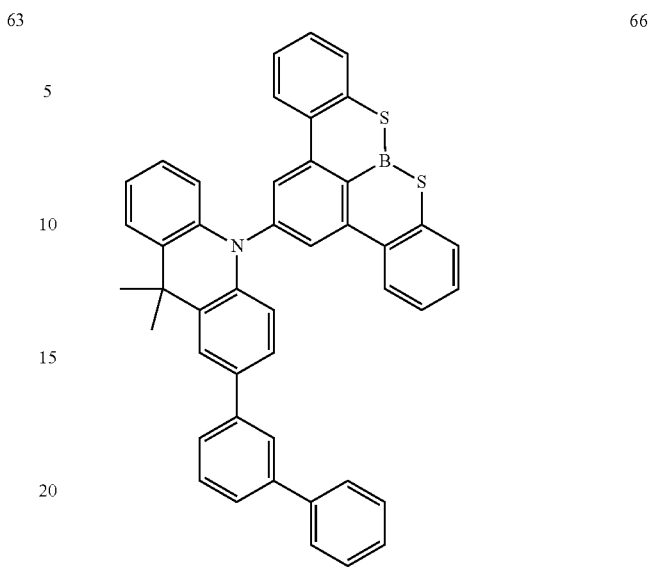
67
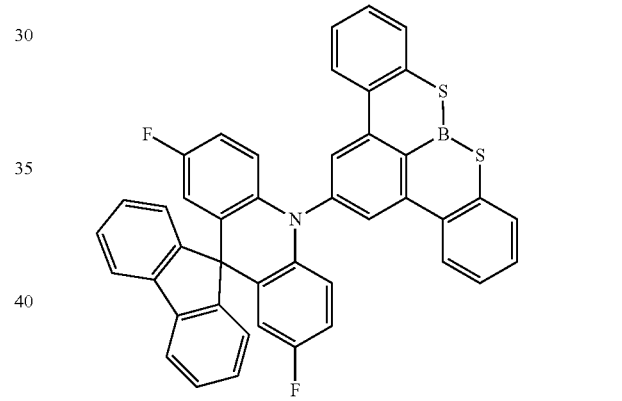
68
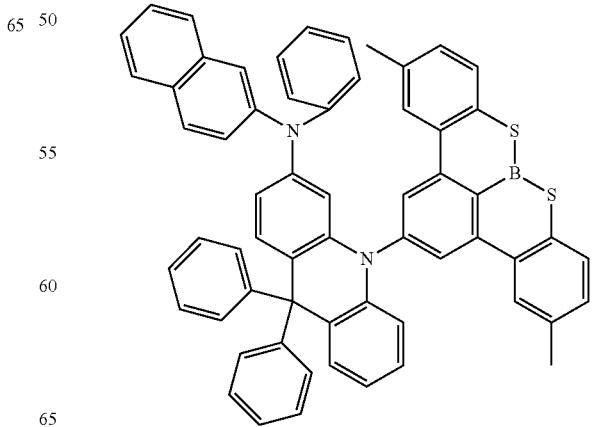

-continued
69
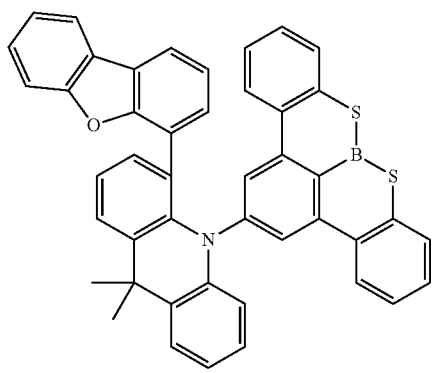
70
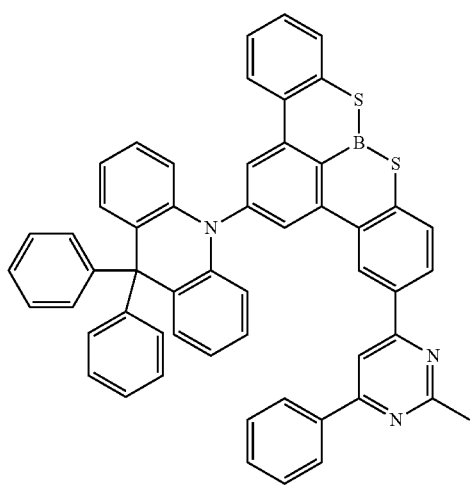
71
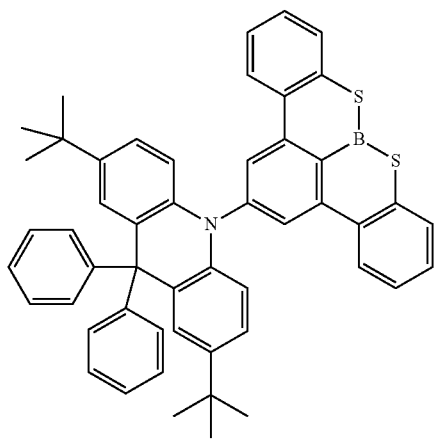
-continued
72
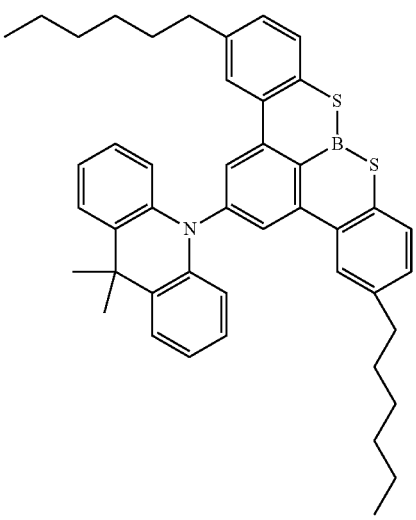
73
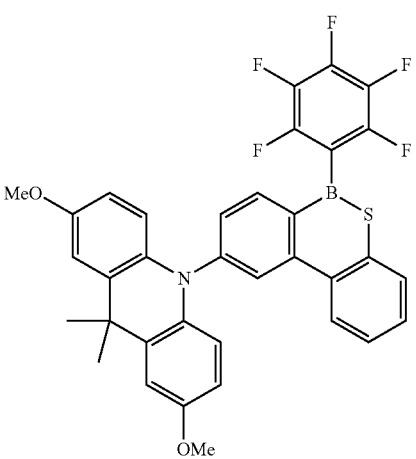
74
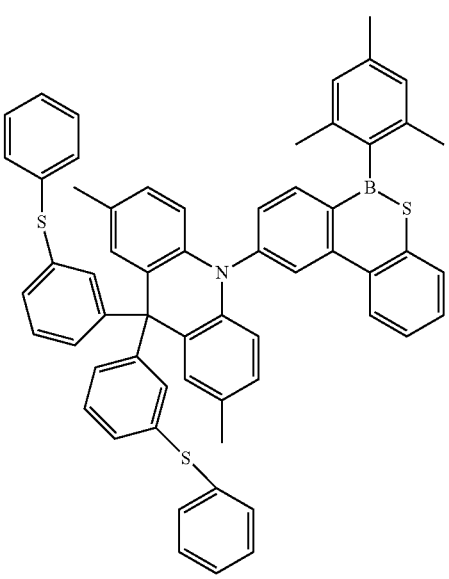

115
75
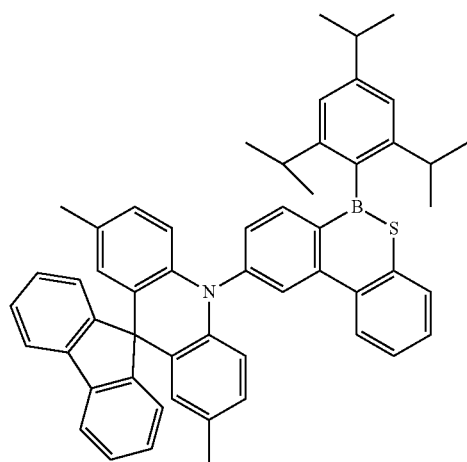
76
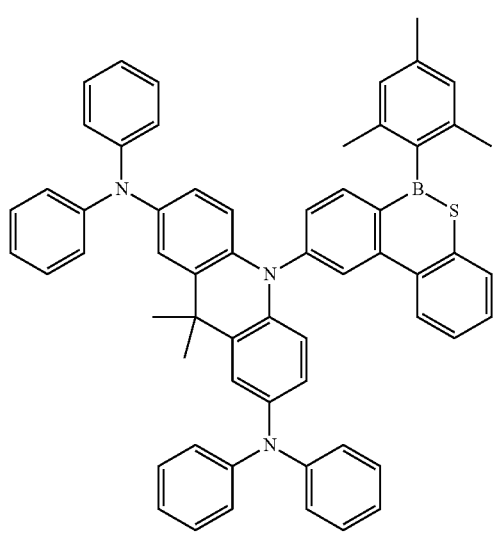
78
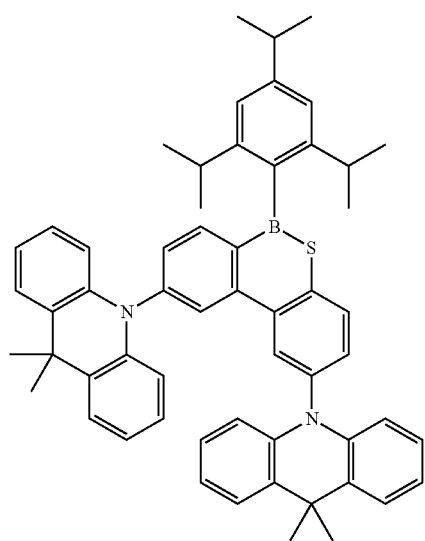
116
79
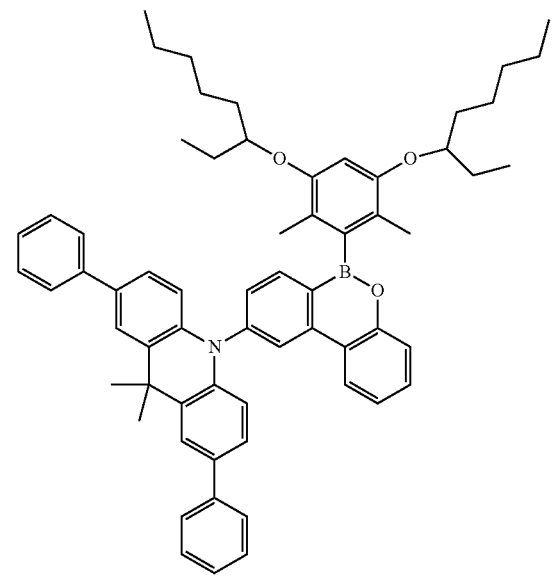
80
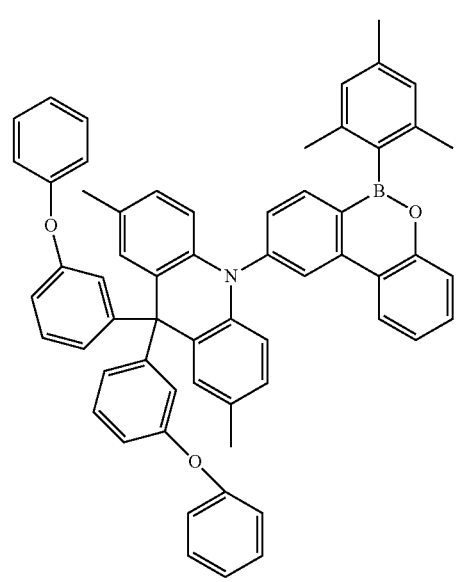
81
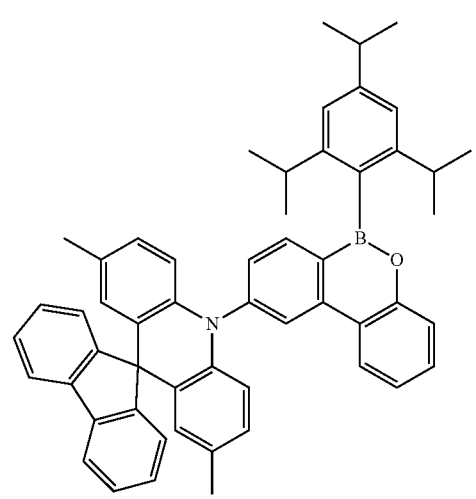

117
-continued
82 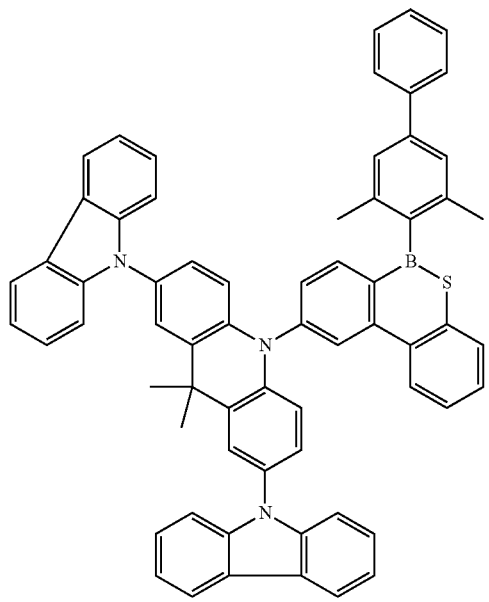
83 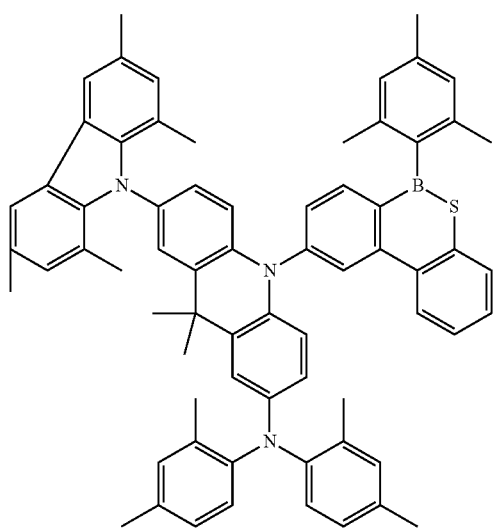
118
-continued
84 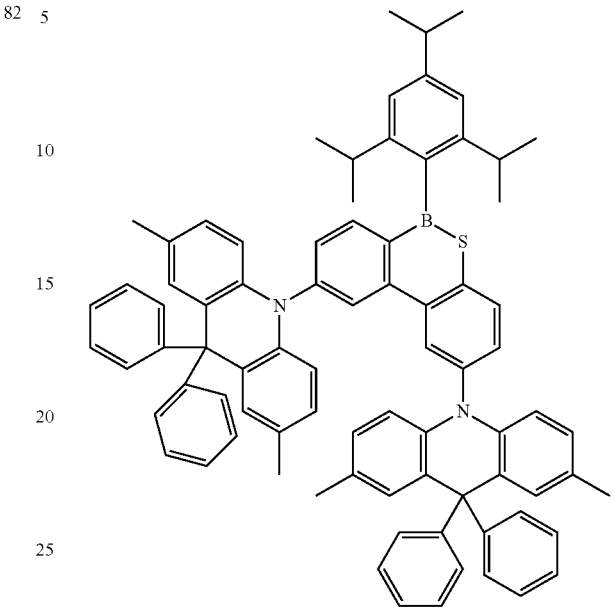
16. A polycyclic compound represented by Formula A:
DU-AU        Formula A
wherein in Formula A,
DU is represented by Formula 1, and AU is represented by Formula 2-1 or Formula 2-2:
Formula 1
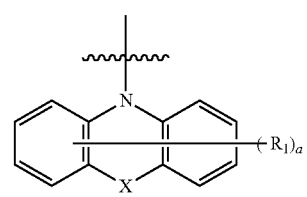
Formula 2-1
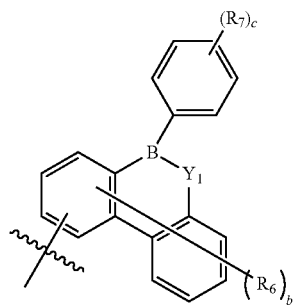

Formula 2-2

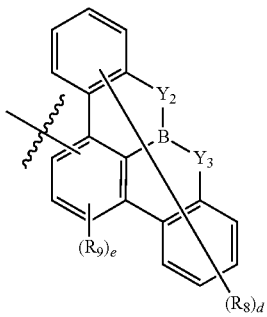

Formula 3-1

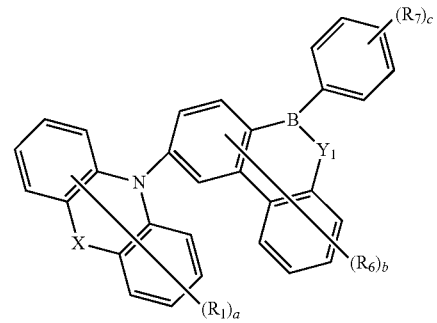

Formula 3-2

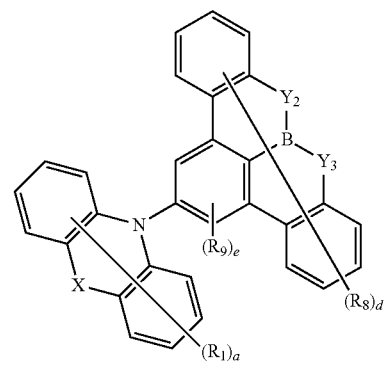

wherein in Formula 1,

R₁ is a hydrogen atom, a deuterium atom, a halogen atom, a substituted or unsubstituted silyl group, a substituted or unsubstituted amine group, a substituted or unsubstituted alkoxy group having 1 to 10 carbon atoms, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, a is an integer of 0 to 8, X is $CR_2R_3$ or $SiR_4R_5$, $R_2$ to $R_5$ are each independently a hydrogen atom, a deuterium atom, a halogen atom, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, or are bonded to adjacent groups to form a ring, wherein in Formula 2-1 and in Formula 2-2, $Y_1$ to $Y_3$ are each independently O or S, $R_6$ to $R_9$ are each independently a hydrogen atom, a deuterium atom, a halogen atom, a substituted or unsubstituted alkoxy group having 1 to 10 carbon atoms, a substituted or unsubstituted sulfide group having 1 to 10 carbon atoms, a substituted or unsubstituted amine group, a substituted or unsubstituted silyl group, a substituted or unsubstituted alkyl group having 1 to 20 carbon atoms, a substituted or unsubstituted aryl group having 6 to 20 ring-forming carbon atoms, or a substituted or unsubstituted heteroaryl group having 3 to 20 ring-forming carbon atoms, b is an integer of 0 to 7, c is an integer of 0 to 5, d is an integer of 0 to 8, and e is an integer of 0 to 2.

17. The polycyclic compound of claim 16, wherein the polycyclic compound represented by Formula A is represented by Formula 3-1 or Formula 3-2:

wherein in Formula 3-1 and Formula 3-2, $R_1$, X, $Y_1$ to $Y_3$, $R_6$ to $R_9$, and a to e are the same as respectively defined in connection with Formula 1, Formula 2-1, and Formula 2-2.

18. The polycyclic compound of claim 16, wherein DU represented by Formula 1 is represented by Formula 4:

Formula 4

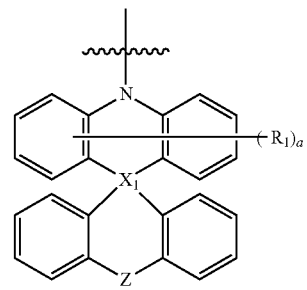

wherein in Formula 4, $X_1$ is C or Si,

Z is a direct bond, O, or S, and

R1 and a are the same as respectively defined in connection with Formula 1.

19. The polycyclic compound of claim 16, wherein AU represented by Formula 2-2 is represented by Formula 5-1 or Formula 5-2:

Formula 5-1
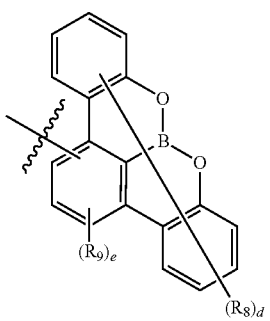
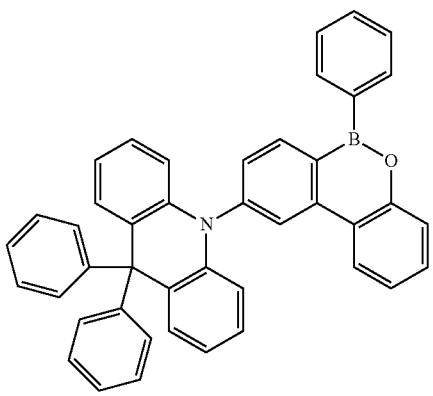
2
Formula 5-2
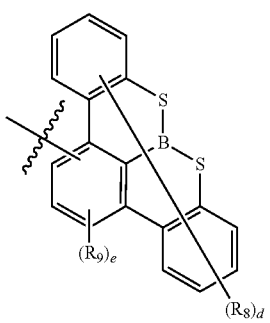
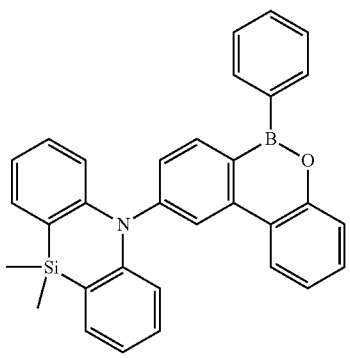
3
wherein in Formula 5-1 and Formula 5-2,
$R_8$, $R_9$, d, and e are the same as respectively defined in connection with Formula 2-2.
20. The polycyclic compound of claim 16, wherein the polycyclic compound is any one of compounds represented in Compound Group 1:
Compound Group 1
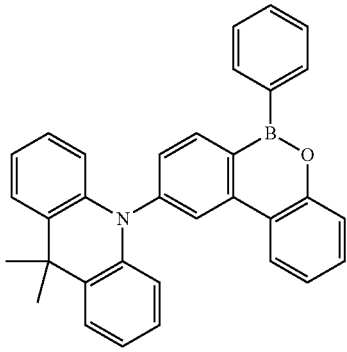
1
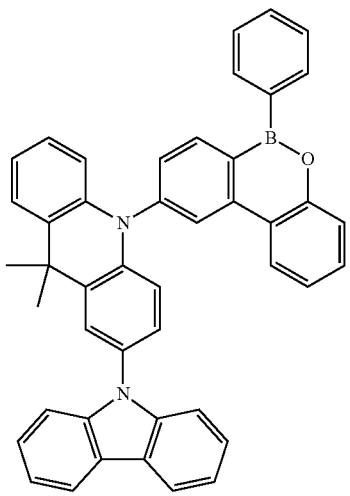
4

123
-continued
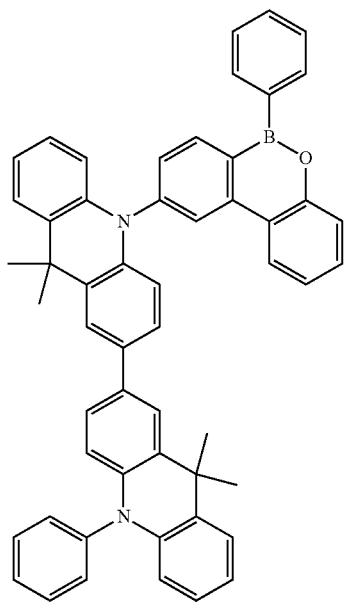
5
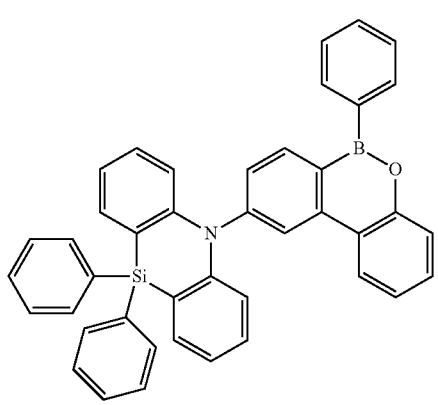
6
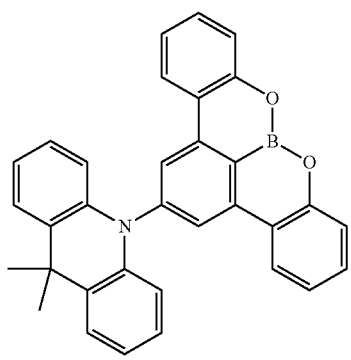
7
124
-continued
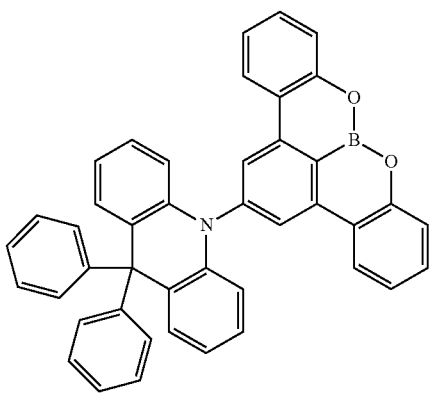
8
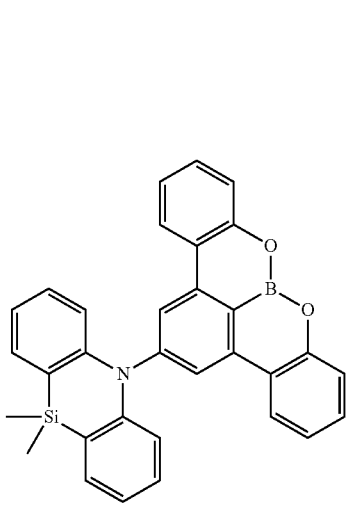
9
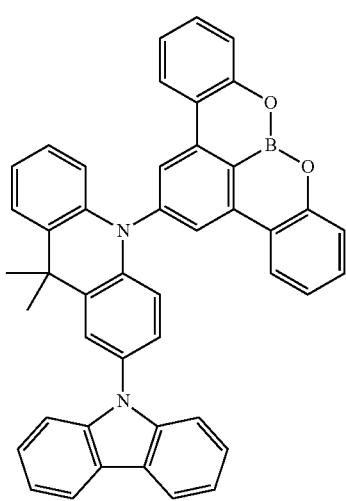
10

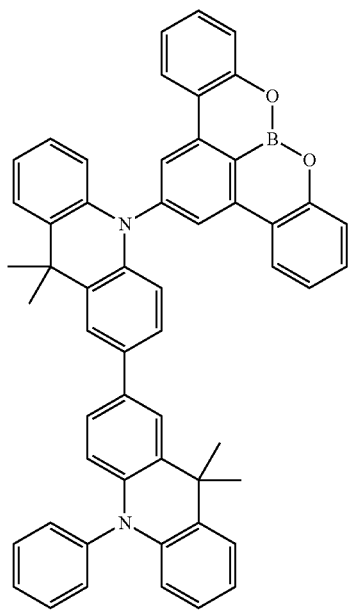
11
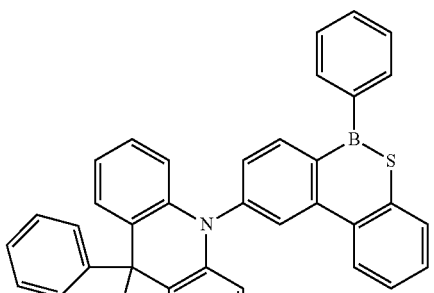
14
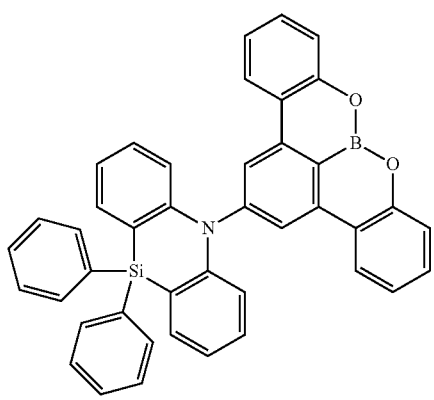
12
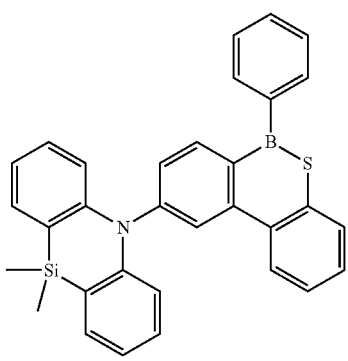
15
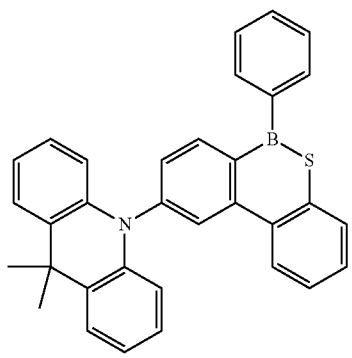
13
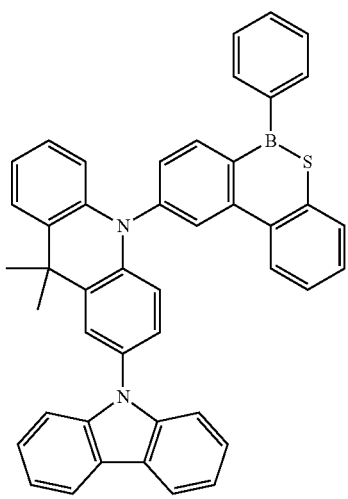
16

17
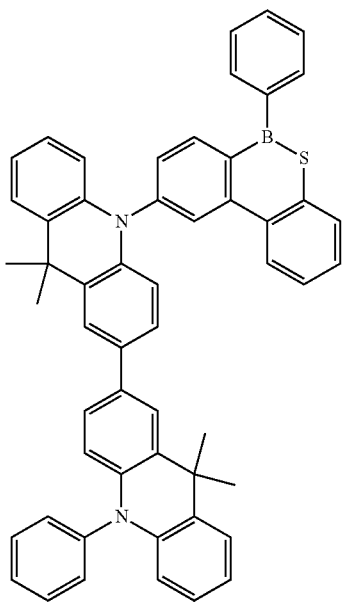
18
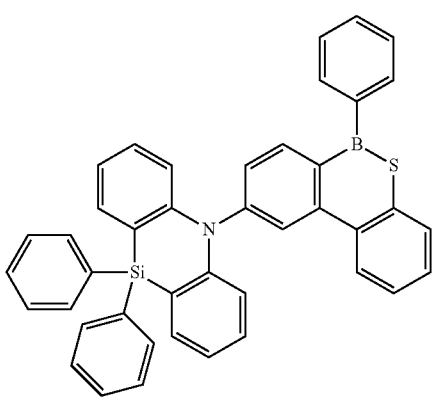
19
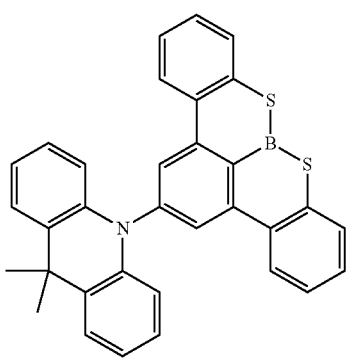
20
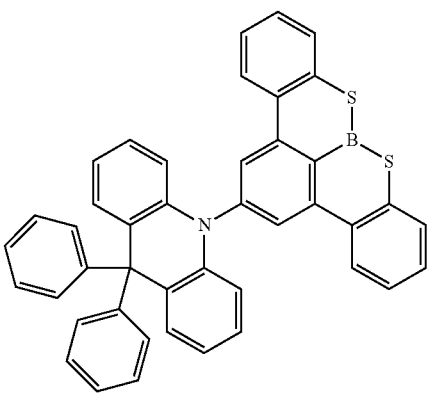
21
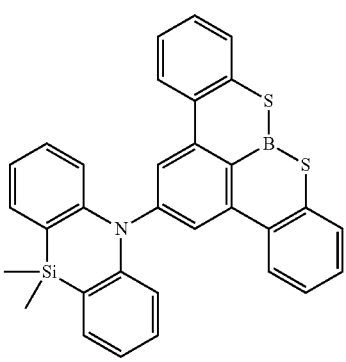
22
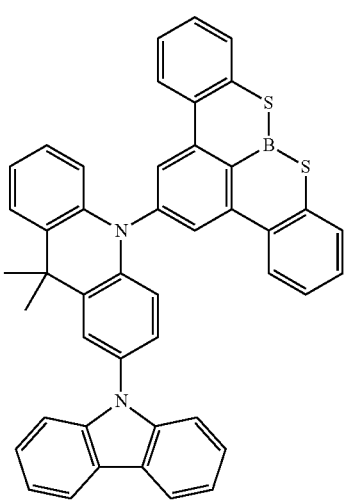

23
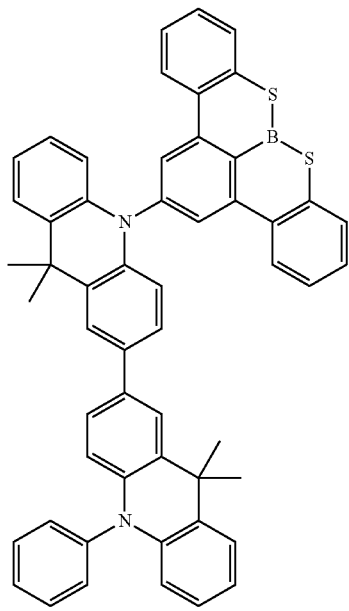
24
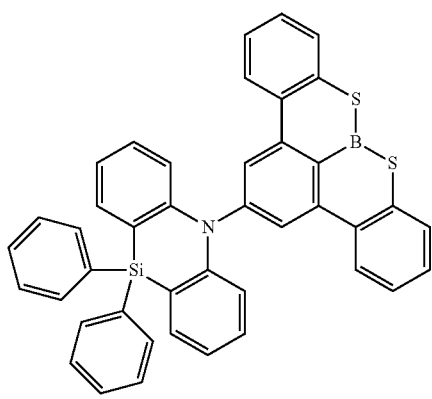
25
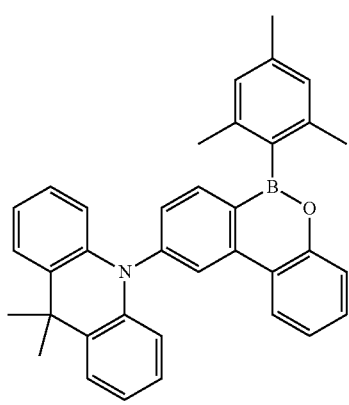
26
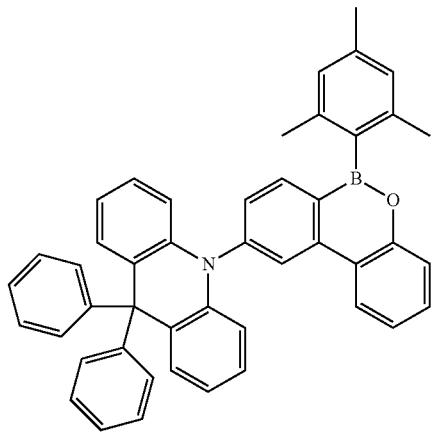
27
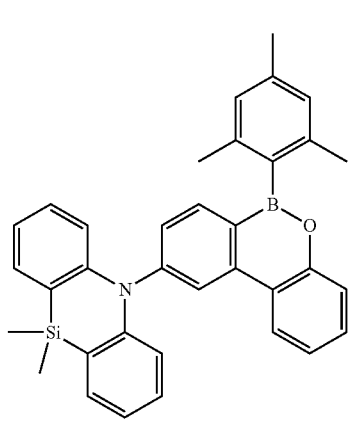
28
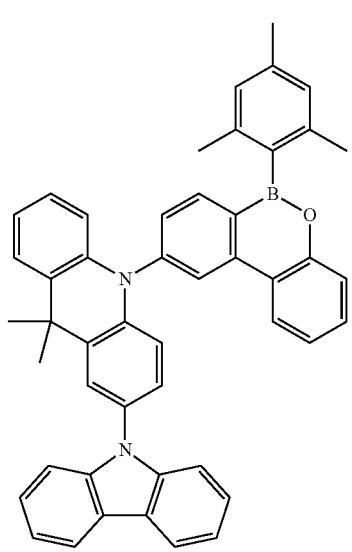

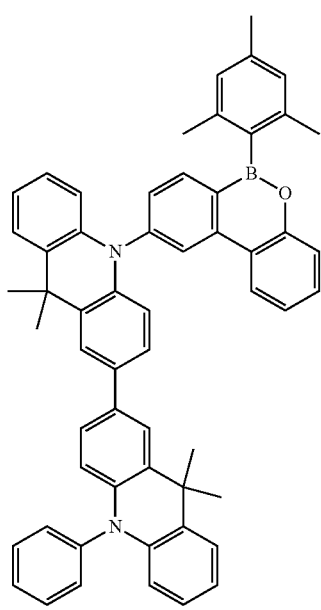
29
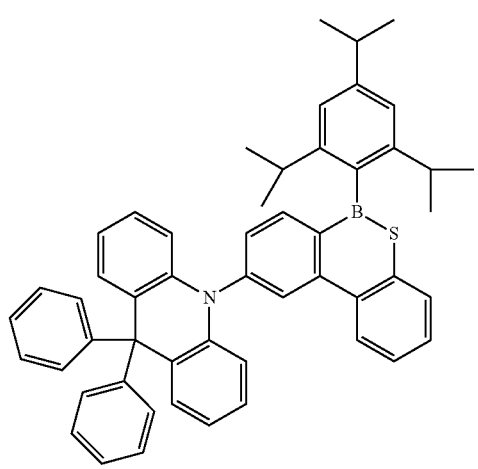
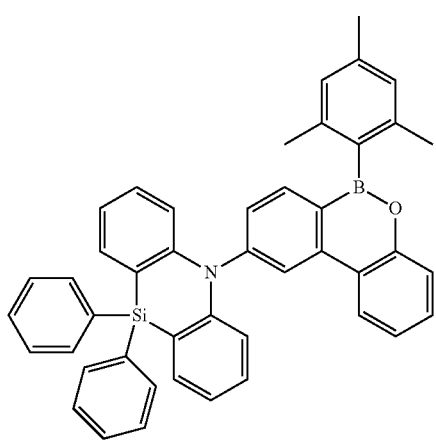
30
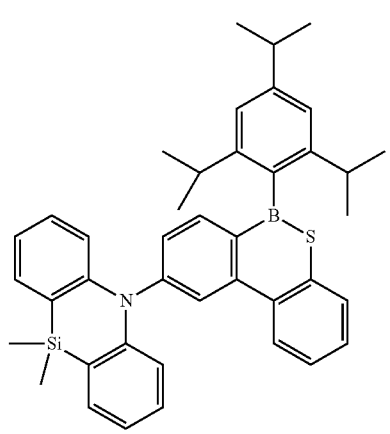
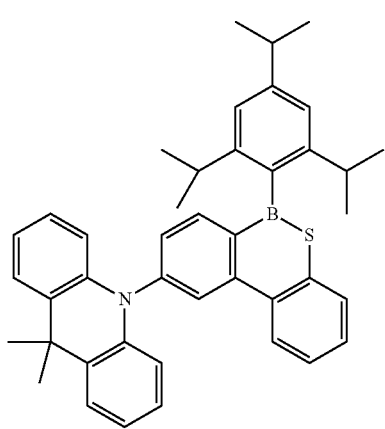
31
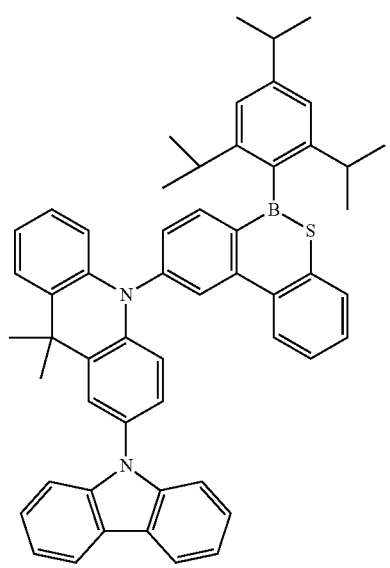

133
-continued
35
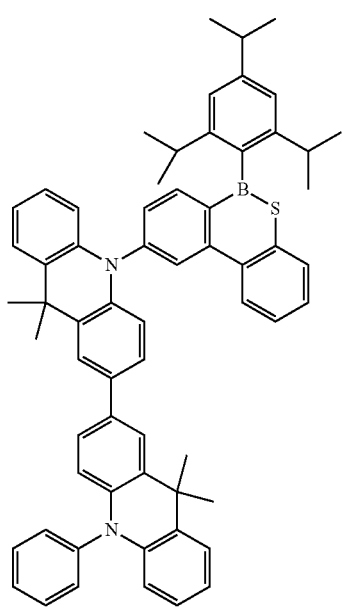
36
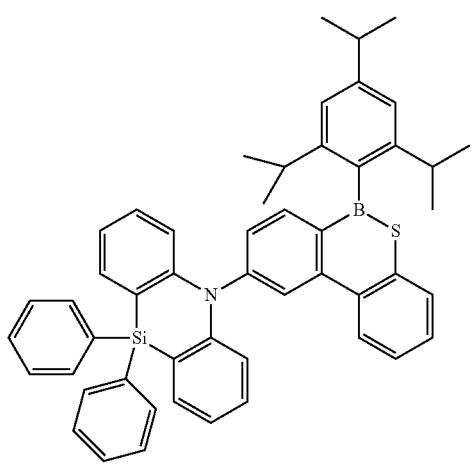
37
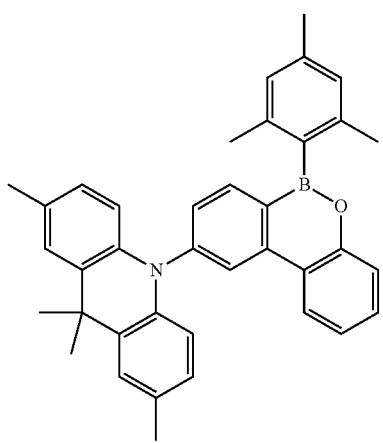
134
-continued
38
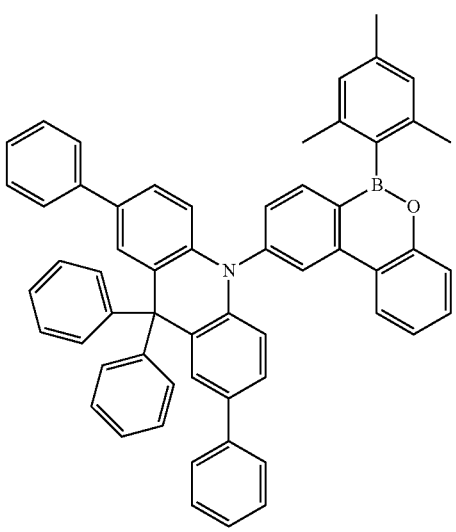
39
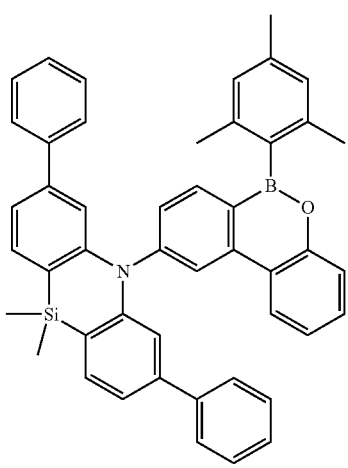
40
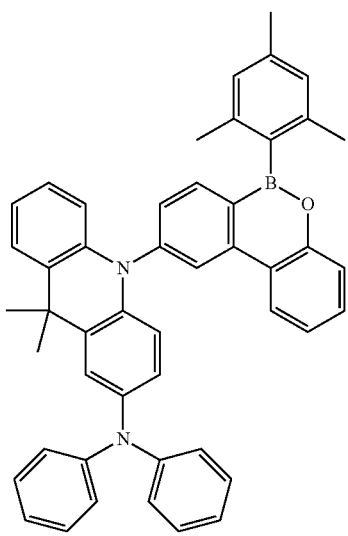

41
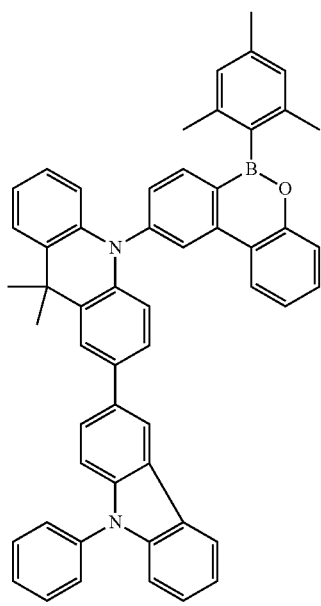
42
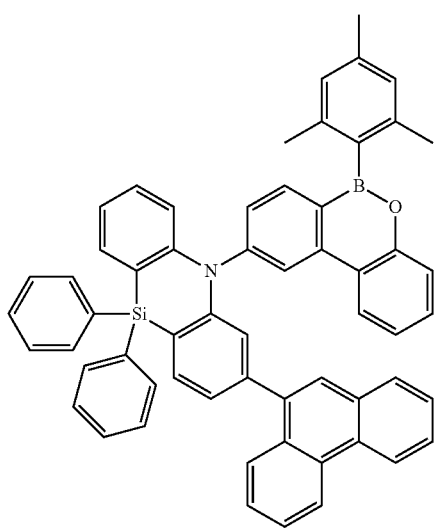
43
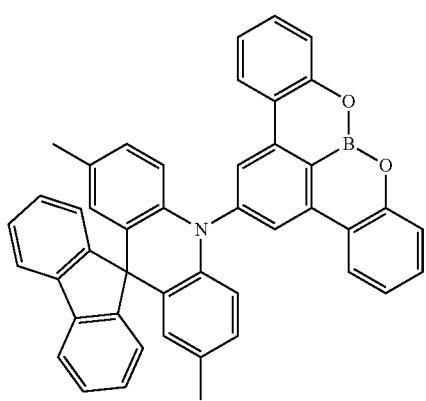
44
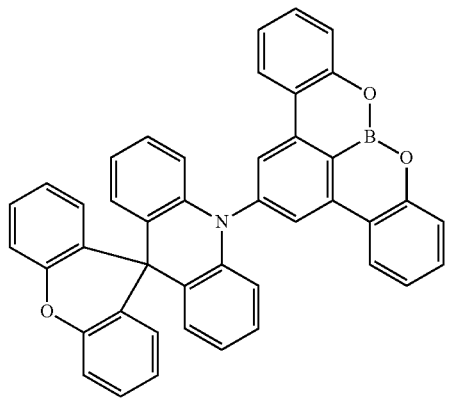
45
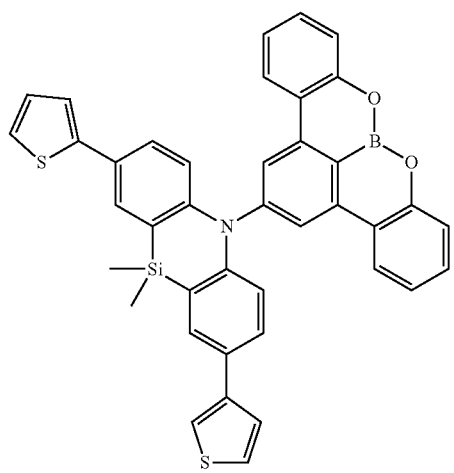
46
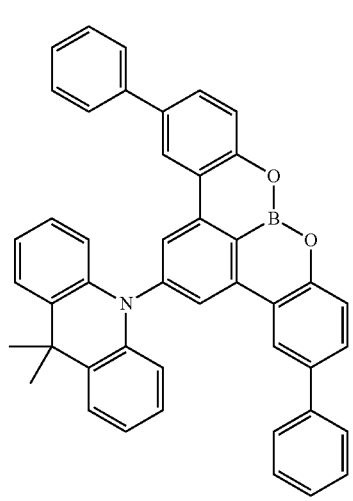

47
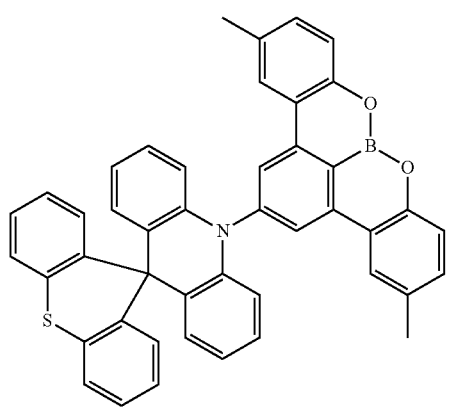
48
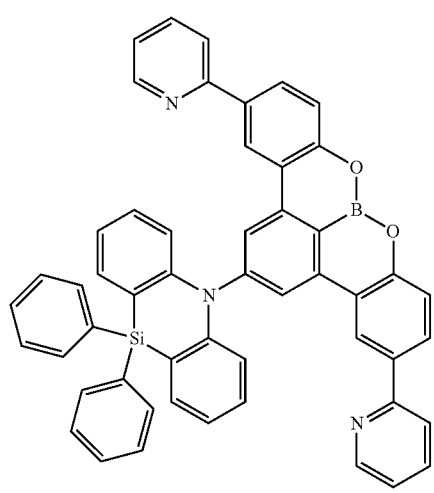
49
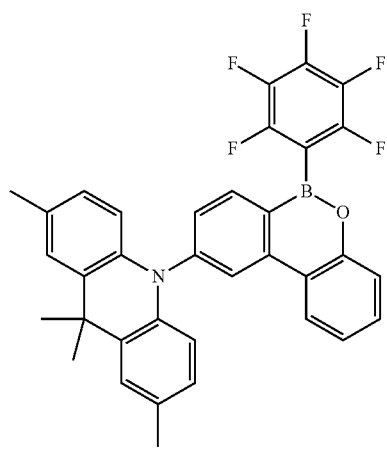
50
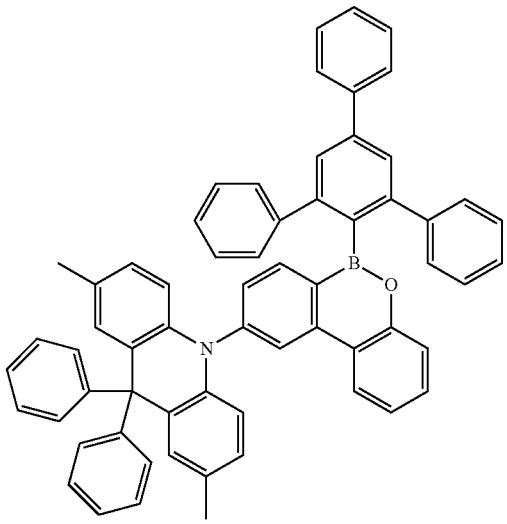
51
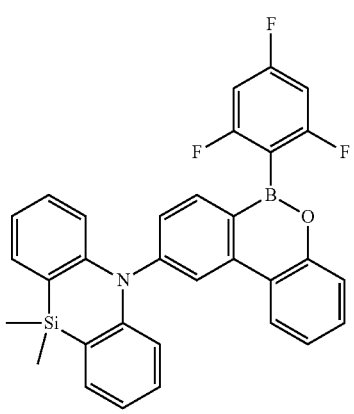
52
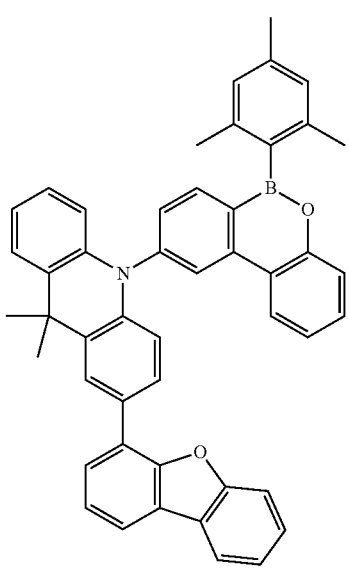

53
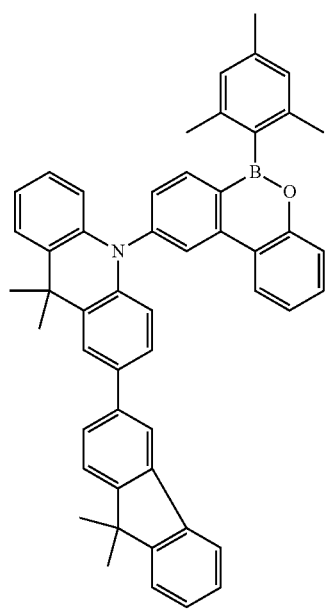
54
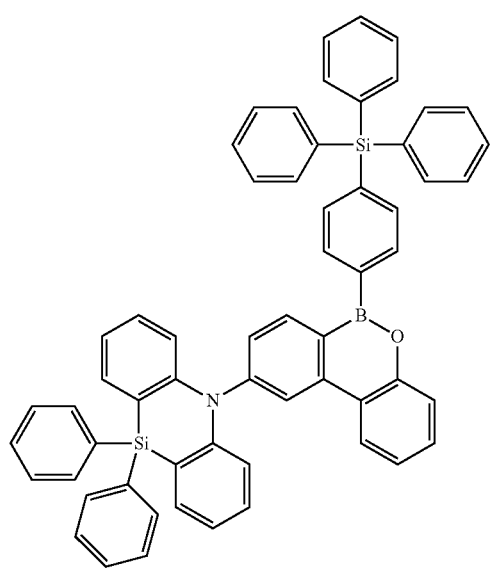
55
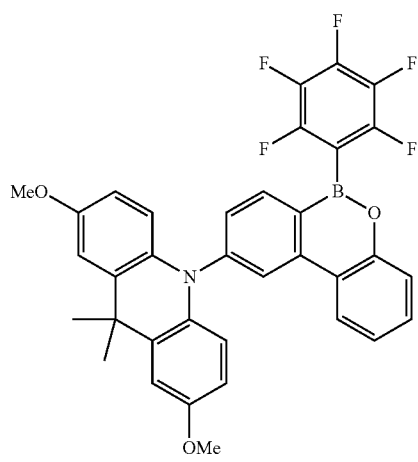
56
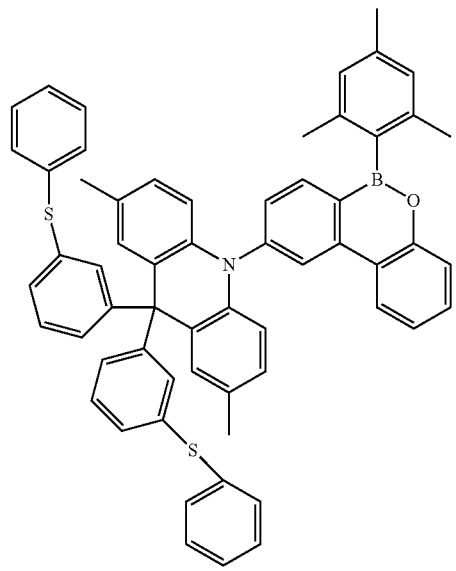
57
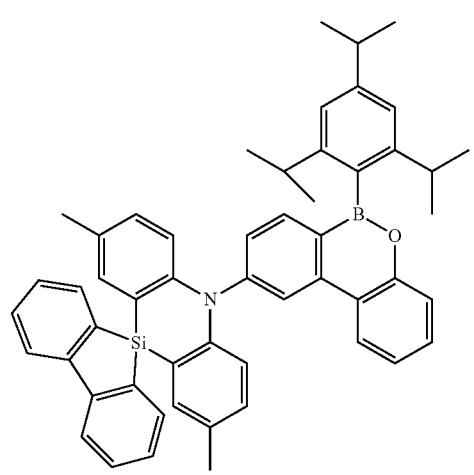
58
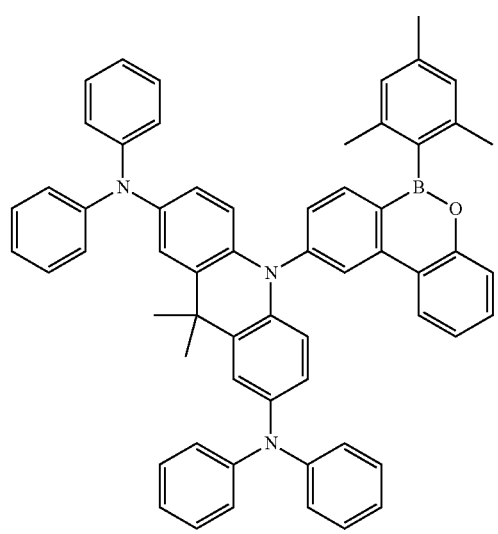

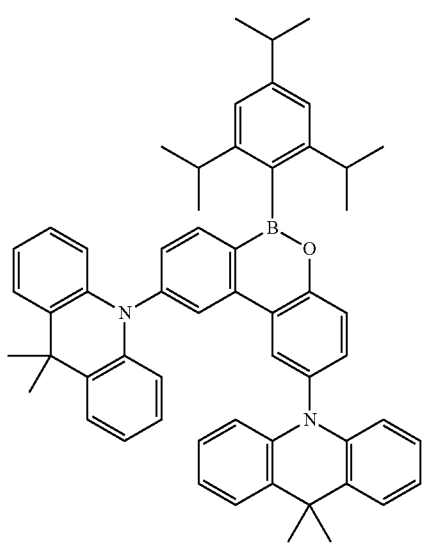
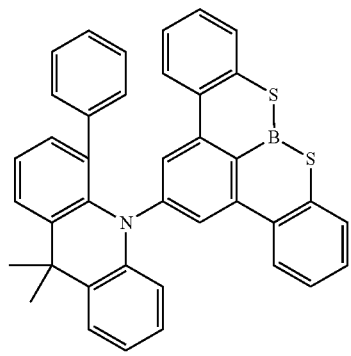
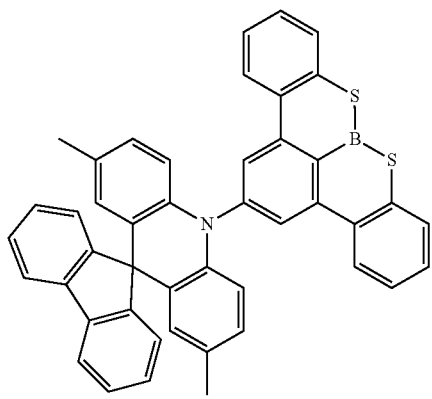
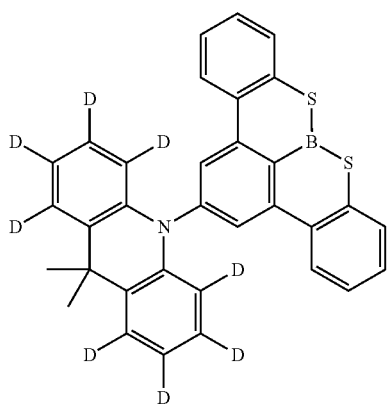
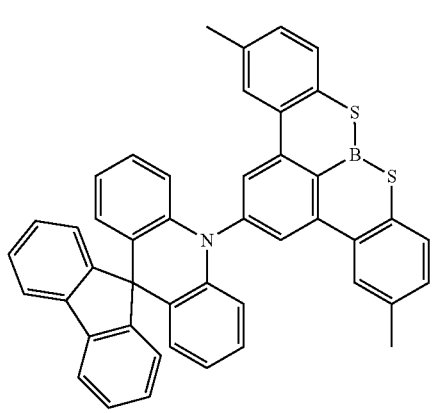
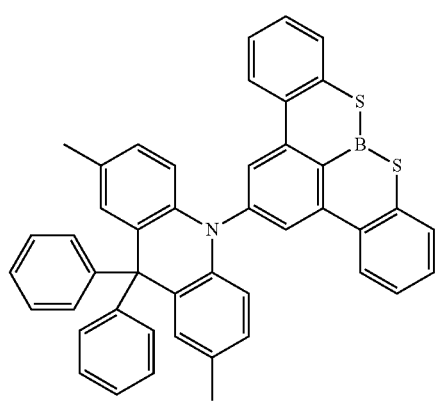

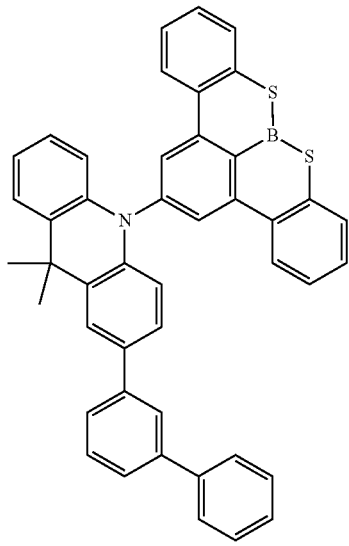
66
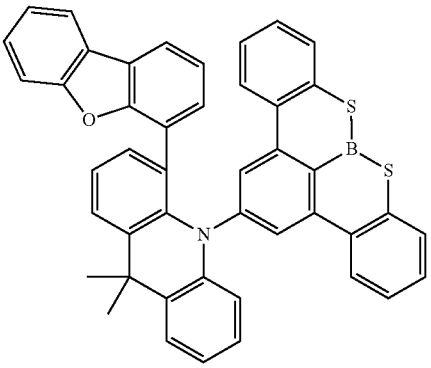
69
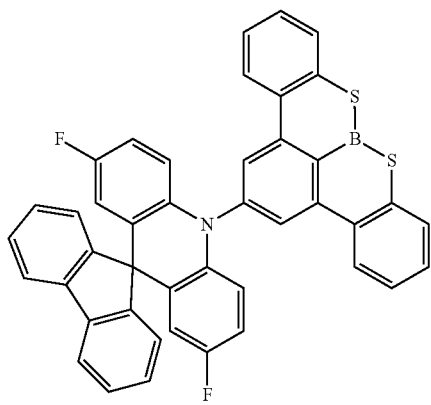
67
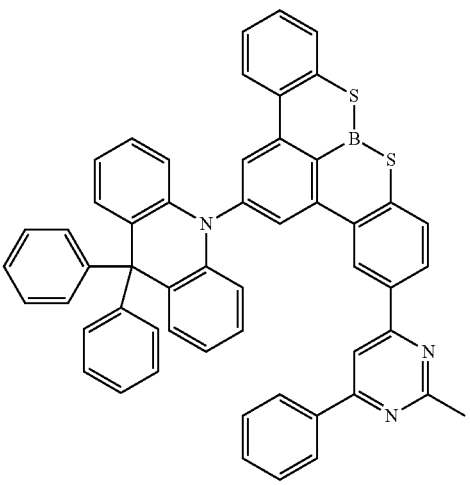
70
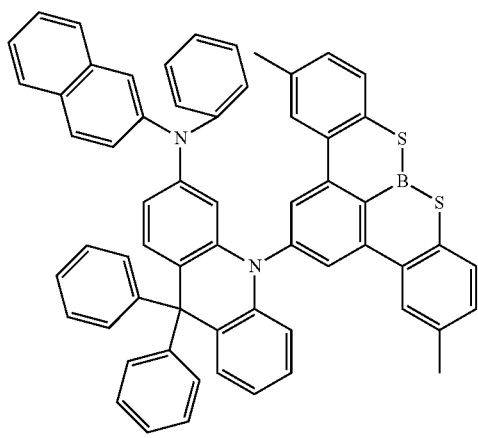
68
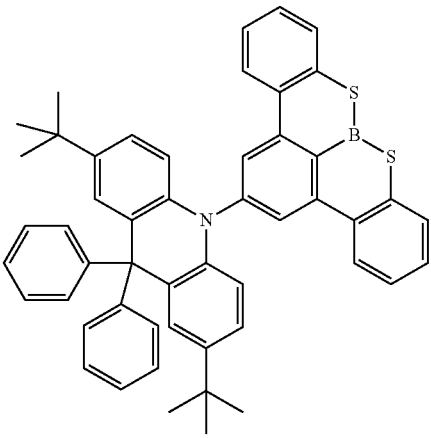
71

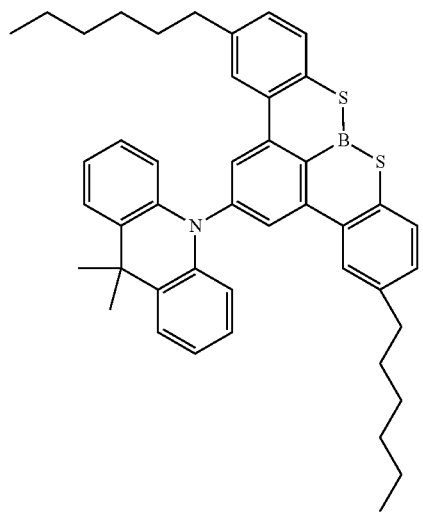
72
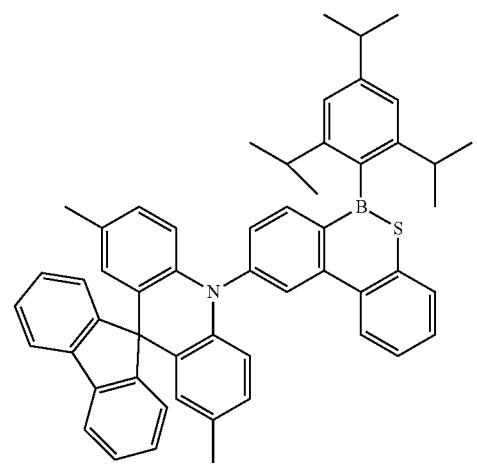
75
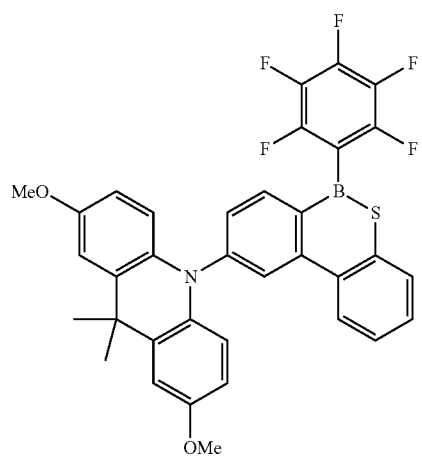
73
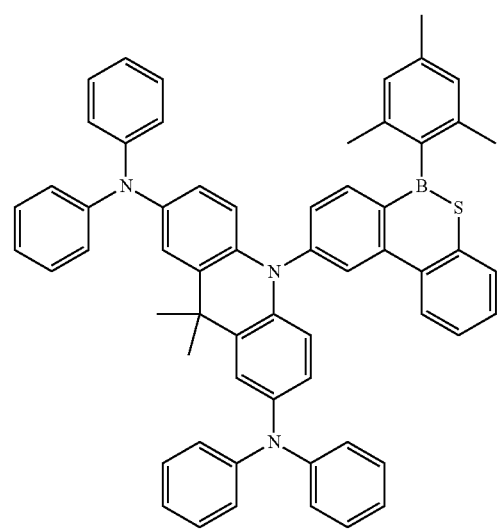
76
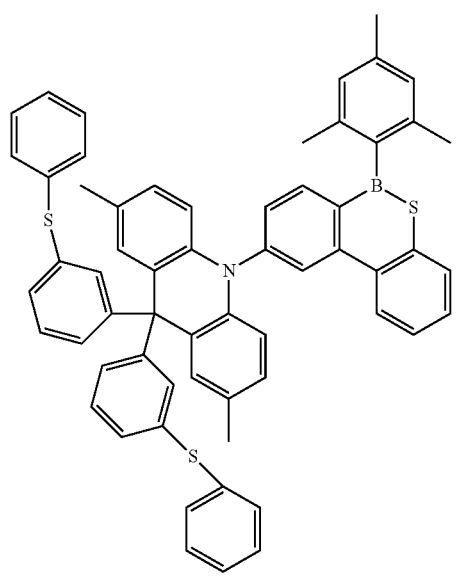
74
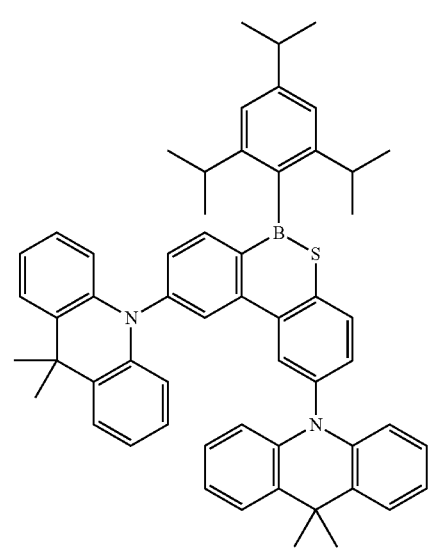
78

79
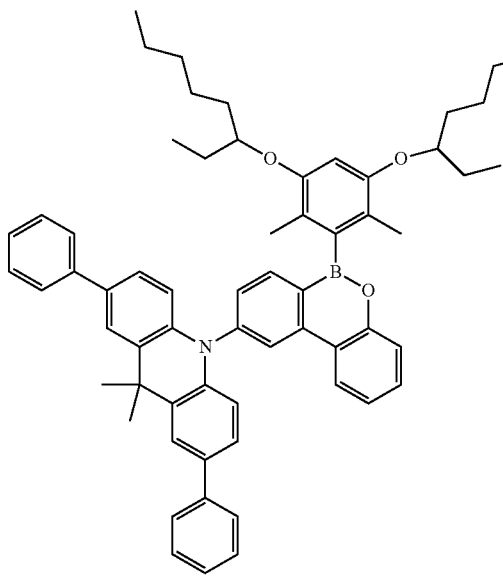
80
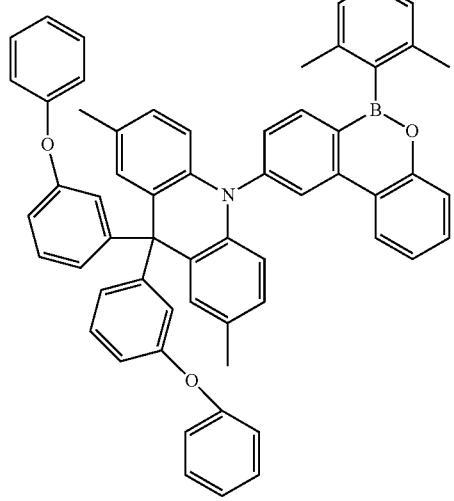
81
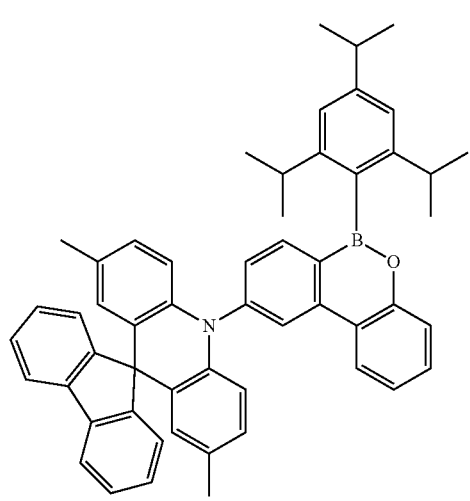
82
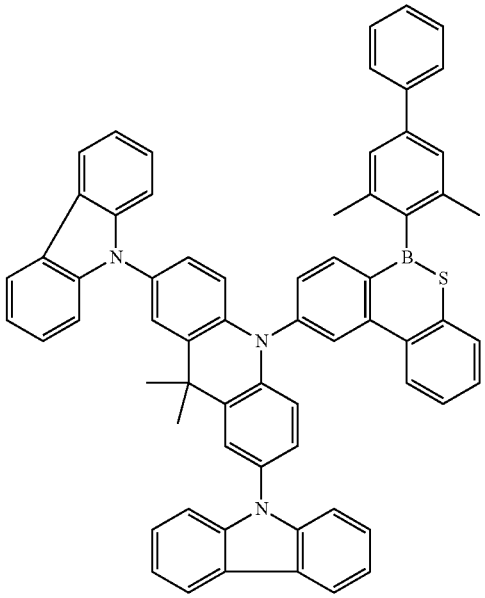
83
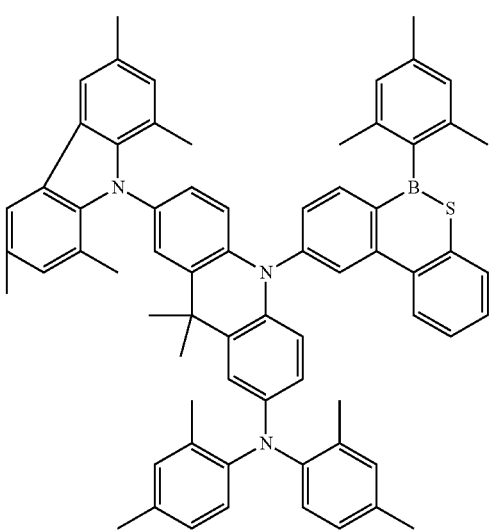

84
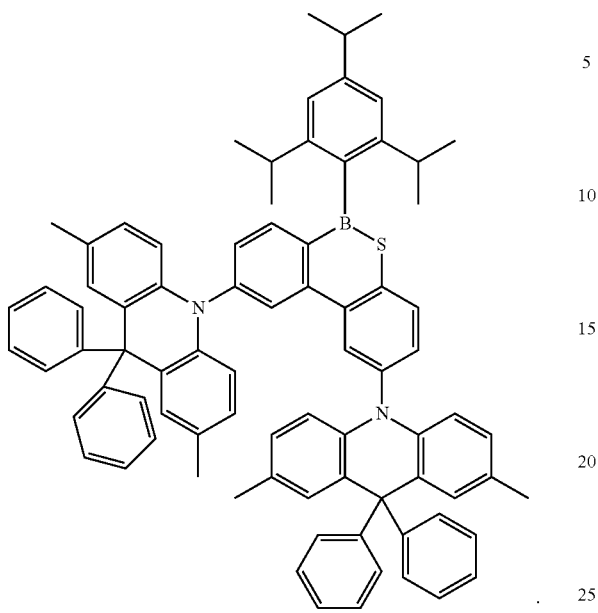
* * * * *